US012733534B2

(12) United States Patent
Chang et al.

(10) Patent No.: US 12,733,534 B2
(45) Date of Patent: Sep. 8, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Jen-Yuan Chang, Hsinchu City (TW); Fu-Chiang Kuo, Hsinchu City (TW); Yi-Chu Wu, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 365 days.

(21) Appl. No.: 18/331,189

(22) Filed: Jun. 8, 2023

(65) Prior Publication Data

US 2024/0412982 A1 Dec. 12, 2024

(51) Int. Cl.
*H10W 74/01* (2026.01)
*H10P 72/70* (2026.01)
(Continued)

(52) U.S. Cl.
CPC ........... *H10W 74/019* (2026.01); *H10P 72/74* (2026.01); *H10W 20/076* (2026.01);
(Continued)

(58) Field of Classification Search
CPC . H01L 21/568; H01L 21/565; H01L 21/6835; H01L 21/76831; H01L 23/3128;
(Continued)

(56) References Cited

U.S. PATENT DOCUMENTS 7,244,637 B2 * 7/2007 Hembree ............ H01L 21/4871 257/E23.125
8,193,624 B1 * 6/2012 Sohn ..................... H01L 21/563 257/725

(Continued)

FOREIGN PATENT DOCUMENTS

TW 202238756 10/2022
TW 202240840 10/2022
TW 202320290 5/2023

OTHER PUBLICATIONS

"Office Action of Taiwan Counterpart Application", issued on Jul. 29, 2024, p. 1-p. 6.

*Primary Examiner* — Vu A Vu
(74) *Attorney, Agent, or Firm* — JCIPRNET

(57) ABSTRACT

A semiconductor structure includes a wafer circuit structure, at least one first semiconductor die, at least one first supporting structure, and an encapsulant. The at least one first semiconductor die is disposed over and electrically connected to the wafer circuit structure in a device region of the semiconductor structure. The at least one first supporting structure is disposed over the wafer circuit structure in a peripheral region of the semiconductor structure. The encapsulant is disposed over the wafer circuit structure and encapsulates the at least one first semiconductor die and the at least one first supporting structure, where a thickness of the encapsulant at an edge of the semiconductor structure is less than a thickness of the encapsulant within the device region of the semiconductor structure.

20 Claims, 34 Drawing Sheets

(51) Int. Cl.
*H10W 20/00* (2026.01)
*H10W 70/60* (2026.01)
*H10W 70/65* (2026.01)
*H10W 70/685* (2026.01)
*H10W 74/10* (2026.01)
*H10W 70/09* (2026.01)
*H10W 72/20* (2026.01)

(52) U.S. Cl.
CPC ........ *H10W 70/611* (2026.01); *H10W 70/614* (2026.01); *H10W 70/65* (2026.01); *H10W 70/685* (2026.01); *H10W 74/016* (2026.01); *H10W 74/117* (2026.01); *H10P 72/7416* (2026.01); *H10W 70/09* (2026.01); *H10W 72/241* (2026.01); *H10W 74/142* (2026.01)

(58) Field of Classification Search
CPC ........... H01L 23/49822; H01L 23/5386; H01L 23/5389; H01L 24/19; H01L 2221/68327; H01L 2224/12105; H01L 2224/19; H01L 2924/18162; H01L 23/49816; H01L 23/5385; H01L 24/32
USPC .......................................................... 257/773
See application file for complete search history.

(56) References Cited

U.S. PATENT DOCUMENTS

| | | | | |
|---|---|---|---|---|
| 8,558,345 | B2 * | 10/2013 | Kim | H10D 1/68 257/532 |
| 8,581,381 | B2 * | 11/2013 | Zhao | H01L 24/10 257/773 |
| 8,633,598 | B1 * | 1/2014 | St. Amand | H01L 23/49816 257/782 |
| 8,779,599 | B2 * | 7/2014 | Lin | H01L 21/561 257/725 |
| 8,791,562 | B2 * | 7/2014 | Lee | H01L 23/49816 257/E21.59 |
| 8,993,380 | B2 | 3/2015 | Hou et al. | |
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,299,649 | B2 | 3/2016 | Chiu et al. | |
| 9,368,460 | B2 | 6/2016 | Yu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 9,768,133 | B1 * | 9/2017 | Wu | H01L 24/97 |
| 9,941,207 | B2 * | 4/2018 | Lin | H01L 21/78 |
| 10,043,769 | B2 * | 8/2018 | Shih | H01L 25/0655 |
| 10,153,222 | B2 * | 12/2018 | Yu | H01L 25/0657 |
| 10,665,582 | B2 * | 5/2020 | Chen | H01L 21/6835 |
| 10,685,922 | B2 * | 6/2020 | Lin | H01L 23/562 |
| 11,233,001 | B2 * | 1/2022 | Miki | H01L 24/17 |
| 11,398,455 | B2 * | 7/2022 | Han | H01L 25/50 |
| 11,494,682 | B2 | 11/2022 | Elsherbini et al. | |
| 2020/0357768 | A1 * | 11/2020 | Shih | H01L 23/49838 |
| 2020/0365525 | A1 * | 11/2020 | Wu | H01L 21/486 |
| 2022/0352109 | A1 | 11/2022 | Yu et al. | |
| 2022/0367383 | A1 | 11/2022 | Wang et al. | |
| 2023/0387075 | A1 * | 11/2023 | Tsai | H01L 24/32 |

* cited by examiner

SEMICONDUCTOR STRUCTURE AND MANUFACTURING METHOD THEREOF

BACKGROUND

Developments in shrinking sizes of semiconductor devices and electronic components make the integration of more devices and components into a given volume possible and lead to high integration density of various semiconductor devices and/or electronic components.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
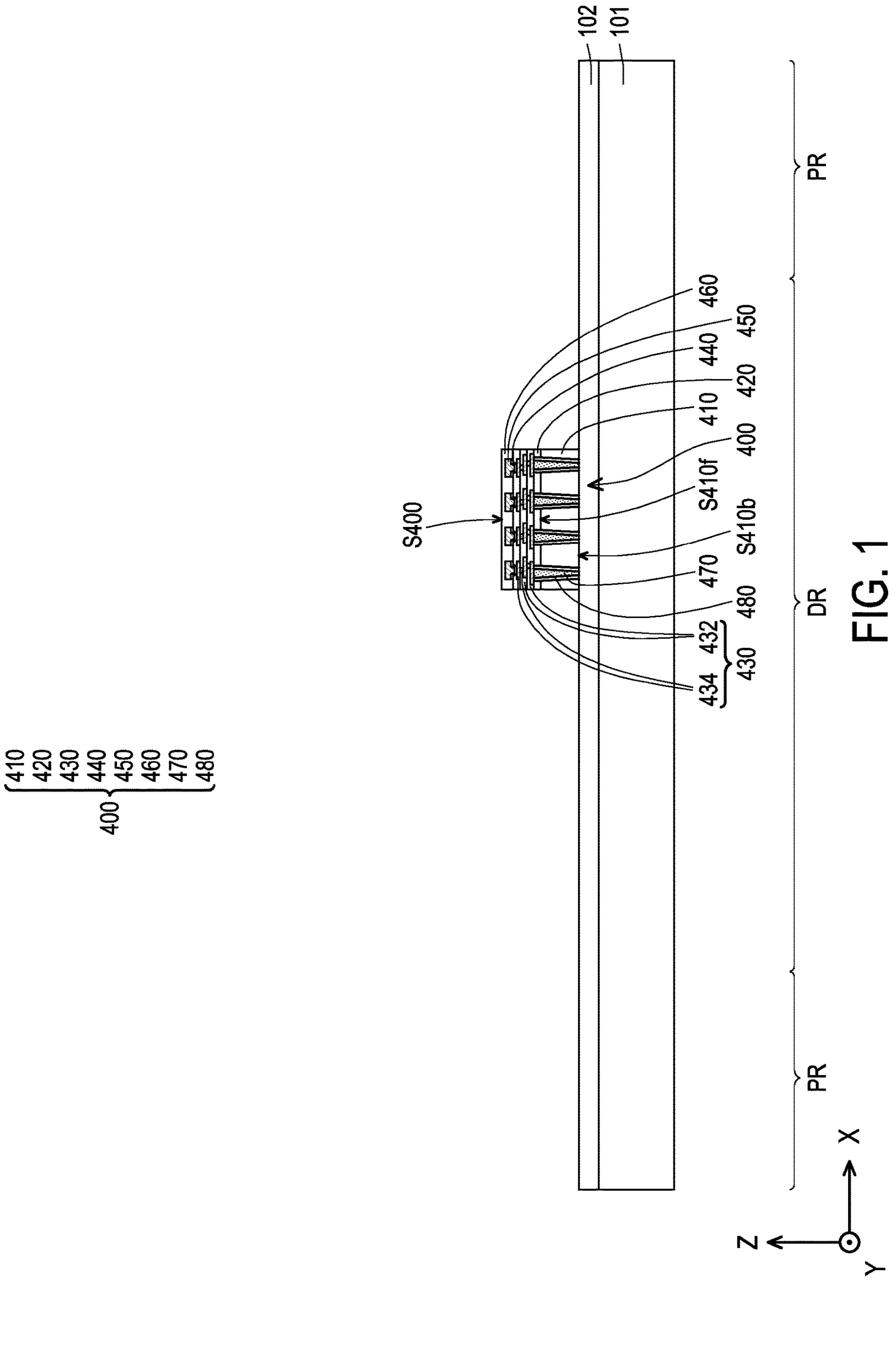
FIG. 1 to FIG. 10 are schematic cross-sectional views of various stages in a manufacturing method of a semiconductor structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the disclosure provides applicable concepts that can be embodied in a wide variety of specific contexts. The embodiments are intended to provide further explanations but are not used to limit the scope of the disclosure. The specific embodiment(s) described herein is related to a semiconductor (package) structure containing one or more semiconductor die encapsulated in an insulating encapsulation at a wafer-level, where one or more dummy dies and/or one or more deep trench capacitors (DTCs) are next to the one or more semiconductor die near the edges of the insulating encapsulation, and is not intended to limit the scope of the disclosure. Owing to the presence of the one or more dummy dies and/or the one or more deep trench capacitors (DTCs), during a planarization process to the insulating encapsulation in the manufacturing process of the semiconductor (package) structure, potential damages to the one or more semiconductor dies (with functionality) can be avoid, thereby enhancing the reliability of the semiconductor (package) structure. It is understood that additional processes may be provided before, during, and after the illustrated method, and that some other processes may only be briefly described herein. In the disclosure, it should be appreciated that the illustration of components throughout all figures is schematic and is not in scale.

Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, the drawings are illustrated with orthogonal axes (X, Y and Z) of a Cartesian coordinate system according to which the views are oriented; however, the disclosure is not specifically limited thereto.

Figure 2:
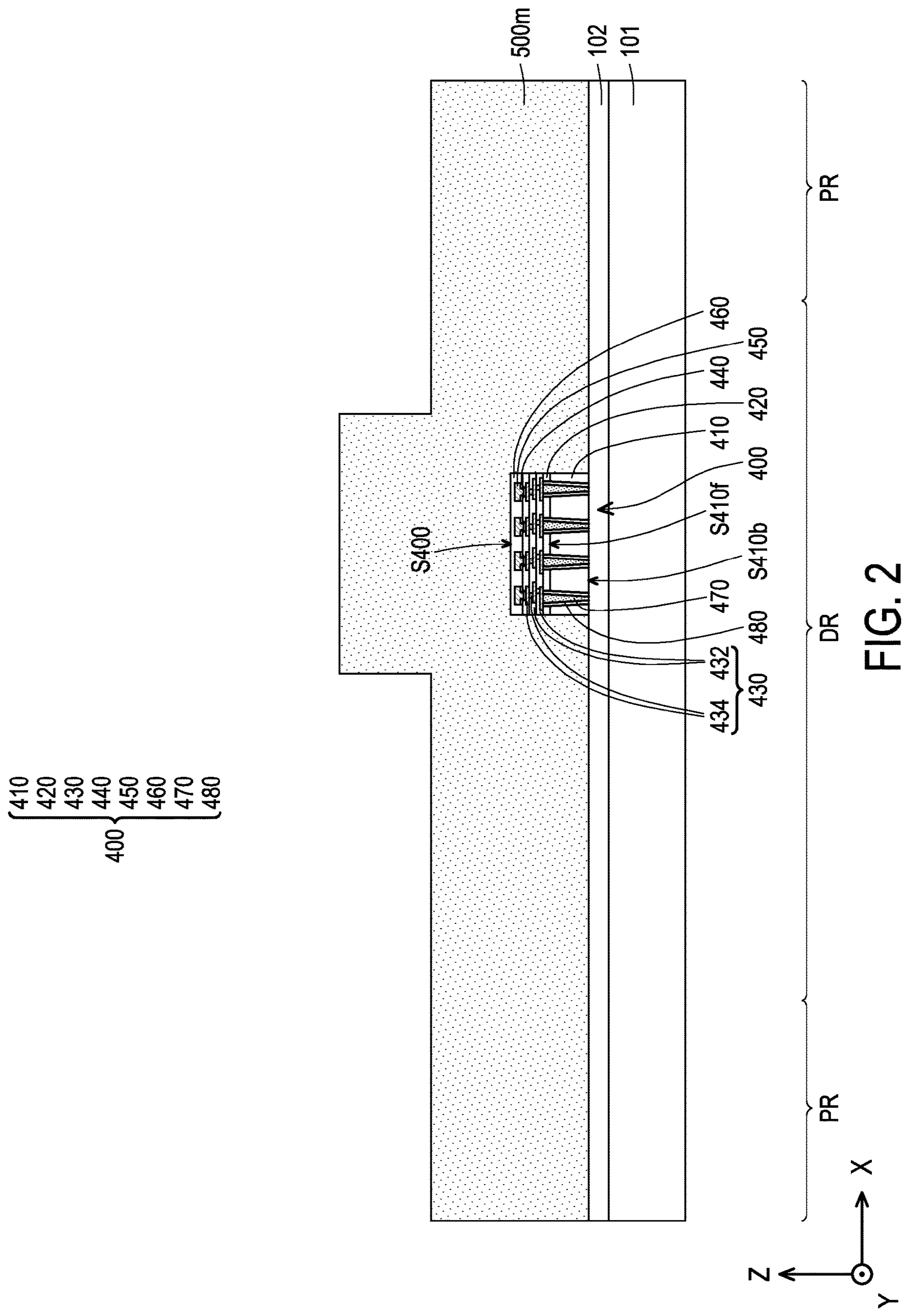
Figure 3:
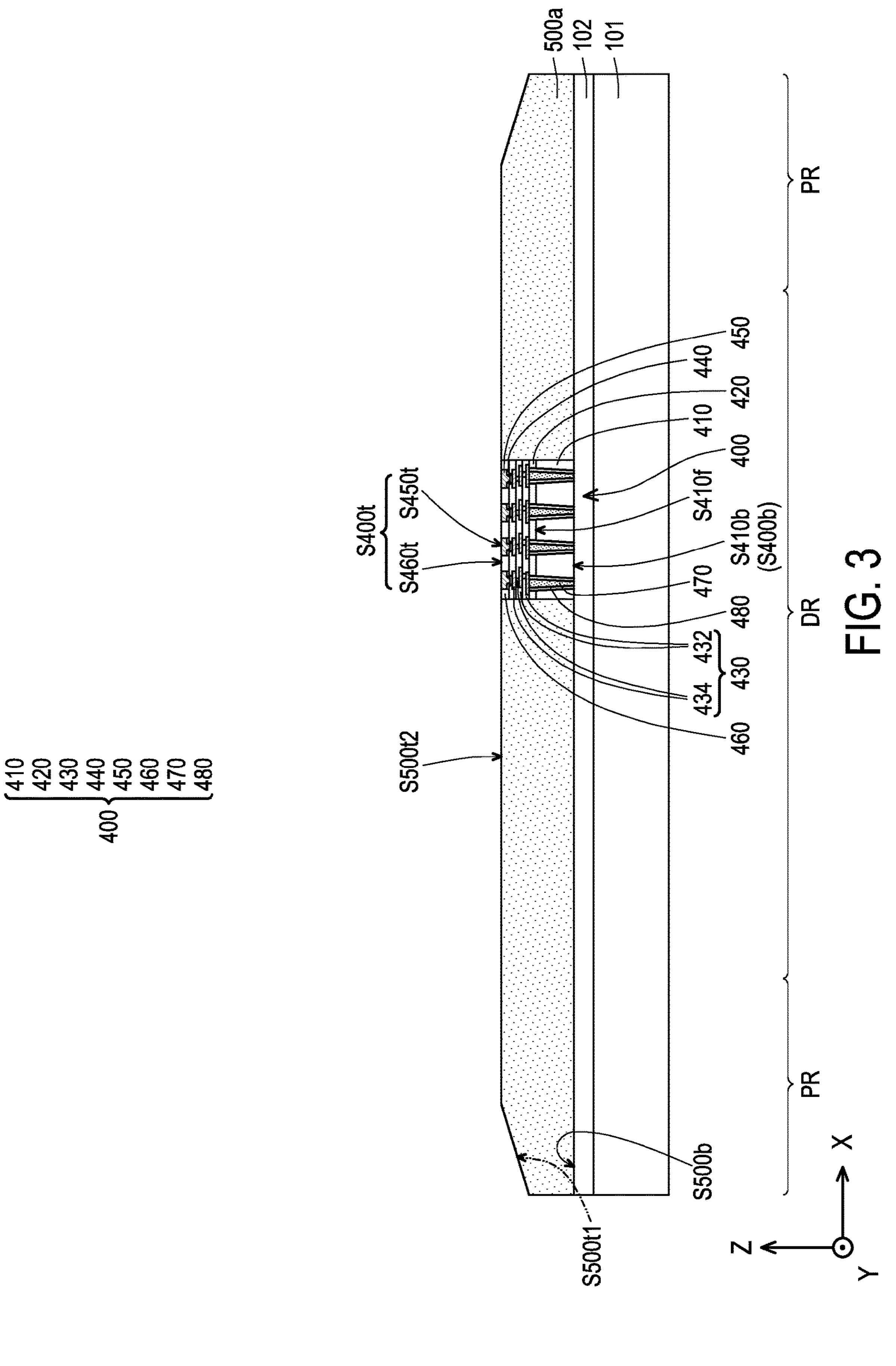
Figure 4:
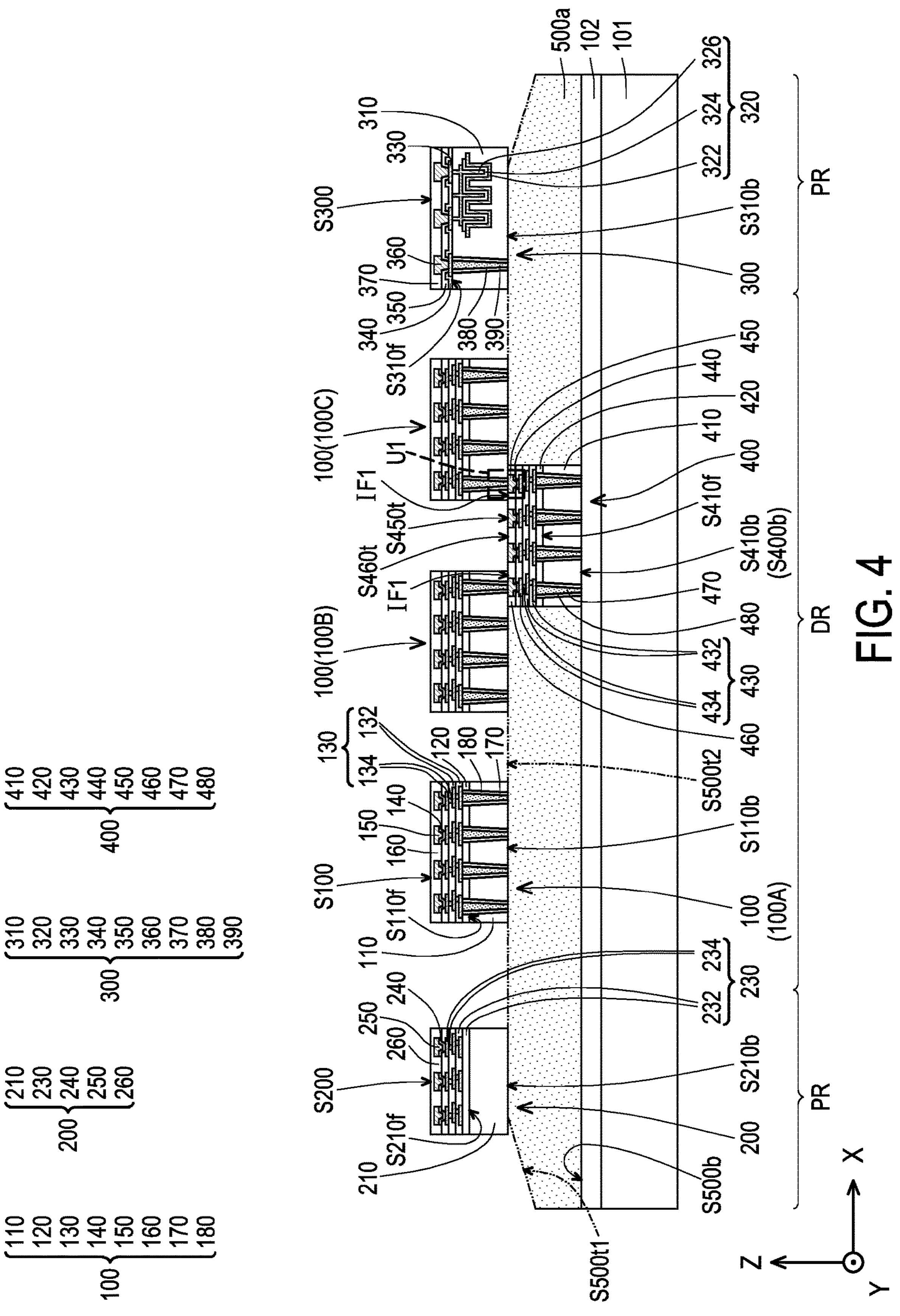
Figure 11:
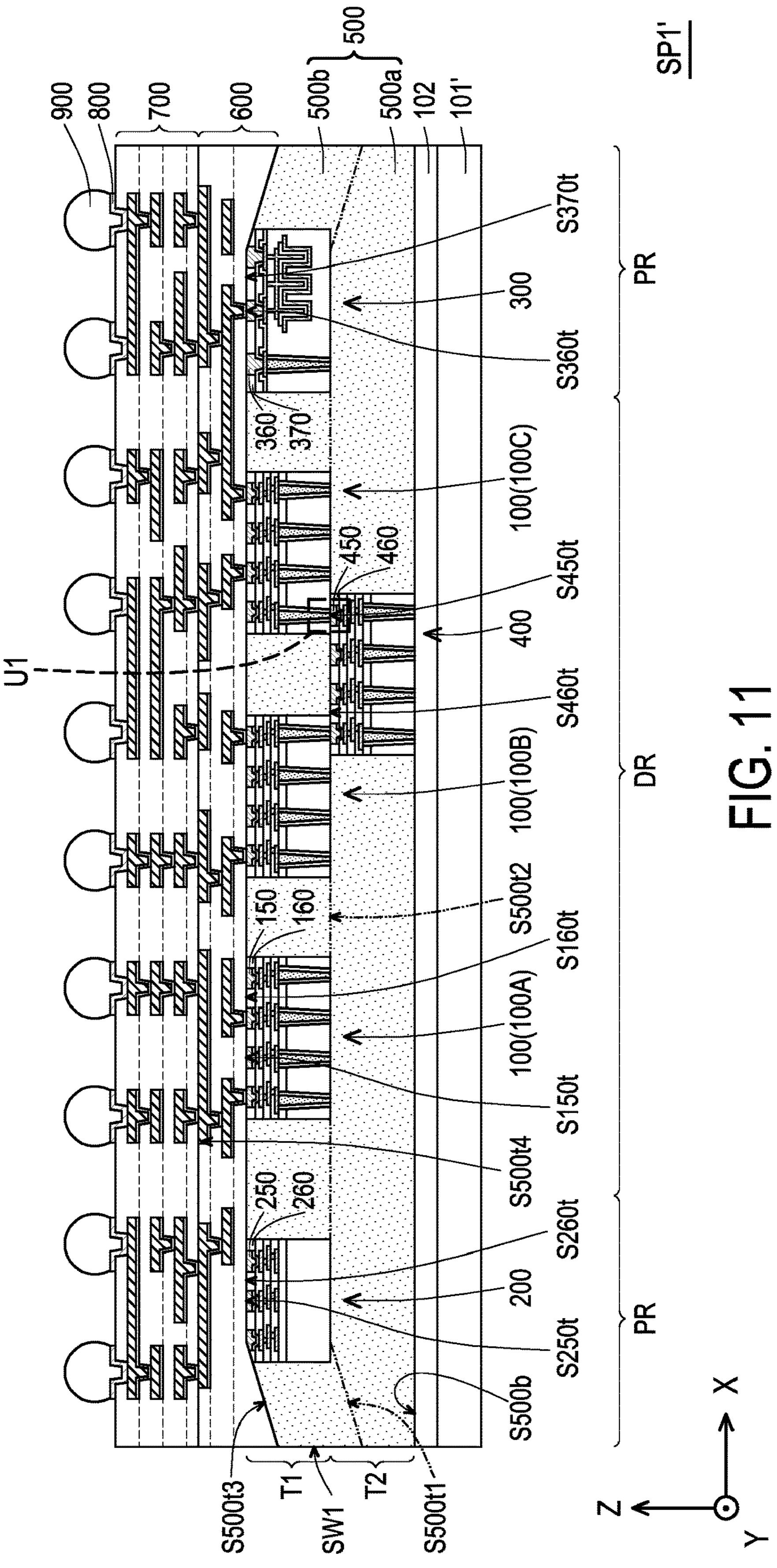
FIG. 11 is a schematic cross-sectional view showing a semiconductor structure in accordance with alternative embodiments of the disclosure.
Figure 12:
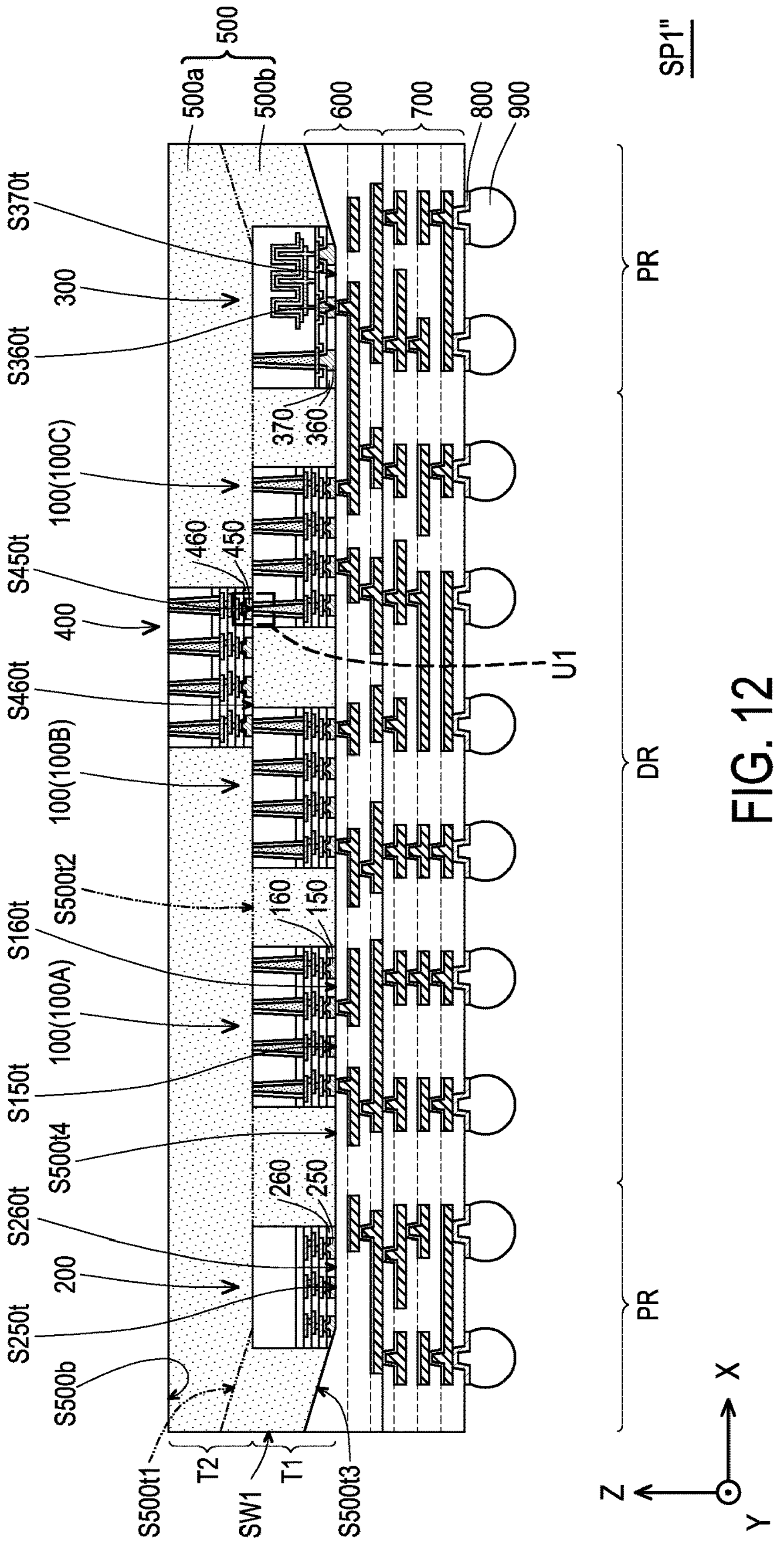
FIG. 12 is a schematic cross-sectional view showing a semiconductor structure in accordance with alternative embodiments of the disclosure.
Figure 13:
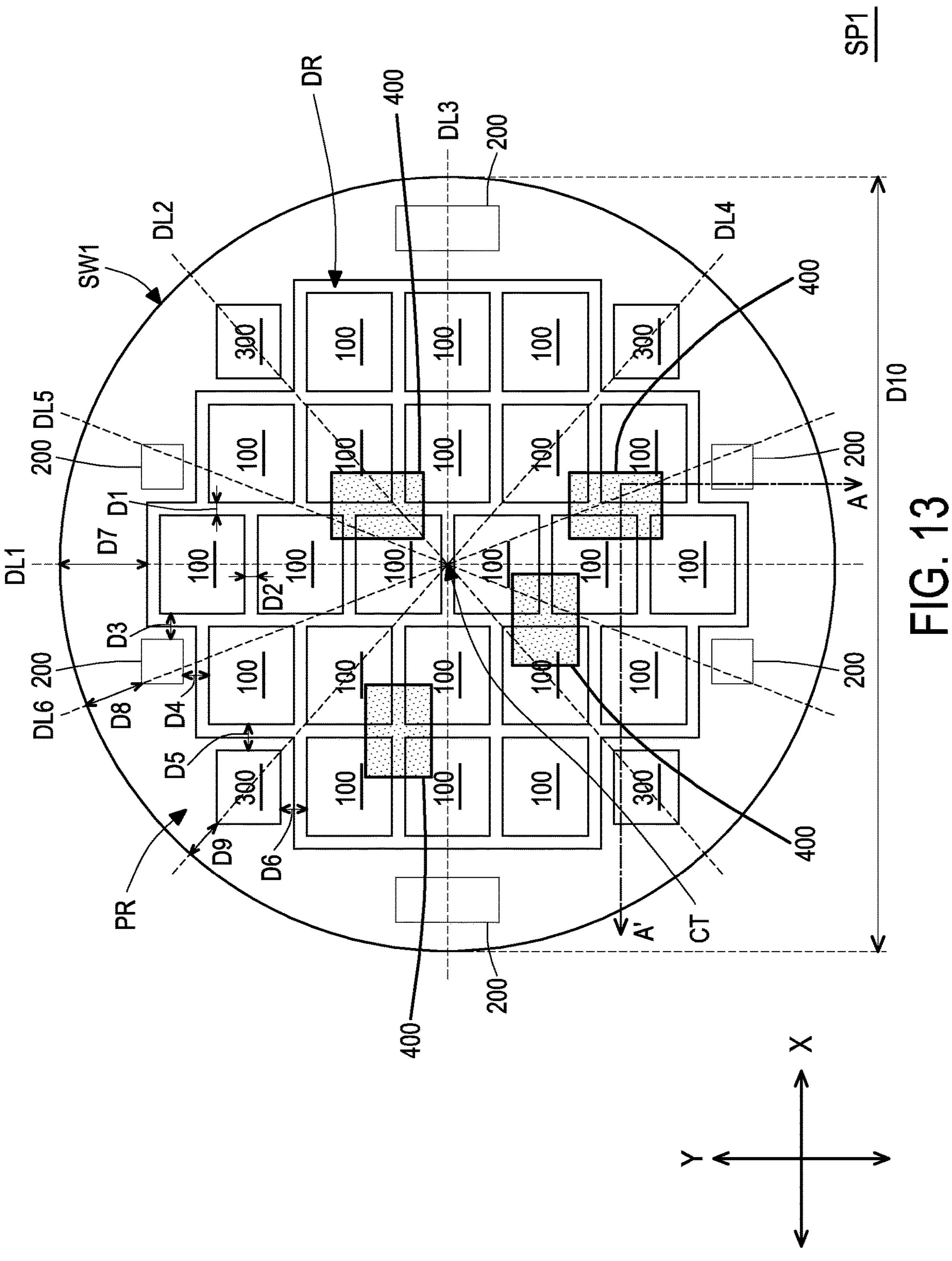
FIG. 13 is a schematic plane view showing the semiconductor structure depicted in FIG. 10.
Figure 15:
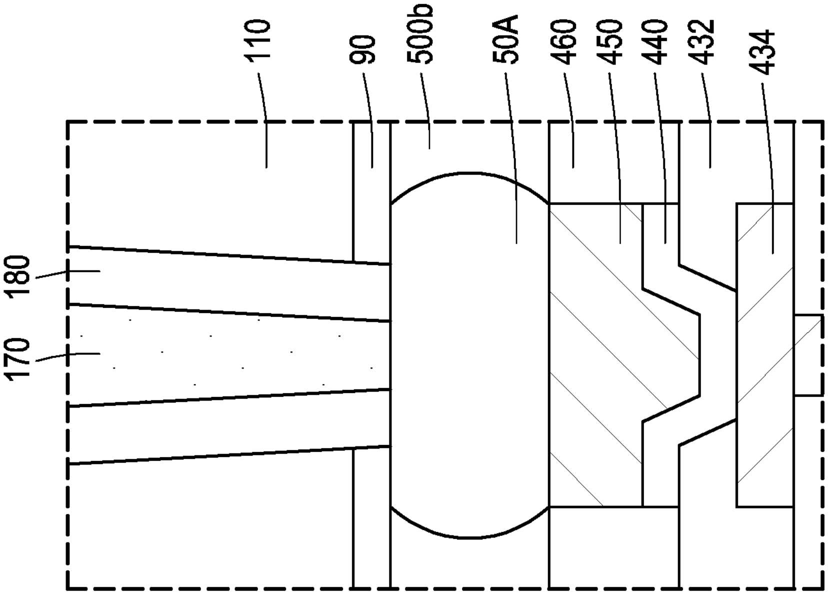
FIG. 14 and FIG. 15 are enlarged and schematic cross-sectional views showing various embodiments of a bonding interface between a semiconductor die and a bridge die overlapping thereto in accordance with some embodiments of the disclosure.
Figure 14:
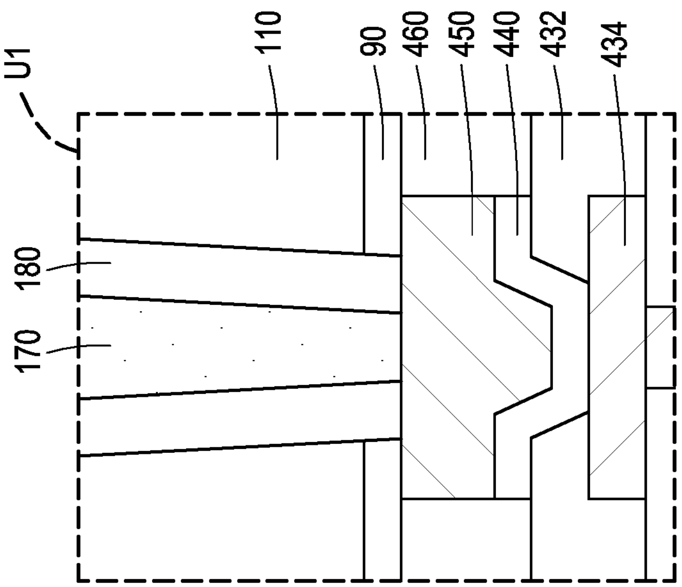

FIG. 1 to FIG. 10 are schematic cross-sectional views of various stages in a manufacturing method of a semiconductor structure SP1 in accordance with some embodiments of the disclosure. FIG. 11 is a schematic cross-sectional view showing a semiconductor structure SP1' in accordance with alternative embodiments of the disclosure. FIG. 12 is a schematic cross-sectional view showing a semiconductor structure SP1" in accordance with alternative embodiments of the disclosure. FIG. 13 is a schematic plane view showing the semiconductor structure SP1 depicted in FIG. 10, where the cross-sectional views of FIG. 1 to FIG. 10 are taken along a line A-A' depicted in FIG. 13. FIG. 14 and FIG. 15 are enlarged and schematic cross-sectional views showing various embodiments of a bonding interface between a semiconductor die and a bridge die overlapping thereto in accordance with some embodiments of the disclosure, where the enlarged and schematic cross-sectional views of FIG. 14 and FIG. 15 are outlined in a dashed box U1 as shown in FIG. 4. FIG. 16 through FIG. 20 are schematic plane views respectively showing a semiconductor structure in accordance with some alternative embodiments of the disclosure. In some embodiments, the manufacturing method is part of a wafer level packaging process. In some embodiments, the semiconductor structure SP1 is in a wafer or panel form. The semiconductor structure SP1 may be in a form of wafer-size having a diameter (e.g., D10 depicted in FIG. 13) of about 4 inches or more. The semiconductor structure SP1 may be in a form of wafer-size having a diameter (e.g., D10) of about 6 inches or more. The semiconductor structure SP1 may be in a form of wafer-size having a diameter (e.g., D10) of about 8 inches or more. Or alternatively, the semiconductor structure SP1 may be in a form of wafer-size having a diameter (e.g., D10) of about 12 inches or more. On the other hand, the semiconductor structure SP1 may be in a form of panel-size having a long axis of about 4 inches or more, about 6 inches or more, about 8 inches or more, about 12 inches or more, or any other suitable size. The disclosure is not limited thereto.

Referring to FIG. 1, in some embodiments, a carrier is provide. In some embodiments, a carrier 101 is a glass carrier, a ceramic carrier, or any suitable carrier for carrying a semiconductor wafer or a reconstituted wafer for the manufacturing method of the semiconductor structure. However, alternatively, the carrier 101 may be a reclaim wafer or a reconstituted wafer for the manufacturing method of the semiconductor structure. For a non-limiting example, as the material of the carrier 101 is a Si substrate, the carrier 101 may serve as a heat dissipating element for the semiconductor structure SP1. In such cases, the carrier 101 may further be used for warpage control. In one embodiment, the carrier 101 is a glass carrier, where the carrier 101 is then removed after the manufacture of the semiconductor structure SP1. In such cases, the carrier 101 may be a temporary supporting structure, which may be removed during the manufacturing method of the semiconductor structure SP1. In one embodiment, the carrier 101 may be a mechanical supporting structure, which may not be removed after the manufacturing method of the semiconductor structure SP1. Alternatively, the carrier 101 may be a mechanical supporting structure, which may be thinning down to a thickness having sufficient mechanical supporting strength, after the manufacturing method of the semiconductor structure SP1.

In some embodiments, the carrier 101 is coated with a debond layer 102 (as shown in FIG. 1). The material of the debond layer 102 may be any material suitable for bonding and debonding the carrier 101 from the above layer(s) or any wafer(s) disposed thereon. In some embodiments, the debond layer 102 includes a dielectric material layer made of a dielectric material including any suitable polymer-based dielectric material (such as benzocyclobutene (BCB), polybenzoxazole (PBO)). For a non-limiting example, the debond layer 102 includes a dielectric material layer made of an epoxy-based thermal-release material, which loses its adhesive property when heated, such as a light-to-heat-conversion (LTHC) release coating film. For another non-limiting example, the debond layer 102 includes a dielectric material layer made of a ultra-violet (UV) glue, which loses its adhesive property when exposed to UV lights. The debond layer 102 may be dispensed as a liquid and cured on the carrier 101, may be a laminate film laminated onto the carrier 101, or may be formed on the carrier 101 by any suitable method. For example, as shown in FIG. 1, an illustrated top surface of the debond layer 102, which is opposite to an illustrated bottom surface contacting the carrier 101, is leveled and has a high degree of planarity. In certain embodiments, the debond layer 102 is a LTHC layer with good chemical resistance, and such layer enables room temperature debonding from the carrier 101 by applying laser irradiation, however the disclosure is not limited thereto.

In an alternative embodiment, a buffer layer (not shown) is coated on the debond layer 102, where the debond layer 102 is sandwiched between the buffer layer and the carrier 101, and a top surface of the buffer layer may further provide a high degree of planarity. In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SRF), or the like. In other words, the buffer layer is an optional dielectric layer, and may be omitted based on the demand; the disclosure is not limited thereto. For example, the buffer layer may be formed by a suitable fabrication technique such as spin-coating, lamination, deposition, or the like.

In some embodiments, at least one semiconductor die is provided. In some embodiments, one or more semiconductor dies 400 are provided, and are then placed on the debond layer 102 over the carrier 101, as shown in FIG. 13 in conjunction with FIG. 1. For illustrative purposes, only four semiconductor dies 400 are shown in FIG. 13 and only one semiconductor die 400 are shown in the cross-sectional view of FIG. 1 through FIG. 10 taken along the line A-A' depicted in FIG. 13. However, the number of semiconductor dies 400 are selected and designated based on the demand and design layout, which may be one, two, three, fourth, or more. The disclosure is not limited thereto.

In some embodiments, each of the semiconductor dies 400 includes a semiconductor substrate 410, a device layer 420 having semiconductor devices (not shown) formed thereon, an interconnect structure 430 formed on the device layer 420 and over the semiconductor substrate 410, a plurality of connecting pads 440 formed on the interconnect structure 430, a plurality of connecting vias 450 formed on the connecting pads 440, a protection layer 460 covering the interconnect structure 430, the connecting pads 440 and the connecting vias 450, and a plurality of conductive pillars 470 formed (embedded) in the semiconductor substrate 410. In some embodiments, the semiconductor substrate 410 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 410 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained.

In some embodiments, the device layer 420 includes the semiconductor devices formed on (and/or partially formed in) the semiconductor substrate 410, where the semiconductor devices include active devices (e.g., transistors, diodes, memory, etc.), passive devices (e.g., capacitors, resistors, inductors, jumper, etc.), other suitable electrical components, and/or combinations thereof. The device layer 420 may be disposed at an active surface S410*f* of the semiconductor substrate 410 proximal to the interconnect structure 430, as shown in FIG. 1. In some embodiments, the semiconductor substrate 410 has the active surface S410*f* and a bottom surface S410*b* opposite to the active surface S410*t* along a stacking direction Z of the interconnect structure 430, the device layer 420, and the semiconductor substrate 410. In some embodiments, the device layer 420 is interposed between the interconnect structure 430 and the active surface S410*t* of the semiconductor substrate 410.

The device layer 420 may include circuitry (not shown) formed in a front-end-of-line (FEOL), and the interconnect structure 430 may be formed in a back-end-of-line (BEOL). In some embodiments, the interconnect structure 430 includes an inter-layer dielectric (ILD) layer formed over the device layer 420, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), $SiO_xC_y$ (where x>0, y>0), Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 430 includes one or more dielectric layers 432 and one or more metallization layers 434 in alternation. The metallization layers 434 may be embedded in the dielectric layers 432. In some embodiments, the interconnect structure 430 is electrically coupled to the semiconductor devices of the device layer 420 to one another and to external components (e.g., test pads, bonding conductors, etc.) formed thereon. For example, the metallization layers 434 in the dielectric layers 432 route electrical signals between the semiconductor devices of the device layer 420. The semiconductor devices of the device layer 420 and the metallization layers 434 are interconnected to perform one or more functions including memory structures (e.g., a memory cell), processing structures (e.g., a logic cell), input/output (I/O) circuitry (e.g., an I/O cell), or the like. The uppermost layer of the interconnect structure 430 may be a passivation layer made of one or more suitable dielectric materials such as silicon oxide, silicon nitride, low-k dielectrics, PI, combinations of these, or the like. In some embodiments, as shown in FIG. 1, the passivation layer (e.g., the uppermost layer of the dielectric layers 432) of the interconnect structure 430 has an opening exposing at least a portion of a topmost layer of the metallization layers 434 for further electrical connection.

The dielectric layers 432 may be PI, PBO, BCB, a nitride such as silicon nitride, an oxide such as silicon oxide, PSG, borosilicate glass (BSG), BPSG, a combination thereof or the like, which may be patterned using a photolithography and/or etching process. The etching process may include a dry etching, a wet etching, or a combination thereof. In some embodiments, the dielectric layers 432 are formed by suitable fabrication techniques such as spin-on coating, chemical vapor deposition (CVD) such as plasma-enhanced chemical vapor deposition (PECVD), or the like.

The metallization layers 434 may be made of conductive materials formed by electroplating or deposition, such as copper, copper alloy, aluminum, aluminum alloy, or combinations thereof, which may be patterned using a photolithography and etching process. The etching process may include a dry etching, a wet etching, or a combination thereof. In some embodiments, the metallization layers 434 are patterned copper layers or other suitable patterned metal layers. For example, the metallization layers 434 may be metal lines, metal vias, metal pads, metal traces, etc. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The number of the dielectric layers 432 and the number of the metallization layers 434 are not limited in the disclosure, and may be selected and designated based on demand and design layout.

In some embodiments, as illustrated in FIG. 1, the connecting pads 440 are disposed over and electrically coupled to the topmost layer of the metallization layer 434 of the interconnect structure 430 exposed by the passivation layer (e.g., the uppermost layer of the dielectric layers 432) of the interconnect structure 430 for testing and/or further electrical connection. The connecting pads 440 may be made of aluminum, copper, or alloys thereof or the like, and may be formed by an electroplating process. The disclosure is not limited thereto. Some of the connecting pads 440 may be testing pads, and some of the connecting pads 440 may be conductive pads for further electrical connection. In alternative embodiments, the connecting pads 440 may be optional for simple structure and cost benefits. In such alternative embodiments, the connecting vias 450 may directly connect to the uppermost metallization layer 434.

In some embodiments, the connecting vias 450 are respectively disposed on and electrically connected to the connecting pads 440 for providing an external electrical connection to the circuitry and semiconductor devices of the device layer 420. In one embodiment, the connecting vias 450 may be formed of conductive materials such as copper, gold, aluminum, the like, or combinations thereof, and may be formed by an electroplating process or the like. The connecting vias 450 may be bond vias, bond pads, bond bumps, or combinations thereof. The disclosure is not limited thereto. The connecting vias 450 may serve as bonding conductors for further electrical connection and may be formed over the connecting pads 440 (serving as the conductive pads for further electrical connection). The connecting vias 450 may be electrically coupled to the semiconductor devices of the device layer 420 through the interconnect structure 430 and the connecting pads 440.

Alternatively, both of the connecting pads 440 and the connecting vias 450 may be formed on the interconnect structure 430. For example, the connecting vias 450 are disposed on and electrically connected to the topmost layer of the metallization layer 434 of the interconnect structure 430 exposed by the passivation layer (e.g., the uppermost layer of the dielectric layers 432) of the interconnect structure 430. That is, the connecting vias 450 and the connecting pads 440 may all be disposed on the topmost layer of the metallization layer 434 of the interconnect structure 430 exposed by the passivation layer of the interconnect structure 430 in a manner of side-by-side. In such embodiments, the connecting pads 440 may be testing pads for testing while the connecting vias 450 may be the bonding conductors for further electrical connection. The connecting vias 450 may be electrically coupled to the semiconductor devices of the device layer 420 through the interconnect structure 430. The number of the connecting pads 440 and the number of the connecting vias 450 may be selected and designated based on the demand and design layout, and thus are not limited thereto.

In some embodiments, the protection layer 460 is formed on the interconnect structure 430 to cover the interconnect structure 430, the connecting pads 440, and the connecting vias 450. That is to say, the protection layer 460 prevents any possible damage(s) occurring on the connecting pads 440 and the connecting vias 450 during the transfer of the semiconductor dies 400. In addition, in some embodiments, the protection layer 460 further acts as a passivation layer for providing better planarization and evenness. In some embodiments, top surfaces of the connecting vias 450 are not accessibly revealed by a top surface S400 of the protection layer 460, as shown in FIG. 1.

The protection layer 460 may include one or more layers of dielectric materials, such as silicon nitride, silicon oxide, high-density plasma (HDP) oxide, tetra-ethyl-ortho-silicate (TEOS), undoped silicate glass (USG), silicon oxynitride, PBO, PI, silicon carbon, silicon carbon oxynitride, diamond like carbon (DLC), the like, or a combination thereof. It should be appreciated that the protection layer 460 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials.

In some embodiments, the conductive pillars 470 are embedded in the semiconductor substrate 410. For example, the conductive pillars 470 are formed in the semiconductor substrate 410 and extended from the active surface **S410*f* towards the bottom surface S410*b* along the stacking direction Z. As shown in FIG. 1, the conductive pillars 470 penetrate through the device layer 420 to electric connect the metallization layers 434 of the interconnect structure 430, and are electrically connected to the semiconductor devices (s) of the device layer 420 through the interconnect structure 430, for example. In other words, the conductive pillars 470 are in physical contact with the bottommost layer of the metallization layers 434 of the interconnect structure 430 exposed by the lowest layer of the dielectric layers 432 of the interconnect structure 430, as illustrated in FIG. 1, for example. That is, the conductive pillars 470 are electrically connected to the semiconductor devices(s) included in the device layer 420 through the interconnect structure 430, and are electrically connected to the connecting vias 450 through the interconnect structure 430 and the connecting pads 440. The conductive pillars 470 may be formed of a conductive material, such as copper, tungsten, aluminum, silver, combinations thereof, or the like, which may be formed by plating or deposition (e.g., CVD). Alternatively, the conductive pillars 470 may not penetrate through the device layer 420, where top surfaces of the conductive pillars 470 may be substantially coplanar to the active surface S410*f* of the semiconductor substrate 410 to be directly connected to the semiconductor devices(s) of the device layer 420. In such cases, the conductive pillars 470 may be electrically connected to the interconnect structure 430 through the semiconductor devices(s) of the device layer 420**.

As shown in FIG. 1, the conductive pillars 470 are accessibly revealed by the bottom surface **S410*b* of the semiconductor substrate 410. However, the disclosure is not limited thereto, alternatively, the conductive pillars 470 may not be accessibly revealed by the bottom surface S410*b* of the semiconductor substrate 410. In some embodiments, the conductive pillars 470 may be tapered from the interconnect structure 430 to the bottom surface S410*b* of the semiconductor substrate 410. Alternatively, the conductive pillars 470** have substantially vertical sidewalls.

In a cross-sectional view along the stacking direction Z, the shape of the conductive pillars 470 may depend on the design requirements, and is not intended to be limiting in the disclosure. For example, in a top (plane) view on an X-Y plane perpendicular to the stacking direction Z, the shape of the conductive pillars 470 is circular shape. However, depending on the design requirements, and the shape of the conductive pillars 470 may be an oval shape, a rectangular shape, a polygonal shape, or combinations thereof; the disclosure is not limited thereto. The number of the conductive pillars 470 is not limited to the drawings of the disclosure, which may be selected and designated based on the demand and design layout.

In some embodiments, each of the conductive pillars 470 is covered by a liner 480. For example, the liners 480 are formed between the conductive pillars 470 and the semiconductor substrate 410 and between the conductive pillars 470 and the device layer 420. In some embodiments, a sidewall of each of the conductive pillars 470 may be covered by the respective one liner 480. The liners 480 may be formed of a barrier material, such as TiN, Ta, TaN, Ti, or the like. In alternative embodiments, a dielectric liner (not shown) (e.g., silicon nitride, an oxide, a polymer, a combination thereof, etc.) may be further optionally formed between the liners 480 and the semiconductor substrate 410 and between the liners 480 and the device layer 420. In some embodiments, the conductive pillars 470, the liners 480 and the optional dielectric liner are formed by, but not limited to, forming recesses in the semiconductor substrate 410 and the device layer 420, respectively depositing the dielectric material, the barrier material, and the conductive material in the recesses, and removing excess materials on the device layer 420. For example, the recesses of the semiconductor substrate 410 and the device layer 420 are lined with the dielectric liner so as to laterally separate the liners 480 lining sidewalls of the conductive pillars 470 from the semiconductor substrate 410 and the device layer 420. Alternatively, the liners 480 may be omitted. Or, alternatively, the conductive pillars 470 and the liners 480 may both be omitted.

The conductive pillars 470 are formed by using a via-first approach, in certain embodiments. The conductive pillars 470 may be formed prior to the formation of the interconnect structure 430. Alternatively, the conductive pillars 470 may be formed by using a via-last approach, and may be formed after the formation of interconnect structure 430.

In the alternative embodiments of which the conductive pillars 470 are not accessibly revealed by the bottom surface S410*b* of the semiconductor substrate 410, a sidewall and a bottom surface (away from the device layer 420) of each of the conductive pillars 470 may be covered by the respective one liner 480. In such cases, the dielectric liner aforementioned may be further optionally formed between the liners 480 and the semiconductor substrate 410 and between the liners 480 and the device layer 420. If needed, the conductive pillars 470 may be accessibly revealed by the bottom surface S410*b* of the semiconductor substrate 410 through performing a planarization process or etching process in a sequential step, the disclosure is not limited thereto.

In some embodiments, each of the semiconductor dies 400 further includes an isolation layer (not shown) disposed on the semiconductor substrate 410 and laterally covering end portions of the conductive pillars 470, where the semiconductor substrate 410 is between the isolation layer and the device layer 420. The isolation layer may be formed by, but not limited to, recessing the semiconductor substrate 410 to have the conductive pillars 470 protruding out of the semiconductor substrate 410 after the conductive pillars 470 are accessibly revealed by the semiconductor substrate 410, globally forming a blanket layer of isolation material (e.g., oxide, nitride, oxynitride, carbide, or polymer, etc.) by spin-coating or deposition (e.g., CVD) to cover up the semiconductor substrate 410 and the conductive pillars 470, and performing a planarization process on the isolation material blanket layer to accessibly reveal the end surfaces of the conductive pillars 470, where the remained isolation material blanket layer disposed on the semiconductor substrate 410 and laterally covering a portion of the conductive pillars 470 is referred to as the isolation layer. Alternatively, a native oxide that may be formed on the bottom surface S410*b* of the semiconductor substrate 410 4 before the formation of the isolation layer.

In some embodiments, the semiconductor dies 400 are faced upwards and placed onto the debond layer 102 over the carrier 101, as shown in FIG. 1 in conjunction with FIG. 13. The semiconductor dies 400 may be referred to as semiconductor dies or chips, independently, including a digital chip, an analog chip, or a mixed signal chip. In some embodiments, the semiconductor dies 400 are, independently, a logic die such as a central processing unit (CPU), a graphics processing unit (GPU), a neural network processing unit (NPU), a deep learning processing unit (DPU), a tensor processing unit (TPU), a system-on-a-chip (SoC), a system-on-integrated circuit (SoIC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor dies 400 are, independently, a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, or a wide I/O (WIO) memory; a pre-stacked memory cube such as a hybrid memory cube (HMC) module, a high bandwidth memory (HBM) module; a combination thereof; or the like. In further alternative embodiments, the semiconductor dies 400 are, independently, an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoIC system, etc.; a combination thereof; or the like. In some other embodiments, the semiconductor dies 400 are, independently, an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The types of the semiconductor dies 400 may be selected and designated based on the demand and design requirement, and thus are not specifically limited in the disclosure.

In accordance with some embodiments of the disclosure, the types of some of the semiconductor dies 400 are different from each other, while the types of some of the semiconductor dies 400 are identical types. In alternative embodiments, the types of all of the semiconductor dies 400 are different. In further alternative embodiments, the types of all of the semiconductor dies 400 are identical. In accordance with some embodiments of the disclosure, the sizes of some of the semiconductor dies 400 are different from each other, while the sizes of some of the semiconductor dies 400 are the same sizes. In alternative embodiments, the sizes of all of the semiconductor dies 400 are different. In further alternative embodiments, the sizes of all of the semiconductor dies 400 are the same. In accordance with some embodiments of the disclosure, the shapes of some of the semiconductor dies 400 are different from each other, while the shapes of some of the semiconductor dies 400 are identical. In alternative embodiments, the shapes of all of the semiconductor dies 400 are different. In further alternative embodiments, the shapes of all of the semiconductor dies 400 are identical. The types, sizes and shapes of each of the semiconductor dies 400 are independent from each other, and may be selected and designed based on the demand and design layout, the disclosure is not limited thereto. As shown in FIG. 1 and FIG. 13, the semiconductor dies 400 are disposed within a device region DR of the semiconductor structure SP1, where the device region DR is surrounded by (e.g., enclosed by) a peripheral region PR of the semiconductor structure SP1, for example.

Referring to FIG. 2, in some embodiments, the semiconductor dies 400 are encapsulated in an insulating material. In some embodiments, an insulating encapsulation 500*m* is conformally formed on the semiconductor dies 400 and over the carrier 101, where the semiconductor dies 400 and the debond layer 102 exposed by the semiconductor dies 400 are completely covered by the insulating encapsulation 500*m*. The insulating encapsulation 500*m* may be made of a dielectric material (such as an oxide (e.g., silicon oxide), a nitride (e.g., silicon nitride), TEOS, or the like) or any suitable insulating materials for gap fill, and may be formed by deposition (such as a CVD process). As shown in FIG. 2 in conjunction with FIG. 13, the top surfaces S400 of the semiconductor dies 400 are not accessibly revealed by the insulating encapsulation 500*m*, for example.

Alternatively, the insulating encapsulation 500*m* may be a molding compound, a molding underfill, a resin (such as epoxy-based resin), or the like, which may be formed by a molding process. The molding process may include a compression molding process or a transfer molding process. The insulating encapsulation 500*m* may include polymers (such as epoxy resins, phenolic resins, silicon-containing resins, or other suitable resins) or other suitable materials. Alternatively, the insulating encapsulation 500*m* may include an acceptable insulating encapsulation material. In some embodiments, the insulating encapsulation 500*m* further includes inorganic filler or inorganic compound (e.g. silica, clay, and so on) which can be added therein to optimize coefficient of thermal expansion (CTE) of the insulating encapsulation 500*m*. The disclosure is not limited thereto.

Referring to FIG. 2 and FIG. 3, in some embodiments, a planarization process is performed on the insulating encapsulation 500*m* to form an insulating encapsulation 500*a* exposing the semiconductor dies 400. For example, a portion of the insulating encapsulation 500*m* is removed to form the insulating encapsulation 500*a* having an illustrated top surface constituted by a substantial slant planar surface S500*t*1 at the peripheral region PR and a substantial planar surface S500*t*2 at the device region DR surrounded by (or bounded by) the substantial slant planar surface S500*t*1, where the substantial slant planar surface S500*t*1 is connected to the substantial planar surface S500*t*2 and a (substantially vertical) sidewall of the insulating encapsulation 500*a* (which being a part of a sidewall SW1 of the semiconductor structure SP1 depicted in FIG. 10 and FIG. 13). As shown in FIG. 3 and FIG. 13, the substantial planar surface S500*t*2 is connected to and enclosed by the substantial slant planar surface S500*t*1, for example. The substantial planar surface S500*t*2 may be considered as a substantially horizontal planar surface extending along the X-Y plane. In such cases, the substantial planar surface S500*t*2 accessibly reveals the semiconductor dies 400. For example, top surfaces S450*t* of the connecting vias 450 and a top surface S460*t* of the protection layer 460 of each of the semiconductor dies 400 are substantially levelled with the substantial planar surface S500*t*2 of the insulating encapsulation 500*a*. In other words, the top surfaces S450*t* of the connecting vias 450 and the top surfaces S460*t* of the protection layers 460 of the semiconductor dies 400 are substantially coplanar to the substantial planar surface S500*t*2 of the insulating encapsulation 500*a*. For each semiconductor die 400, the top surfaces S450*t* of the connecting vias 450 and the top surface S460*t* of the protection layer 460 are together referred to as a front side or a front-side surface S400*t*, and the bottom surface S410*b* is referred to as a bottom side, a rear side, a bottom-side surface, or a rear-side surface S400*b*, where the bottom side S400*b* is opposite to the front side S400*t* in the stacking direction Z. The bottom side S400*b* may be substantially coplanar to a bottom surface S500*b* of the insulating encapsulation 500*a*, where the bottom surface S500*b* of the insulating encapsulation 500*a* is opposite to the substantial planar surface S500*t*2 of the insulating encapsulation 500*a*, as shown in FIG. 3.

On the other hand, the substantial slant planar surface S500*t*1 may be considered as a bevel edge, where the insulating encapsulation 500*a* at the peripheral region PR has a thickness (not labeled) gradually decreasing along a direction from the device region DR toward to the sidewall of the semiconductor structure SP1. Such bevel edge may be created during the planarization process at or near the edge/sidewall of the to-be-polished object (e.g., the semiconductor structure SP1) due to over-grinding/polishing or the less metal (or pattern) density as compared to a center region thereof. If considering a semiconductor die (with active device(s)) is located at or near the edge/sidewall of the semiconductor structure SP1, such semiconductor die would be damaged due to the bevel edge occurs, which leads to an abnormal functionalities or loss of functionalities. In order to avoid such damages, one or more dummy dies (e.g., 200) and/or one or more deep trench capacitors (DTC without any active devices such as transistor, diodes, memory, etc. are formed therein) (e.g., 300) may be adopted at the peripheral region PR to function as an structure support during planarizing (or thinning) process, thereby the resulting bevel edge would be stopped at/within the desired peripheral region PR, without further extending into the device region DR. Consequently, semiconductor dies formed within the device region DR bounded by the desired peripheral region PR disposed with one or more dummy dies (e.g., 200) and/or one or more deep trench capacitors (DTC without any active devices such as transistor, diodes, memory, etc. are formed therein) (e.g., 300) will be prevented from damages caused by planarizing (or thinning) process (which will be discussed later in great details).

The sidewalls (not labeled) of the semiconductor dies 400 and the debond layer 102 exposed by the semiconductor dies 100 are still covered by the insulating encapsulation 500*a*, in some embodiments. In such case, the insulating encapsulation 500*a* laterally covers the semiconductor dies 400, as shown in FIG. 3 and FIG. 13.

During the planarization process, the protection layer 460 of one or more than one of the semiconductor dies 400 may further be planarized. In addition to the protection layers 460, the connecting vias 450 of one or more than one of the semiconductor dies 400 may further be planarized. In some embodiments, the planarization process may include a grinding process, a chemical mechanical polishing (CMP) process, an etching process, or combinations thereof. The etching process may include a dry etching, a wet etching, or a combination thereof. After the planarization process, a cleaning process may be optionally performed, for example to clean and remove the residue generated from the planarization process. However, the disclosure is not limited thereto, and the planarization process may be performed through any other suitable method.

Referring to FIG. 4, in some embodiments, one or more semiconductor dies 100, one or more dummy dies 200 and one or more DTCs 300 are picked and placed on the insulating encapsulation 500*a* and over the carrier 101. In some embodiments, the semiconductor dies 100 are arranged in the device region DR, while the one or more dummy dies 200 and the one or more DTCs 300 are arranged in the peripheral region PR, as shown in FIG. 4 and FIG. 13. For illustrative purposes, only twenty two semiconductor dies 100, six dummy dies 200, and four DTCs 300 are shown in FIG. 13 and only three semiconductor dies 100 (also denoted as 100A, 100B, and 100C in FIG. 1 for simplicity), one dummy die 200, and one DTC 300 are shown in FIG. 1, however the disclosure is not limited thereto. The number of the semiconductor dies 100 may be more than twenty two or less than twenty two, the number of the dummy dies 200 may be zero, less than six or more than six, and the number of the DTCs 300 may be zero, less than four or more than four. The number of the semiconductor dies 100, the number of the dummy dies 200, and the number of the DTCs 300 may be selected and designated based on the demand or design layout.

As shown in FIG. 4 and FIG. 13, for example, the semiconductor dies 100 are arranged in the device region DR, and are arranged aside to each other along a direction X and a direction Y, where the direction X and the direction Y are different to each other and are different from the stacking direction Z of the carrier 101 and the debond layer 102. The direction X and the direction Y may be substantially perpendicular to the stacking direction Z, and the direction X may be substantially perpendicular to the direction Y. The semiconductor dies 100 may be arranged in an array. For one non-limiting example, the semiconductor dies 100 are arranged in the form of a matrix, such as a N×N array or a N×M array (N, M>0, N may or may not be equal to M) along the direction X and the direction Y. In some embodiments, the semiconductor dies 100 arranged in immediately adjacent rows and/or columns are positioned in an alignment manner (e.g. an array form) on the X-Y plane. In some other embodiments, the semiconductor dies 100 arranged in immediately adjacent rows and/or columns are positioned in a staggered manner (e.g. a staggered form) on the X-Y plane. In further other embodiments, the semiconductor dies 100 are arranged into a pre-determined pattern in a concentric manner, where at least one of the semiconductor dies 100 is located at the center (e.g., a center CT of the semiconductor structure SP1 depicted in FIG. 13) of the device region DR and surrounded by the other semiconductor dies 100 on the X-Y plane, and the semiconductor dies 100 surrounding the at least one of the semiconductor dies 100 being located at the center are in radial arrangement in the device region DR.

However, the disclosure is not limited thereto. For example, in the top view of FIG. 13, the semiconductor dies 100 each are arranged within the device regions DR and are spacing apart from an immediately adjacent device (e.g., another one semiconductor die 100) with a horizontal distance D1 (e.g., a shortest distance as measured along the direction X) and a vertical distance D2 (e.g., a shortest distance as measured along the direction Y). In the case, some of the semiconductor dies 100 arranged in immediately adjacent rows may be positioned in a staggered manner and/or an alignment manner, and/or some of the semiconductor dies 100 arranged in immediately adjacent columns may be positioned in a staggered manner and/or an alignment manner. The horizontal distance D1 may be approximately ranging from 0.5 μm to 80 μm, although other suitable horizontal distance may alternatively be utilized. The vertical distance D2 may be approximately ranging from 0.5 μm to 80 μm, although other suitable vertical distance may alternatively be utilized. In some embodiments, an outermost semiconductor die 100 is distant from the edge (e.g., the sidewall SW1) of the semiconductor package SP1 by a minimum distance D7. In some embodiments, the minimum distance D7 should be larger enough to accommodate at least one of the dummy dies 200 or the DTCs 300. However, the disclosure is not limited thereto; alternatively, the minimum distance D7 may be greater than or substantially equal to 0 mm. The minimum distance D7 may be approximately ranging from 0 mm to 3 mm, although other suitable minimum distance may alternatively be utilized.

In some embodiments, each of the semiconductor dies 100 includes a semiconductor substrate 110 having an active surface S110*f* and a bottom surface S110*b* opposite to the active surface S110*f*, a device layer 120 having semiconductor devices (not shown) formed thereon, an interconnect structure 130 (including one or more dielectric layers 132 and one or more metallization layers 134 in alternation) formed on the device layer 120 and over the semiconductor substrate 110, a plurality of connecting pads 140 formed on the interconnect structure 130, a plurality of connecting vias 150 formed on the connecting pads 140, a protection layer 160 covering the interconnect structure 130, the connecting pads 140 and the connecting vias 150, and a plurality of conductive pillars 170 formed (embedded) in the semiconductor substrate 110. In some embodiments, each of the semiconductor dies 100 further includes an isolation layer (denoted as "90" depicted in FIGS. 14 and 15) disposed on the semiconductor substrate 110 and laterally covering end portions of the conductive pillars 170, where the semiconductor substrate 110 is between the isolation layer (e.g., 90) and the device layer 120. In some embodiments, the conductive pillars 170 of the semiconductor dies 100 penetrate through the device layer 120, as shown in FIG. 4. In some embodiments, each of the conductive pillars 170 is covered by a liner 180. In addition, a dielectric liner (not shown) (e.g., silicon nitride, an oxide, a polymer, a combination thereof, etc.) may be further optionally formed between the liners 180 and the semiconductor substrate 110 and between the liners 180 and the device layer 120. As an alternative, the conductive pillars 170 of the semiconductor dies 100 do not penetrate through the device layer 120. In the embodiment of which the conductive pillars 170 of the semiconductor dies 100 do not penetrate through the device layer 120, the optional dielectric liner may be formed only between the liners 180 and the semiconductor substrate 110.

As shown in FIG. 4, for example, the semiconductor devices of the device layer 120 are interconnected through the interconnect structure 130, the connecting vias 150 are electrically connected to the interconnect structure 130 through the connecting pads 140, and the conductive pillars 170 are electrically connected to the semiconductor devices of the device layer 120 through the interconnect structure 130. Alternatively, the semiconductor devices of the device layer 120 are interconnected through the interconnect structure 130, the connecting vias 150 are electrically connected to the interconnect structure 130 through the connecting pads 140, and the conductive pillars 170 are electrically connected to the semiconductor devices of the device layer 120 through physical contacts. The formation, material, and details of the semiconductor dies 100 (e.g., the semiconductor substrate 110, the device layer 120, the interconnect structure 130, the connecting pads 140, the connecting vias 150, the protection layer 160, the conductive pillars 170, the liners 180, the optional dielectric liner, and the isolation layer (e.g., 90)) are similar to or substantially identical to the formation, material, and details of the semiconductor dies 400 (e.g., the semiconductor substrate 410, the device layer 420, the interconnect structure 430, the connecting pads 440, the connecting vias 450, the protection layer 460, the conductive pillars 470, the liners 480, the optional dielectric liner, and the isolation layer) as described in FIG. 1, and thus are not repeated herein for brevity.

The semiconductor dies 100 may be referred to as semiconductor dies or chips, independently, including a digital chip, an analog chip, or a mixed signal chip. In some embodiments, the semiconductor dies 100 are, independently, a logic die such as a central processing unit (CPU), a graphics processing unit (GPU), a neural network processing unit (NPU), a deep learning processing unit (DPU), a tensor processing unit (TPU), a system-on-a-chip (SoC), a system-on-integrated circuit (SoIC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor dies 100 are, independently, a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, or a wide I/O (WIO) memory; a pre-stacked memory cube such as a hybrid memory cube (HMC) module, a high bandwidth memory (HBM) module; a combination thereof; or the like. In further alternative embodiments, the semiconductor dies 100 are, independently, an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoIC system, etc.; a combination thereof; or the like. In some other embodiments, the semiconductor dies 100 are, independently, an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The types of the semiconductor dies 100 may be selected and designated based on the demand and design requirement, and thus are not specifically limited in the disclosure.

In accordance with some embodiments of the disclosure, the types of some of the semiconductor dies 100 are different from each other, while the types of some of the semiconductor dies 100 are identical types. In alternative embodiments, the types of all of the semiconductor dies 100 are different. In further alternative embodiments, the types of all of the semiconductor dies 100 are identical. In accordance with some embodiments of the disclosure, the sizes of some of the semiconductor dies 100 are different from each other, while the sizes of some of the semiconductor dies 100 are the same sizes. In alternative embodiments, the sizes of all of the semiconductor dies 100 are different. In further alternative embodiments, the sizes of all of the semiconductor dies 100 are the same. In accordance with some embodiments of the disclosure, the shapes of some of the semiconductor dies 100 are different from each other, while the shapes of some of the semiconductor dies 100 are identical. In alternative embodiments, the shapes of all of the semiconductor dies 100 are different. In further alternative embodiments, the shapes of all of the semiconductor dies 100 are identical. The types, sizes and shapes of each of the semiconductor dies 100 are independent from each other, and may be selected and designed based on the demand and design layout, the disclosure is not limited thereto.

Continued on FIG. 4 and FIG. 13, in some embodiments, the dummy dies 200 and the DTCs 300 are arranged in peripheral region PR and next to the semiconductor dies 100. For example, the dummy dies 200 are grouped into several pairs, where two dummy dies 200 of each pairs are placed within the peripheral region PR at two opposite ends of a diameter line (e.g., DL3, DL5, DL6) passing through the center CT of the semiconductor package SP1. Similarly, the DTCs 300 are grouped into several pairs, where two DTCs 300 of each pairs are placed within the peripheral region PR at two opposite ends of another diameter line (e.g., DL2 and DL4) passing through the center CT of the semiconductor package SP1. The first diameter line (e.g., DL2) may be substantially perpendicular to the second diameter line (e.g., DL4). In some alternative embodiments, one dummy die 200 and one DTC 300 are grouped as one pair, and the dummy die 200 and the DTC 300 of the respective pair may be placed within the peripheral region PR at two opposite ends of a diameter line passing through the center CT of the semiconductor package SP1. In a non-limiting example, the dummy dies 200 are arranged to be in a form of point symmetry or reflection of a point (e.g., the center CT). Alternatively, the dummy dies 200 are arranged to be in a form of line symmetry. In another non-limiting example, the DTCs 300 are arranged to be in a form of point symmetry or reflection of a point (e.g., the center CT). Alternatively, the DTCs 300 are arranged to be in a form of line symmetry. Or, the dummy dies 200 and the DTCs 300 together are arranged to be in a form of point symmetry or reflection of a point (e.g., the center CT). Alternatively, the dummy dies 200 and the DTCs 300 together are arranged to be in a form of line symmetry.

In some embodiments, each of the dummy dies 200 includes a semiconductor substrate 210 having an active surface S210*f* and a bottom surface S210*b* opposite to the active surface S210*f*, an interconnect structure 230 (including one or more dielectric layers 232 and one or more metallization layers 234 in alternation) formed on the semiconductor substrate 210, a plurality of connecting pads 240 formed on the interconnect structure 230, a plurality of connecting vias 250 formed on the connecting pads 240, and a protection layer 260 covering the interconnect structure 230, the connecting pads 240 and the connecting vias 250. The interconnect structure 230 may be omitted. Alternatively, the interconnect structure 230 and the connecting pads 240 may be omitted. Or alternatively, the interconnect structure 230, the connecting pads 240, the connecting vias 250, and the protection layer 260 may be omitted. In other words, the dummy dies 200 may be made of silicon or silicon oxide, only. In the cases, there is no active and passive devices formed in the dummy dies 200. That is, the dummy dies 200 may further exclude the metal routing lines. Owing to the configuration of the dummy dies 200, the dummy dies 200 may serve as heat dissipating elements (or heat sinks) of the semiconductor structure SP1. The types, sizes and shapes of each of the dummy dies 200 are independent from each other, and may be selected and designed based on the demand and design layout, the disclosure is not limited thereto. The formation, material, and details of the dummy dies 200 (e.g., the semiconductor substrate 210, the interconnect structure 230, the connecting pads 240, the connecting vias 250, and the protection layer 260) are similar to or substantially identical to the formation, material, and details of the semiconductor dies 400 (e.g., the semiconductor substrate 410, the interconnect structure 430, the connecting pads 440, the connecting vias 450, and the protection layer 460) as described in FIG. 1, and thus are not repeated herein for brevity.

For example, in the top view of FIG. 13, the dummy dies 200 each are arranged within the peripheral regions PR and are spacing apart from an immediately adjacent device (e.g., another one semiconductor die 100, another dummy die 200, or another DTC 300) with a horizontal distance D3 (e.g., a shortest distance as measured along the direction X) and a vertical distance D4 (e.g., a shortest distance as measured along the direction Y). The horizontal distance D3 may be approximately ranging from 0.5 μm to 100 μm (for example, about 80 μm), although other suitable horizontal distance may alternatively be utilized. The vertical distance D4 may be approximately ranging from 0.5 μm to 100 μm (for example, about 80 μm), although other suitable vertical distance may alternatively be utilized. In some embodiments, each of the dummy dies 200 is distant from the edge (e.g., the sidewall SW1) of the semiconductor package SP1 by a minimum distance D8. The minimum distance D8 may be approximately ranging from 0 mm to 3 mm, although other suitable minimum distance may alternatively be utilized. The minimum distance D8 may be 0 mm, 0.5 mm, 1.0 mm, 1.5 mm, 2.0 mm, 2.5 mm, or 3.0 mm.

In some embodiments, each of the DTCs 300 includes a semiconductor substrate 310, a capacitor 320 embedded in the semiconductor substrate 310 having an active surface S310*f* and a bottom surface S310*b* opposite to the active surface S310*f*, a plurality of connecting pads 330 disposed on and electrically coupled to the capacitor 320, a passivation layer 340 formed on connecting pads 330 and over the semiconductor substrate 310, a post-passivation layer 350 formed on the connecting pads 330 and the passivation layer 340, a plurality of connecting vias 360 formed on and electrically connected to the connecting pads 330 and on the post-passivation layer 350, a protection layer 370 covering the connecting vias 360 and the post-passivation layer 350, and at least one conductive pillar 380 formed (embedded) in the semiconductor substrate 310 next to the capacitor 320 and electrically connected to a respective one connecting pad 330. In some embodiments, each of the DTCs 300 further includes an isolation layer (not shown) disposed on the semiconductor substrate 310 and laterally covering end portions of the conductive pillars 380, where the semiconductor substrate 310 is between the isolation layer and the connecting pads 330. Alternatively, the connecting vias 350 and the protection layer 360 may be omitted. In some embodiments, the conductive pillars 380 of the DTCs 300 penetrate through the semiconductor substrate 310, as shown in FIG. 4 and FIG. 13. In some embodiments, each of the conductive pillars 380 is covered by a liner 390. In addition, a dielectric liner (not shown) (e.g., silicon nitride, an oxide, a polymer, a combination thereof, etc.) may be further optionally formed between the liners 390 and the semiconductor substrate 310. As an alternative, the conductive pillars 390 of the DTCs 300 do not penetrate through the semiconductor substrate 310. The formation, material, and details of the DTCs 300 (e.g., the semiconductor substrate 310, the connecting pads 330, the connecting vias 360, the protection layer 370, the conductive pillars 380, the liners 390, the optional dielectric liner, and the isolation layer) are similar to or substantially identical to the formation, material, and details of the semiconductor dies 400 (e.g., the semiconductor substrate 410, the connecting pads 440, the connecting vias 450, the protection layer 460, the conductive pillars 470, the liners 480, the optional dielectric liner, and the isolation layer) as described in FIG. 1, and thus are not repeated herein for brevity. The number of the capacitor 320, the number of the connecting pads 330, the number of the connecting vias 360, and the number of the conductive pillar 380 are not limited to the embodiments, and may be selected and designated based on the demand and design layout.

As shown in FIG. 4, for example, in each DTC 300, the capacitor 320 is electrically connected to the connecting vias 360 through the connecting pads 330, and the conductive pillar 380 is electrically connected to the connecting vias 360 through the connecting pads 330, where the capacitor 320 is electrically connected to the conductive pillar 380 through the connecting pads 330. In some embodiments, the capacitor 320 includes a conductive layer 322, a conductive layer 326, and a dielectric layer 324 sandwiched therebetween. In one embodiment, the capacitor 320 may be a metal-insulator-metal (MIM) capacitor or a metal-oxide-metal (MOM) capacitor. In some embodiments, a capacitance density of the capacitor 320 is greater than or substantially equal to 100 $nF/mm^2$. Due to the capacitor 320, the power integrity and system performance of a semiconductor die later-to-be electrically connected to the capacitor 320 are improved. In some embodiments, the passivation layer 340 and/or the post-passivation layer 350 may be a silicon oxide layer, a silicon nitride layer, a silicon oxy-nitride layer or a dielectric layer formed by other suitable dielectric materials. In some alternative embodiments, the passivation layer 340 and/or the post-passivation layer 350 may be a PI layer, a PBO layer, or a dielectric layer formed by other suitable polymers. It is noted that the formation of each of the passivation layer 340 and/or the post-passivation layer 350 is independently optional in some alternative embodiments. In one embodiment, the materials of the passivation layer 340, the post-passivation layer 350, and the protection layer 370 may be the same. In an alternative embodiment, the materials of the passivation layer 340, the post-passivation layer 350, and the protection layer 370 may be different. The types, sizes and shapes of each of the DTCs 300 are independent from each other, and may be selected and designed based on the demand and design layout, the disclosure is not limited thereto.

For example, in the top view of FIG. 13, the DTC 300 each are arranged within the peripheral regions PR and are spacing apart from an immediately adjacent device (e.g., another one semiconductor die 100, another dummy die 200, or another DTC 300) with a horizontal distance D5 (e.g., a shortest distance as measured along the direction X) and a vertical distance D6 (e.g., a shortest distance as measured along the direction Y). The horizontal distance D5 may be approximately ranging from 0.5 μm to 100 μm (for example, about 80 μm), although other suitable horizontal distance may alternatively be utilized. The vertical distance D6 may be approximately ranging from 0.5 μm to 100 μm (for example, about 80 μm), although other suitable vertical distance may alternatively be utilized. In some embodiments, each of the DTC 300 is distant from the edge (e.g., the sidewall SW1) of the semiconductor package SP1 by a minimum distance D9. The minimum distance D9 may be approximately ranging from 0 mm to 3 mm, although other suitable minimum distance may alternatively be utilized. The minimum distance D9 may be 0 mm, 0.5 mm, 1.0 mm, 1.5 mm, 2.0 mm, 2.5 mm, or 3.0 mm. In addition, the DTCs 300 may be a small die or chip (as compared to the semiconductor dies 100 disposed within the device region DR) with an die area greater than or substantially equal to about 0.0001 $mm^2$ and less than or substantially equal to about 5.0 $mm^2$. The DTCs 300 may have the die area of from about 1 $mm^2$ to about 5 $mm^2$.

After the placement of the semiconductor dies 100, the dummy dies 200 and the DTCs 300, a bonding process is performed to bond the semiconductor dies 100 (e.g., 100B and 100C) onto a respective one semiconductor die 400 overlapped therewith along the stacking direction Z, in some embodiments. For example, the semiconductor dies 100 (e.g., the semiconductor dies 100B, 100C) are electrically connected to and electrically communicated to each other through the semiconductor die 400. In the disclosure, the semiconductor die 400 may be referred to as a bridge die (or chip) or a semiconductor bridge die (or chip).

For example, the semiconductor die 100B and the semiconductor die 100C are bonded to the semiconductor die 400 by bonding process including both of a metal-to-metal bonding and a dielectric-to-dielectric bonding. As shown in FIG. 4, each of the semiconductor dies 100 (e.g., the semiconductor dies 100B, 100C) is disposed on (e.g., in physical contact with) and electrically connected to the semiconductor die 400 (encapsulated in the insulating encapsulation 500*a*). In some embodiments, as shown in FIG. 4 and FIG. 14, end surfaces (not labeled) of the conductive pillars 170 in each of the semiconductor dies 100 (e.g., the semiconductor dies 100B, 100C) and the top surfaces S450*t* of the connecting vias 450 of the semiconductor die 400 prop against each other and are bonded together through direct metal-to-metal bonding (such as a copper-to-copper bonding). In addition, as shown in FIG. 4 and FIG. 14, a surface (not labeled) of the isolation layer 90 (laterally covering the end portions of the conductive pillars 170 and over the semiconductor substrate 110) in each of the semiconductor dies 100 (e.g., the semiconductor dies 100B, 100C) and the top surface S460*t* of the protection layer 460 of the semiconductor die 400 prop against each other and are bonded together through a direct dielectrics-to-dielectrics bonding (such as an oxide-to-oxide bonding, a nitride-to-nitride bonding, or an oxide-to-nitride bonding), for example. In such embodiments, a bonding interface IF1 between the semiconductor dies 100 (e.g., the semiconductor dies 100B, 100C) and the semiconductor die 400 includes a (direct) dielectric-to-dielectric bonding interface (e.g., an oxide-to-oxide bonding interface, a nitride-to-nitride bonding interface, or an oxide-to-nitride bonding interface) and a (direct) metal-to-metal bonding interface (e.g., a copper-to-copper bonding interface).

It should be noted that bonding methods described above are merely examples and are not intended to be limiting. An offset may present between sidewalls of the connecting vias 450 and a sidewall of the conductive pillars 170 overlying thereto, see FIG. 4 and FIG. 14. Since one of the connecting vias 450 and the conductive pillars 170 may have a larger bonding surface than the other one, the direct metal-to-metal bonding may still be achieved even if misalignment occurs, thereby the reliability of electrical connections between the semiconductor dies 100 (e.g., the semiconductor dies (100B, 100C) and the semiconductor die 400 can be ensured. With such, for certain embodiments, either the protection layer 460 immediately adjacent to the connecting vias 450 is bonded to a portion of each of the conductive pillars 170 (e.g., a dielectric-to-metal bonding), or the isolation layer 90 immediately adjacent to the conductive pillars 170 is bonded to a portion of each of the connecting vias 450 (e.g., a dielectric-to-metal bonding, see FIG. 4 and FIG. 14).

However, the disclosure is not limited thereto; alternatively, the semiconductor dies 100 (e.g., the semiconductor dies 100B, 100C) may be bonded to the semiconductor die 400 by flip-chip bonding, see FIG. 15. In the alternative embodiments, a plurality of joints 50A are presented between the conductive pillars 170 of each of the semiconductor dies 100 (e.g., the semiconductor dies 100B, 100C) and the conductive vias 450 of the semiconductor die 400 for mechanically connecting and electrically connecting the semiconductor dies 100 (e.g., the semiconductor dies 100B, 100C) and the semiconductor die 400. The joints 50A includes micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. When solder is used, the solder may include either eutectic solder or non-eutectic solder. The solder may include lead or be lead-free, and may include Sn—Ag, Sn—Cu, Sn—Ag—Cu, or the like. When solder is used, the joints 50A may be referred to as solder joints or solder regions. In such alternative embodiments, an underfill (not show) may be optionally applied to wrap sidewalls of the joints 50A to ensure the adhesion strength between the semiconductor dies 100 (e.g., the semiconductor dies 100B, 100C) and the semiconductor die 400. The underfill may be omitted.

Figure 5:
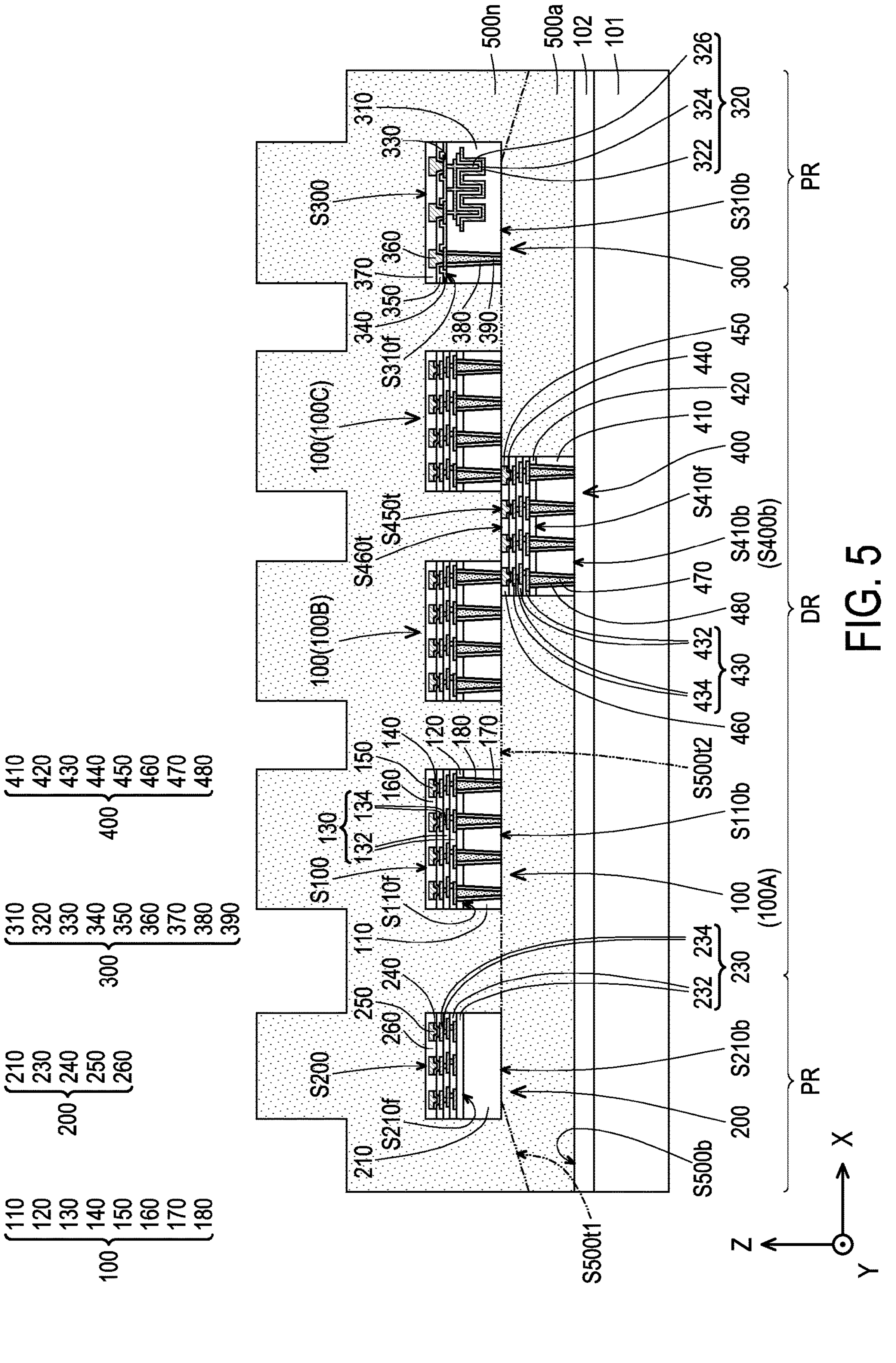

Referring to FIG. 5, in some embodiments, the semiconductor dies 100, the dummy dies 200 and the DTCs 300 are encapsulated in an insulating material. In some embodiments, an insulating encapsulation 500*n* is conformally formed on the semiconductor dies 100, the dummy dies 200 and the DTCs 300 and over the carrier 101, where the semiconductor dies 100, the dummy dies 200, the DTCs 300 and the insulating encapsulation 500*a* exposed by the semiconductor dies 100, the dummy dies 200 and the DTCs 300 are completely covered by the insulating encapsulation 500*n*. The formation and material of the insulating encapsulation 500*n* is similar to or substantially identical to the formation and material of the insulating encapsulation 500*m* as described in FIG. 2, and thus are not repeated herein for brevity. As shown in FIG. 5 in conjunction with FIG. 13, the top surfaces S100 of the semiconductor dies 100, the top surfaces S200 of the dummy dies 200 and the top surfaces S300 of the DTCs 300 are not accessibly revealed by the insulating encapsulation 500*n* for example.

In some embodiments, the material of the insulating encapsulation 500*n* is the same as the material of the insulating encapsulation 500*m*, where there is no a clear interface between the insulating encapsulation 500*n* and the insulating encapsulation 500*a*, as shown in FIG. 5. Alternatively, the material of the insulating encapsulation 500*n* may be different from the material of the insulating encapsulation 500*m*, where there will be a clear interface between the insulating encapsulation 500*n* and the insulating encapsulation 500*a*.

Figure 6:
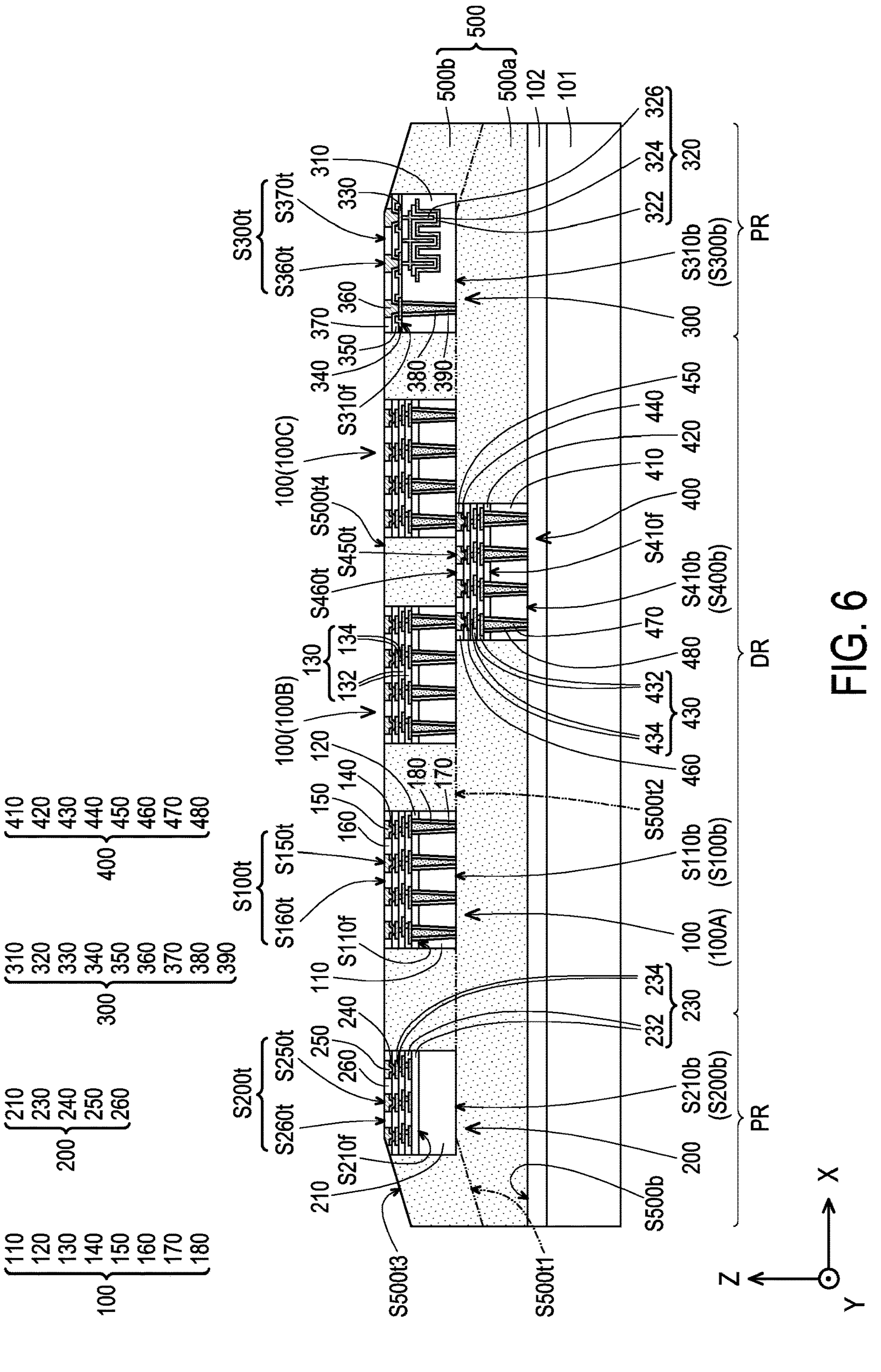

Referring to FIG. 5 and FIG. 6, in some embodiments, a planarization process is performed on the insulating encapsulation 500*n* to form an insulating encapsulation 500*b* exposing the semiconductor dies 100, the dummy dies 200 and the DTCs 300. For example, a portion of the insulating encapsulation 500*n* is removed to form the insulating encapsulation 500*b* having an illustrated top surface constituted by a substantial slant planar surface S500*t*3 at the peripheral region PR and a substantial planar surface S500*t*4 at the device region DR surrounded by (or bounded by) the substantial slant planar surface S500*t*3, where the substantial slant planar surface S500*t*3 is connected to the substantial planar surface S500*t*4 and a (substantially vertical) sidewall of the insulating encapsulation 500*b* (which being a part of a sidewall SW1 of the semiconductor structure SP1 depicted in FIG. 10 and FIG. 13). As shown in FIG. 6 and FIG. 13, the substantial planar surface S500*t*4 is connected to and enclosed by the substantial slant planar surface S500*t*3, for example. The substantial planar surface S500*t*4 may be considered as a substantially horizontal planar surface extending along the X-Y plane. In such cases, the substantial planar surface S500*t*4 accessibly reveals the semiconductor dies 100. For example, top surfaces S150*t* of the connecting vias 150 and a top surface S160*t* of the protection layer 160 of each of the semiconductor dies 100 are substantially levelled with the substantial planar surface S500*t*4 of the insulating encapsulation 500*b*. In other words, the top surfaces S150*t* of the connecting vias 150 and the top surfaces S160*t* of the protection layers 160 of the semiconductor dies 100 are substantially coplanar to the substantial planar surface S500*t*4 of the insulating encapsulation 500*b*. For each semiconductor die 100, the top surfaces S150*t* of the connecting vias 150 and the top surface S160*t* of the protection layer 160 are together referred to as a front side or a front-side surface S100*t*, and the bottom surface S110*b* is referred to as a bottom side, a rear side, a bottom-side surface, or a rear-side surface S100*b*, where the bottom side S100*b* is opposite to the front side S100*t* in the stacking direction Z.

In certain cases, the substantial planar surface S500*t*4 further accessibly reveals the dummy dies 200 and/or the DTCs 300, partially. For example, top surfaces S250*t* of some connecting vias 250 and a top surface S260*t* of a portion of the protection layer 260 of each of the dummy dies 200 and/or top surfaces S360*t* of some connecting vias 360 and a top surface S370*t* of a portion of the protection layer 370 of each of the DTCs 300 are substantially levelled with the substantial planar surface S500*t*4 of the insulating encapsulation 500*b*. In other words, the top surfaces S250*t* of some connecting vias 250 and the top surface S260*t* of the portion of the protection layer 260 of each of the dummy dies 200 and/or the top surfaces S360*t* of some connecting vias 360 and the top surface S370*t* of the portion of the protection layer 370 of each of the DTCs 300 are substantially coplanar to the substantial planar surface S500*t*4 of the insulating encapsulation 500*b*. For each dummy die 200, the top surfaces S250*t* of the connecting vias 250 and the top surface S260*t* of the protection layer 260 are together referred to as a front side or a front-side surface S200*t*, and the bottom surface S210*b* is referred to as a bottom side, a rear side, a bottom-side surface, or a rear-side surface S200*b*, where the bottom side S200*b* is opposite to the front side S200*t* in the stacking direction Z. The front side S200*t* may be non-flat. On the other hand, for each DTC 300, the top surfaces S360*t* of the connecting vias 360 and the top surface S370*t* of the protection layer 370 are together referred to as a front side or a front-side surface S300*t*, and the bottom surface S310*b* is referred to as a bottom side, a rear side, a bottom-side surface, or a rear-side surface S300*b*, where the bottom side S300*b* is opposite to the front side S300*t* in the stacking direction Z. The front side S300*t* may be non-flat.

On the other hand, the substantial slant planar surface S500*t*3 may be considered as a bevel edge, where the insulating encapsulation 500*b* at the peripheral region PR has a thickness (not labeled) gradually decreasing along a direction from the device region DR toward to the sidewall SW1 of the semiconductor structure SP1. Such bevel edge may be created during the planarization process at or near the edge/sidewall of the to-be-polished object (e.g., the semiconductor structure SP1) due to over-grinding/polishing or the less metal (or pattern) density as compared to a center region thereof. If considering a semiconductor die (with active device(s)) is located at or near the edge/sidewall of the semiconductor structure SP1, such semiconductor die would be damaged due to the bevel edge occurs, which leads to an abnormal functionalities or loss of functionalities. In order to avoid such damages, one or more dummy dies (e.g., 200) and/or one or more deep trench capacitors (DTC without any active devices such as transistor, diodes, memory, etc. are formed therein) (e.g., 300) may be adopted at the peripheral region PR to function as an structure support during planarizing (or thinning) process, thereby the resulting bevel edge would be stopped at/within the desired peripheral region PR, without further extending into the device region DR. Consequently, the semiconductor dies 100 formed within the device region DR bounded by the desired peripheral region PR disposed with one or more dummy dies (e.g., 200) and/or one or more deep trench capacitors (DTC without any active devices such as transistor, diodes, memory, etc. are formed therein) (e.g., 300) will be protected from the damages caused by planarizing (or thinning) process, as the presences of the dummy dies 200 and/or the DTCs 300 improve the edge uniformity of the semiconductor structure SP1. That is, owing to at least one of the dummy dies 200 and the DTCs 300, the substantial slant planar surface S500*t*3 of the insulating encapsulation 500*b* would be stopped at the peripheral region PR (e.g., at the dummy dies 200 and/or the DTCs 300), thereby enhancing the reliability of the semiconductor structure SP1. In some embodiments, the substantial planar surface S500*t*4 of the insulating encapsulation 500*b* extend into the peripheral region PR, as shown in FIG. 6. As an alternative, the substantial planar surface S500*t*4 of the insulating encapsulation 500*b* may reach to and stop at the edge of the peripheral region PR.

After the planarization process, the semiconductor dies 100, the dummy dies 200, and the DTCs 300 are accessibly revealed by the insulating encapsulation 500*b*, for example. Sidewalls (not labeled) of the semiconductor dies 100, sidewalls (not labeled) of the dummy dies 200, sidewalls (not labeled) of the DTCs 300 and the insulating encapsulation 500*a* exposed by the semiconductor dies 100, the dummy dies 200 and the DTCs 300 are still covered by the insulating encapsulation 500*b*, in some embodiments. In such case, the insulating encapsulation 500*b* laterally covers the semiconductor dies 100, the dummy dies 200, and the DTCs 300, as shown in FIG. 6 and FIG. 13.

During the planarization process, the protection layer 160 of one or more than one of the semiconductor dies 100, the protection layer 260 of one or more than one of the dummy dies 200, and/or the protection layer 370 of one or more than one of the DTCs 300 may further be planarized. In addition to the protection layers, the connecting vias 150 of one or more than one of the semiconductor dies 100, the connecting vias 250 of one or more than one of the dummy dies 200, and/or the connecting vias 360 of one or more than one of the DTCs 300 may further be planarized. In some embodiments, the planarization process may include a grinding process, a CMP process, an etching process, or combinations thereof. The etching process may include a dry etching, a wet etching, or a combination thereof. After the planarization process, a cleaning process may be optionally performed, for example to clean and remove the residue generated from the planarization process. However, the disclosure is not limited thereto, and the planarization process may be performed through any other suitable method. In some embodiments, the insulating encapsulation 500*a* and the insulating encapsulation 500*b* together may be referred to as an insulating encapsulation 500. In some embodiments, a thickness of the insulating encapsulation 500 at an edge thereof is less than a thickness of the insulating encapsulation 500 at a center thereof. The insulating encapsulation 500*a*, the insulating encapsulation 500*b* and the insulating encapsulation 500 may be individually referred to as an encapsulant or encapsulating insulator.

Figure 7:
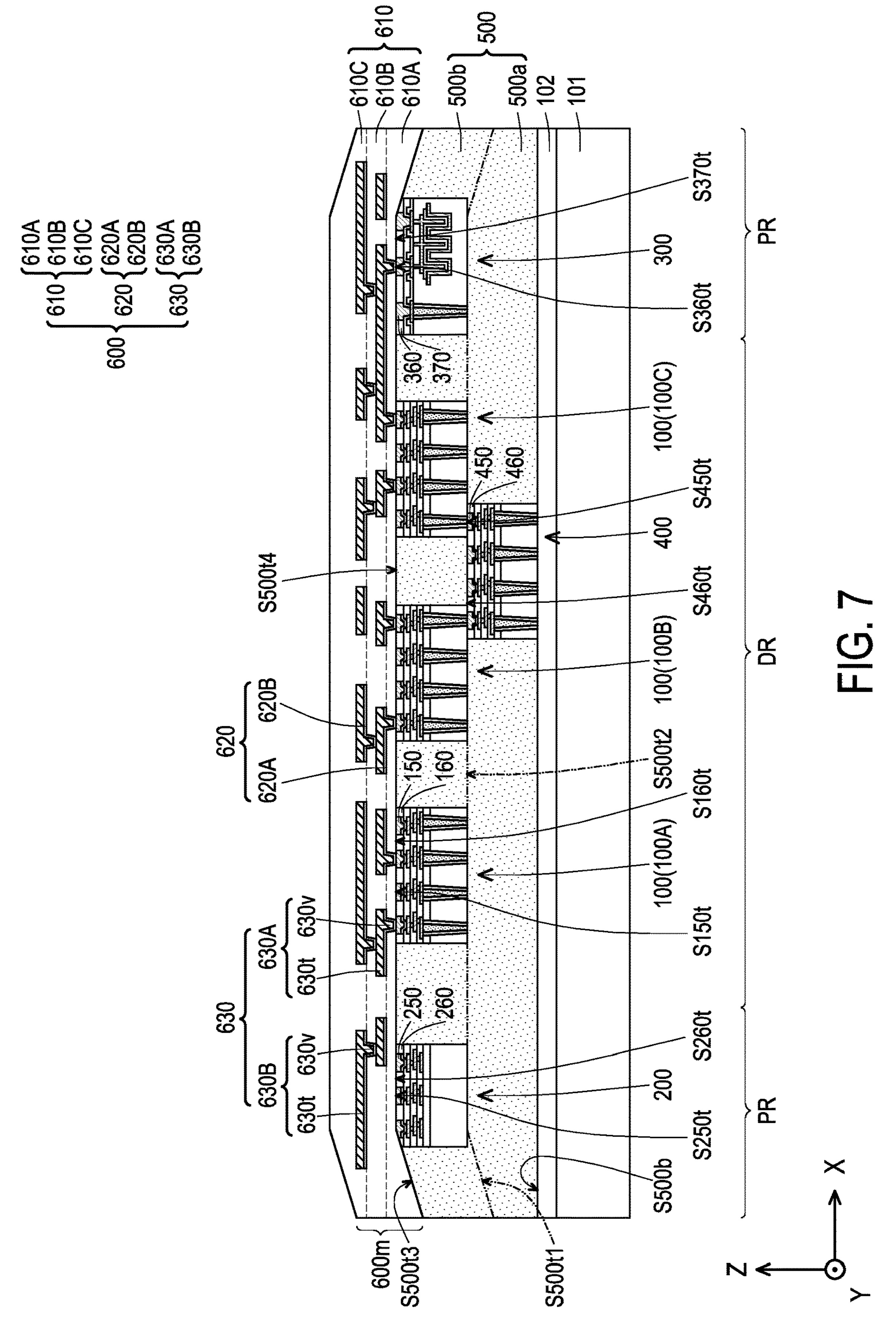

Referring to FIG. 7, in some embodiments, a wafer structure 600*m* is formed on the insulating encapsulation 500*b* and over the carrier 101. In some embodiments, the wafer structure 600*m* includes one or more dielectric layers 610 (e.g., 610A, 610B and 610C), one or more seed layers 620 (e.g., 620A and 620B) and one or more routing layers 630 (e.g., 630A and 630B). In some embodiments, each routing layer 630 includes a line portion 630*t* extending along a horizontal direction (e.g., the direction X or the direction Y), a via portion 630*v* extending along a vertical direction (e.g., the direction Z), and/or a combination thereof. One seed layer 620 and a respective one routing layer 630 overlying thereto may be collectively referred to as a metallization layer or a redistribution layer for routing functions. In some embodiments, in the wafer structure 600*m*, the dielectric layers (e.g., 610) and the metallization layers (e.g., 620 and 630) are arranged in alternation. However, in the disclosure, the numbers of layers of the dielectric layers 610, the seed layers 620, and the routing layers 630 are not limited to what is depicted in FIG. 7, may be selected and designated based on the demand and design layout.

In some embodiments, the wafer structure 600*m* may be formed by, but not limited to: forming a blanket layer of first dielectric material over the insulating encapsulation 500*b*; patterning the first dielectric material blanket layer to form a dielectric layer 610A having a plurality of first openings (not labeled) penetrating there-through and accessibly revealing the connecting vias 150 of the semiconductor dies 100 and the connecting vias 360 of the DTCs 300; forming a blanket layer of first seed layer material over the dielectric layer 610A, the first seed layer material blanket layer extending into the first openings to line the first openings and in contact with the exposed connecting vias 150 of the semiconductor dies 100 and the exposed connecting vias 360 of the DTCs 300; forming a blanket layer of a first conductive material over the first seed layer material blanket layer; patterning the first conductive material blanket layer to form a routing layer 630A; using the routing layer 630A as etching mask to pattern the first seed layer material blanket layer and form the seed layer 620A; forming a blanket layer of second dielectric layer over the routing layer 630A, the seed layer 620A and the dielectric layer 610A; patterning the second dielectric material blanket layer to form a dielectric layer 610B having a plurality of second openings (not labeled) penetrating there-through and accessibly revealing an illustrated top surface of the routing layer 630A; forming a blanket layer of second seed layer material over the dielectric layer 610B, the second seed layer material blanket layer extending into the second openings to line the second openings and in contact with the exposed routing layer 630A; forming a blanket layer of a second conductive material over the second seed layer material blanket layer; patterning the second conductive material blanket layer to form a routing layer 630B; using the routing layer 630B as etching mask to pattern the second seed layer material blanket layer and form the seed layer 620B; forming a blanket layer of third dielectric layer over the routing layer 630B, the seed layer 620B and the dielectric layer 610*b*. Upon this, the wafer structure 600*m* is manufactured.

The material of each of the dielectric layers 610A, 610B and 610C may be PI, PBO, BCB, a nitride such as silicon nitride, an oxide such as silicon oxide, PSG, BSG, BPSG, a combination thereof or the like, which may be patterned using a photolithography and/or etching process. The first, second, and/or third dielectric material blanket layer may be formed by suitable fabrication techniques such as spin-on coating, CVD (e.g., PECVD), or the like. In one embodiment, the materials of the dielectric layers 610A, 610B and 610C are the same to each other. Alternatively, the materials of the dielectric layers 610A, 610B and 610C may be different to one another, in part or all.

The seed layers 620A and 620B individually are referred to as a metal layer, which can be a single layer or a composite layer including a plurality of sub-layers formed of different materials. For example, the seed layers 620A and 620B each may be or include a titanium layer and a copper layer over the titanium layer. The first and/or second seed layer material blanket layers may be formed in a manner of a blanket layer made of metal or metal alloy materials, the disclosure is not limited thereto. The material of each of the first and/or second seed layer material blanket layers may include titanium, copper, molybdenum, tungsten, titanium nitride, titanium tungsten, combinations thereof, or the like, which may be formed using, for example, sputtering, physical vapor deposition (PVD), or the like. The first and/or second seed layer material blanket layers may be patterned by etching, such as a dry etching process, a wet etching process, or a combination thereof; the disclosure is not limited thereto. In one embodiment, the materials of the seed layers 620A and 620B are the same to each other. Alternatively, the materials of the seed layers 620A and 620B may be different to one another.

The material of each of the first and second conductive material blanket layers for forming the routing layers 630A and 630B may be made of conductive materials formed by electroplating or deposition, such as copper, copper alloy, aluminum, aluminum alloy, or combinations thereof, which may be patterned to form a plurality of conductive patterns/segments using a photolithography and etching process. In some embodiments, the conductive patterns/segments each includes the line portion 630*t* extending along a horizontal direction (e.g., the direction X and/or Y) and/or the line portion 630*t* extending along a horizontal direction (e.g., the direction X and/or Y) in addition to a via portion 630*v* connecting to the line portion 630*t* and extending along a vertical direction (e.g., the direction Z). In one embodiment, the materials of the routing 630A and 630B are the same to each other. Alternatively, the materials of the routing layers 630A and 630B may be different to one another.

However, alternatively, the wafer structure 600*m* may be formed on the insulating encapsulation 500 by lamination. The disclosure is not limited thereto.

As shown in FIG. 7, due to the substantially slant planar surface S500*t*3, an illustrated top surface (not labeled) of the wafer structure 600*m* may not have a sufficient planarity to benefit the formation of later-formed component, for example. In other words, it may be considered that there is a warpage issue to the wafer structure 600*m*. A planarization process may be further performed on the wafer structure 600*m* to facilitate the manufacture of the semiconductor structure SP1.

Figure 8:
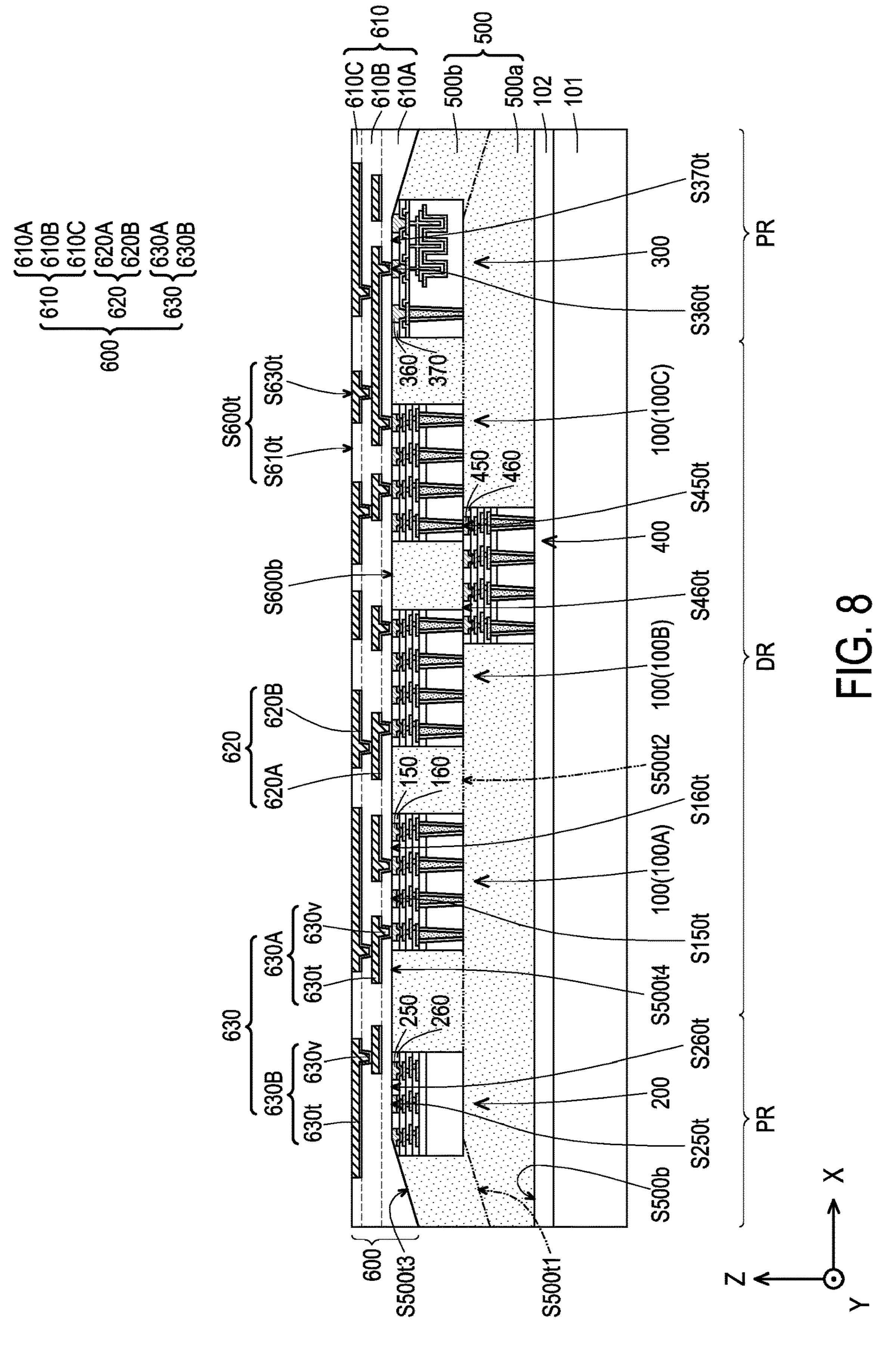

Referring to FIG. 8, in some embodiments, a planarization process is performed on the wafer structure 600*m* to form a wafer structure 600 having a surface S600*t* constituted by an illustrated top surface S610*t* of the dielectric layer 610C and illustrated top surfaces S630*t* of the routing layers 630 exposed by the dielectric layer 610C. For example, the surface S600*t* of the wafer structure 600 is leveled and has a high degree of planarity. In other words, the surface S600*t* of the wafer structure 600 may be referred to as a planar surface or a substantially horizontal planar surface. The planarization process may include a grinding process, a CMP process, an etching process, or combinations thereof. The etching process may include a dry etching, a wet etching, or a combination thereof. After the planarization process, a cleaning process may be optionally performed, for example to clean and remove the residue generated from the planarization process. However, the disclosure is not limited thereto, and the planarization process may be performed through any other suitable method. The wafer structure 600 may be referred to as a wafer-level circuit structure or a wafer circuit structure.

As shown in FIG. 8 and FIG. 13, in some embodiments, the semiconductor dies 100 and the DTCs 300 are electrically connected to the wafer structure 600, and the dummy dies 200 are electrically isolated from the wafer structure 600, the semiconductor dies 100, 400 and the DTCs 300. In some embodiments, the semiconductor dies 400 are electrically connected to the wafer structure 600 through the semiconductor dies (e.g., 100B and 100C) electrically connected thereto. The DTCs 300 are electrically coupled to one or more than one of the semiconductor dies 100 through the wafer structure 600, in some embodiments. Or on other hand, one or more semiconductor dies 100 are electrically coupled to one or more than one of the DTCs 300 through the wafer structure 600. The disclosure is not limited thereto. The DTCs 300 may be electrically coupled to one or more than one of the semiconductor dies 400 through the semiconductor dies 100 electrically connected thereto and the wafer structure 600.

As shown in FIG. 8, a thickness of the wafer structure 600 at an edge thereof is greater than a thickness of the wafer structure 600 at a center thereof, for example. In addition, one metallization layer (e.g., 620A and 630A) and the dielectric layer laterally covering the one metallization layer is considered as a first build-up layer of the wafer structure 600, while other one metallization layer (e.g., 620B and 630B) and the dielectric layer laterally covering the other one metallization layer is considered as a second build-up layer of the wafer structure 600. The number of the build-up layers of the wafer structure 600 may be selected and designated based on demand and design layout, and is not limited thereto.

Figure 9:
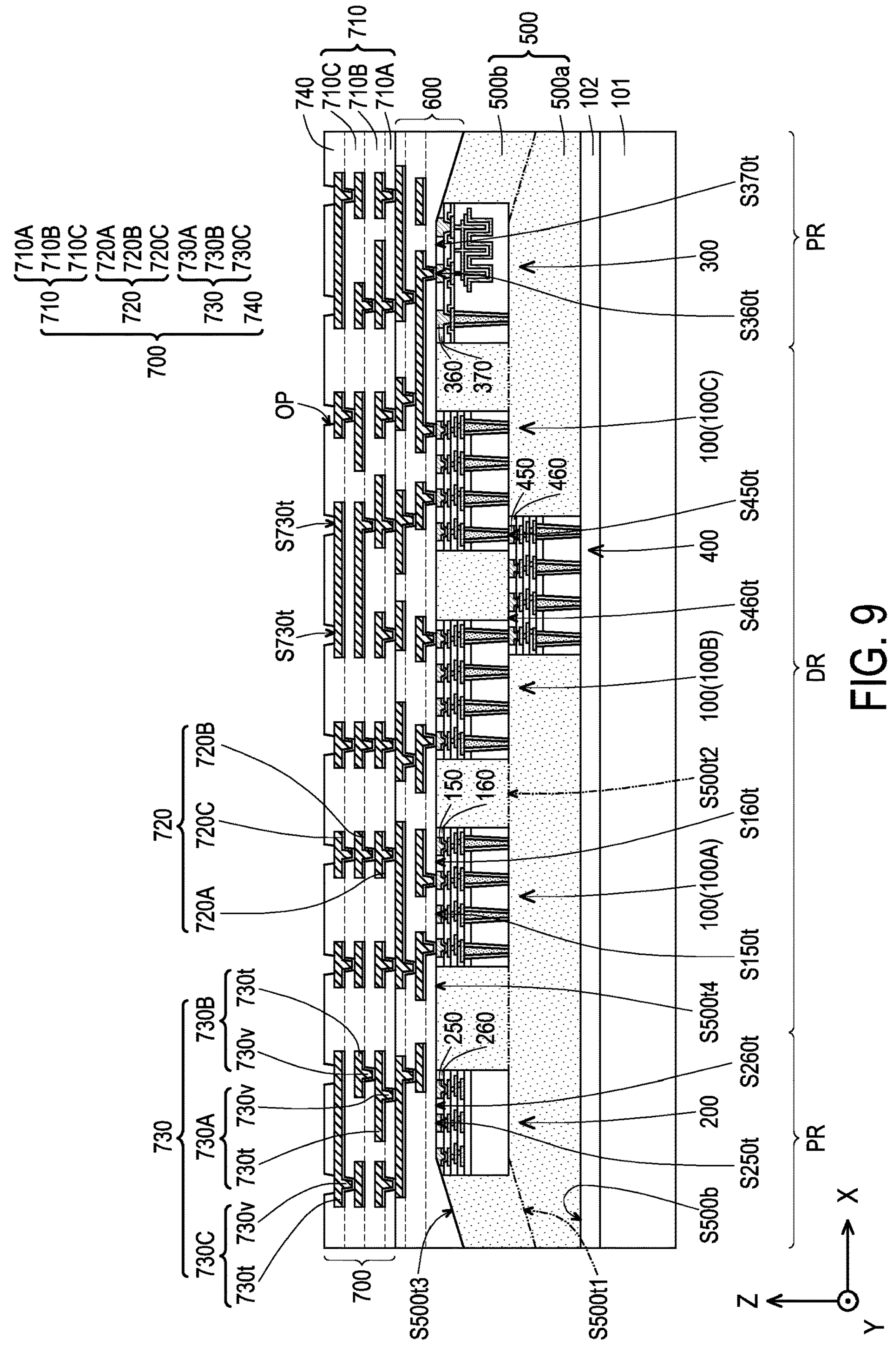

Referring to FIG. 9, in some embodiments, a redistribution circuit structure 700 is formed on and electrically connected to the wafer structure 600. In some embodiments, the redistribution circuit structure 700 includes one or more dielectric layers 710 (e.g., 710A, 710B and 710C), one or more seed layers 720 (e.g., 720A, 720B and 720C), one or more patterned conductive layers 730 (e.g., 730A, 730B and 730C), and a passivation layer 740. In some embodiments, each patterned conductive layer 730 includes a line portion 730*t* extending along a horizontal direction (e.g., the direction X or the direction Y), a via portion 730*v* extending along a vertical direction (e.g., the direction Z), and/or a combination thereof. One seed layer 720 and a respective one patterned conductive layer 730 overlying thereto may be collectively referred to as a metallization layer or a redistribution layer to provide routing functions. In some embodiments, in the redistribution circuit structure 700, the dielectric layers (e.g., 710) and the metallization layers (e.g., 720 and 730 are arranged in alternation, and the passivation layer (e.g., 740) is disposed on a topmost layer (e.g., 710C) of the dielectric layers (e.g., 710). As shown in FIG. 9, for example, the passivation layer 740 includes a plurality of openings OP penetrating there-through and exposing surfaces S730*t* of portions of a topmost layer (e.g., 730C) of the patterned conductive layers 730 for external connection. In the disclosure, the numbers of layers of the dielectric layers 710, the seed layers 720, and the patterned conductive layers 730 are not limited to what is depicted in FIG. 9, may be selected and designated based on the demand and design layout.

In some embodiments, the redistribution circuit structure 700 may be formed by, but not limited to: forming a blanket layer of fourth dielectric material over the wafer structure 600; patterning the fourth dielectric material blanket layer to form a dielectric layer 710A having a plurality of fourth openings (not labeled) penetrating there-through and accessibly revealing portions of the topmost layer (e.g., 630B) of the routing layers 630 of the wafer structure 600; forming a blanket layer of fourth seed layer material over the dielectric layer 710A, the fourth seed layer material blanket layer extending into the fourth openings to line the fourth openings and in contact with the portions of the topmost layer (e.g., 630B) of the routing layers 630 of the wafer structure 600; forming a blanket layer of a fourth conductive material over the fourth seed layer material blanket layer; patterning the fourth conductive material blanket layer to form a patterned conductive layer 730A; using the patterned conductive layer 730A as etching mask to pattern the fourth seed layer material blanket layer and form the seed layer 720A; forming a blanket layer of fifth dielectric layer over the patterned conductive layer 730A, the seed layer 720A and the dielectric layer 710A; patterning there-through and accessibly revealing an illustrated top surface of the patterned conductive layer 730A; forming a blanket layer of fifth seed layer material over the dielectric layer 710B, the fifth seed layer material blanket layer extending into the fifth openings to line the fifth openings and in contact with the exposed patterned conductive layer 730A; forming a blanket layer of a fifth conductive material over the fifth seed layer material blanket layer; patterning the fifth conductive material blanket layer to form a patterned conductive layer 730B; using the patterned conductive layer 730B as etching mask to pattern the fifth seed layer material blanket layer and form the seed layer 720B; forming a blanket layer of sixth dielectric layer over the patterned conductive layer 730B, the seed layer 720B and the dielectric layer 710B; patterning the sixth dielectric material blanket layer to form a dielectric layer 710C having a plurality of sixth openings (not labeled) penetrating there-through and accessibly revealing an illustrated top surface of the patterned conductive layer 730B; forming a blanket layer of sixth seed layer material over the dielectric layer 710C, the sixth seed layer material blanket layer extending into the sixth openings to line the sixth openings and in contact with the exposed patterned conductive layer 730B; forming a blanket layer of a sixth conductive material over the sixth seed layer material blanket layer; patterning the sixth conductive material blanket layer to form a patterned conductive layer 730C; using the patterned conductive layer 730C as etching mask to pattern the sixth seed layer material blanket layer and form the seed layer 720C; forming a blanket layer of seventh dielectric layer over the patterned conductive layer 730C, the seed layer 720C and the dielectric layer 710C; and patterning the seventh dielectric material blanket layer to form a passivation layer 740 having a plurality of openings OP penetrating there-through and accessibly revealing an illustrated top surface S730*t* of the patterned conductive layer 730C. Upon this, the redistribution circuit structure 700 is manufactured. The redistribution circuit structure 700 may be formed on the insulating encapsulation 500 by single or dual damascene process. The disclosure is not limited thereto.

The material of each of the dielectric layers 710A, 710B, 710C and the passivation layer 740 may be PI, PBO, BCB, a nitride such as silicon nitride, an oxide such as silicon oxide, PSG, BSG, BPSG, a combination thereof or the like, which may be patterned using a photolithography and/or etching process. The fourth, fifth, and/or sixth dielectric material blanket layer may be formed by suitable fabrication techniques such as spin-on coating, CVD (e.g., PECVD), or the like. In one embodiment, the materials of the dielectric layers 710A, 710B, 710C and the passivation layer 740 are the same to each other. Alternatively, the materials of the dielectric layers 710A, 710B, 710C and the passivation layer 740 may be different to one another, in part or all. In some embodiments, the materials of the dielectric layers 710A, 710B, 710C and the passivation layer 740 are different from the materials of the dielectric layers 610A, 610B and 610C.

The seed layers 720A, 720B and 720C individually are referred to as a metal layer, which can be a single layer or a composite layer including a plurality of sub-layers formed of different materials. For example, the seed layers 720A, 720B and 720C each may be or include a titanium layer and a copper layer over the titanium layer. The fourth, fifth, and/or sixth seed layer material blanket layers may be formed in a manner of a blanket layer made of metal or metal alloy materials, the disclosure is not limited thereto. The material of each of the fourth, fifth, and/or sixth seed layer material blanket layers may include titanium, copper, molybdenum, tungsten, titanium nitride, titanium tungsten, combinations thereof, or the like, which may be formed using, for example, sputtering, PVD, or the like. The fourth, fifth, and/or sixth seed layer material blanket layers may be patterned by etching, such as a dry etching process, a wet etching process, or a combination thereof; the disclosure is not limited thereto. In one embodiment, the materials of the seed layers 720A, 720B and 720C are the same to each other. Alternatively, the materials of the seed layers 720A, 720B and 720C may be different to one another. In some embodiments, the materials of the seed layers 720A, 720B and 720C are the same as the materials of the seed layers 620A and 620B. Alternatively, the materials of the seed layers 720A, 720B and 720C may be different from the materials of the seed layers 620A and 620B.

The material of each of the fourth, fifth, and/or sixth conductive material blanket layers for forming the patterned conductive layers 730A, 730B and 730C may be made of conductive materials formed by electroplating or deposition, such as copper, copper alloy, aluminum, aluminum alloy, or combinations thereof, which may be patterned to form a plurality of conductive patterns/segments using a photolithography and etching process. In some embodiments, the conductive patterns/segments each includes the line portion 730*t* extending along a horizontal direction (e.g., the direction X and/or Y) and/or the line portion 730*t* extending along a horizontal direction (e.g., the direction X and/or Y) in addition to the via portion 730*v* connecting to the line portion 730*t* and extending along a vertical direction (e.g., the direction Z). In one embodiment, the materials of the patterned conductive layers 730A, 730B and 730C are the same to each other. Alternatively, the materials of the patterned conductive layers 730A, 730B and 730C may be different to one another. In some embodiments, the materials of the patterned conductive layers 730A, 730B and 730C are the same as the materials of the routing layers 630A and 630B. Alternatively, the materials of the patterned conductive layers 730A, 730B and 730C may be different from the materials of the routing layers 630A and 630B.

As shown in FIG. 9, the redistribution circuit structure 700 is electrically connected to the semiconductor dies 100 and the DTCs 300 through the wafer structure 600, for example. In some embodiments, the redistribution circuit structure 700 is electrically connected to the semiconductor dies 400 through the wafer structure 600 and the semiconductor dies 100 electrically connected to the semiconductor dies 400. In some embodiments, the redistribution circuit structure 700 is electrically isolated to the dummy dies 200. In addition, one metallization layer (e.g., 720A and 730A) and the dielectric layer laterally covering the one metallization layer is considered as a first build-up layer of the redistribution circuit structure 700, one metallization layer (e.g., 720B and 730B) and the dielectric layer laterally covering the other one metallization layer is considered as a second build-up layer of the redistribution circuit structure 700, and other one metallization layer (e.g., 720C and 730C) and the dielectric layer laterally covering the other one metallization layer is considered as a third build-up layer of the redistribution circuit structure 700. The number of the build-up layers of the redistribution circuit structure 700 may be selected and designated based on demand and design layout, and is not limited thereto.

Figure 10:
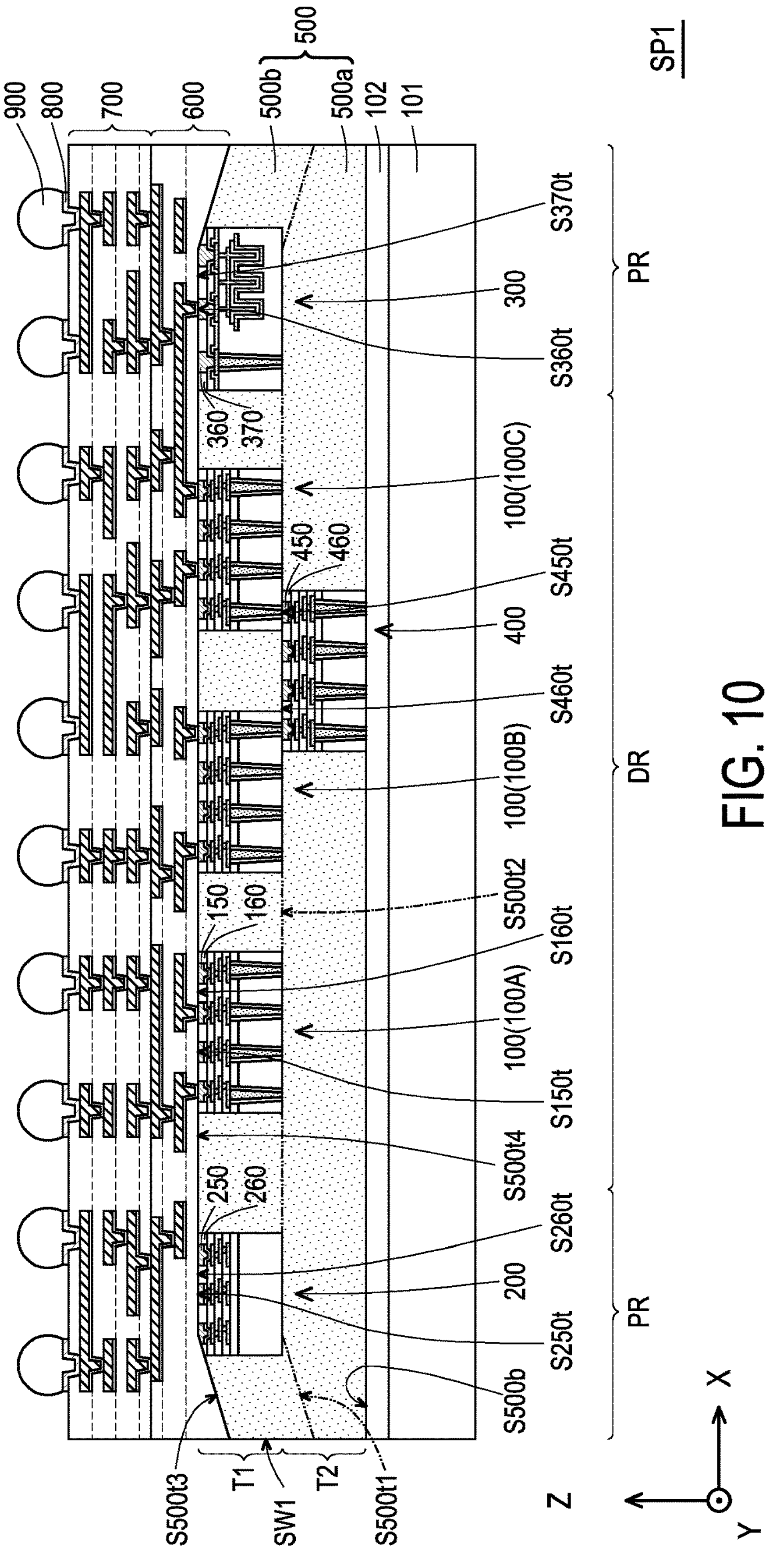

Referring to FIG. 10, in some embodiments, a plurality of under-ball metallurgy (UBM) patterns 800 and a plurality of conductive terminals 900 are sequentially formed over the redistribution circuit structure 700. In some embodiments, the UBM patterns 800 each are located between a respective one of the conductive terminals 900 and the passivation layer 740 of the redistribution circuit structure 700. For example, the UBM patterns 800 are disposed on the passivation layer 740 and further extend into the openings OP formed in the passivation layer 740 to be in (physical) contact with the patterned conductive layer 730C exposed therefrom so to be electrically connected to the patterned conductive layer 730C, and the conductive terminals 900 are disposed on (e.g., in physical contact with) and electrically connected to the UBM patterns 800. Due to the UBM patterns 800, the adhesion strength between the conductive terminals 900 and the passivation layer 740 of the redistribution circuit structure 700 is enhanced.

In some embodiments, the UBM patterns 800 are physically connected to and electrically connected to the redistribution circuit structure 700. In some embodiments, the conductive terminals 900 are electrically coupled to the redistribution circuit structure 700 through the UBM patterns 800. In some embodiments, the conductive terminals 900 are electrically coupled to the wafer structure 600 through the UBM patterns 800 and the redistribution circuit structure 700. In some embodiments, some of the conductive terminals 900 are electrically coupled to the semiconductor dies 100 through some of the UBM patterns 800, the redistribution circuit structure 700 and the wafer structure 600. In addition, some of the conductive terminals 900 may be electrically coupled to the DTCs 300 through some of the UBM patterns 800, the redistribution circuit structure 700 and the wafer structure 600. In some embodiments, the conductive terminals 900 are electrically isolated to the dummy dies 200. In some embodiments, some of the conductive terminals 900 are electrically coupled to the semiconductor dies 400 through some of the UBM patterns 800, the redistribution circuit structure 700, the wafer structure 600, and the semiconductor dies 100 electrically connected to the semiconductor die 400.

In some embodiments, the UBM patterns 800 are made of a metal layer including a single layer or a metallization layer including a composite layer with a plurality of sub-layers formed of different materials. In some embodiments, the UBM patterns 800 include copper, nickel, molybdenum, titanium, tungsten, titanium nitride, titanium tungsten, combinations thereof, or the like. The UBM patterns 800 may include a titanium layer and a copper layer over the titanium layer. The UBM patterns 800 may be formed using electroplating, sputtering, PVD, or the like. For example, the UBM patterns 800 are conformally formed on the passivation layer 740 by sputtering to extend on an outermost surface of the passivation layer 740 and further extend into the openings OP formed in the passivation layer 740 and thus are in physical contact with the surface S730*t* of the patterned conductive layer 730C exposed by the openings OP formed in the passivation layer 740. The UBM patterns 800 are electrically isolated from one another. The number of the UBM patterns 800 may not be limited in this disclosure, and may correspond to the number of the portions of the patterned conductive layer 730C exposed by the openings OP formed in the passivation layer 740.

In some embodiments, the conductive terminals 900 are physically connected to and electrically connected to the UBM patterns 800, and are electrically coupled to the redistribution circuit structure 700 through the UBM patterns 800. In some embodiments, the conductive terminals 900 are disposed on the UBM patterns 800 by ball placement process or reflow process. For example, the conductive terminals 900 includes micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. The number of the conductive terminals 900 is not limited to the drawings of the embodiments, and may be selected and designated based on the demand and design requirements. The number of the conductive terminals 900 may be controlled by adjusting the number of the UBM patterns 800. When solder is used, the solder may include either eutectic solder or non-eutectic solder. The solder may include lead or be lead-free, and may include Sn—Ag, Sn—Cu, Sn—Ag—Cu, or the like. The conductive terminals 900 may be solder free. The conductive terminals 900 may be referred to as conductors, input/output (I/O) terminals, conductive connectors, or conductive I/O terminals of the semiconductor structure SP1 for electrical connection with external components or elements (e.g., an additional semiconductor package/device, a circuit substrate, an interposer, an capacitor, a power source, or the like, etc.). Up to here, the semiconductor structure SP1 is manufactured. The semiconductor structure SP1 depicted in FIG. 10 may be referred to as a system-on-wafer (SoW).

However, the disclosure is not limited thereto. In some alternative embodiments, the UBM patterns 800 may be omitted. In such alternative embodiments, the conductive terminals 900 may be directly connected to (e.g., in physical contact with) the redistribution circuit structure 700 (e.g., the portions of the patterned conductive layer 730C exposed by the openings OP). In further alternative embodiments, the conductive terminals 900 may be omitted. In yet alternative embodiments, the UBM patterns 800 and the conductive terminals 900 may be omitted.

In some embodiments, the semiconductor structure SP1 includes a first tier T1 of semiconductor dies or devices (e.g., including the semiconductor dies 100, the dummy dies 200 and the DTCs 300), a second tier T2 of semiconductor dies or devices (e.g., including the semiconductor dies 400) stacked on the first tier of semiconductor dies or devices, the insulating encapsulation 500 including a first portion 500*a* laterally encapsulating the second tier T2 of semiconductor dies or devices and a second portion 500*b* laterally encapsulating the first tier T1 of semiconductor dies or devices, the wafer structure 600 disposed on the first tier T1 of semiconductor dies or devices, the redistribution circuit structure 700 disposed on the wafer structure 600, and the conductive terminals 900 disposed over the redistribution circuit structure 700 through the UBM patterns 800, as shown in FIG. 10 and FIG. 13. The first tier T1 of semiconductor dies or devices is disposed between the wafer structure 600 and the second tier T2 of semiconductor dies or devices, the wafer structure 600 is disposed between the first tier T1 of semiconductor dies or devices and the redistribution circuit structure 700, and the redistribution circuit structure 700 is disposed between the wafer structure 600 and the conductive terminals 900, in the embodiments. For example, the carrier 101 is remained on the semiconductor structure SP1, and the second tier T2 of semiconductor dies or devices is disposed between the carrier 101 and the first tier T1 of the semiconductor dies or devices, where the carrier 101 serves as a mechanical supporting structure. Sometimes, the carrier 101 may further serve as a heat dissipating element (or a heat sink).

However, the disclosure is not limited thereto. Alternatively, the carrier 101 may be thinned down to form a carrier 101', see a semiconductor structure SP1' in FIG. 11. For example, the carrier 101' remained on the semiconductor structure SP1' has a sufficient thickness to serve as a mechanical supporting structure. Sometimes, the carrier 101' may further serve as a heat dissipating element (or a heat sink). Owing to the configuration of the carrier 101', an overall thickness of the semiconductor structure SP1' is reduced.

Or alternatively, the carrier 101 can be omitted, see a semiconductor structure SP1" in FIG. 12. The carrier 101 is removed from the second tier T2 of semiconductor dies or devices and the second portion 500*a* of the insulating encapsulation 500. For example, the second tier T2 of semiconductor dies or devices and the second portion 500*a* of the insulating encapsulation 500 are easily separated from the carrier 101 due to the debond layer 102. In some embodiments, the carrier 101 is detached from the second tier T2 of semiconductor dies or devices and the second portion 500*a* of the insulating encapsulation 500 through a removal process. In some embodiments, surfaces (e.g., S400*b* and S500*b*) of the second tier T2 of semiconductor dies or devices and the second portion 500*a* of the insulating encapsulation 500 are exposed. In this case, the semiconductor dies 400 are accessibly exposed. For a non-limiting example, the carrier 101 and the debond layer 102 are debonded and then removed. In one embodiment, the debonding process is a laser debonding process. For another non-limiting example, the carrier 101 and the debond layer 102 are removed through grinding process. In one embodiment, the grinding process is a mechanical grinding process, a CMP process, an etching process, or combinations thereof. During the removal step, an additional holding device (not shown) is used to secure the structure depicted in FIG. 10 by holding the conductive terminals 900 in a proper place, before removing the carrier 101 and the debond layer 102. In some embodiments, the holding device HD is or includes an adhesive tape, a carrier film or a suction pad being supported by a frame. Owing to the removal of the carrier 101, an overall thickness of the semiconductor structure SP1" is further reduced.

Figure 16:
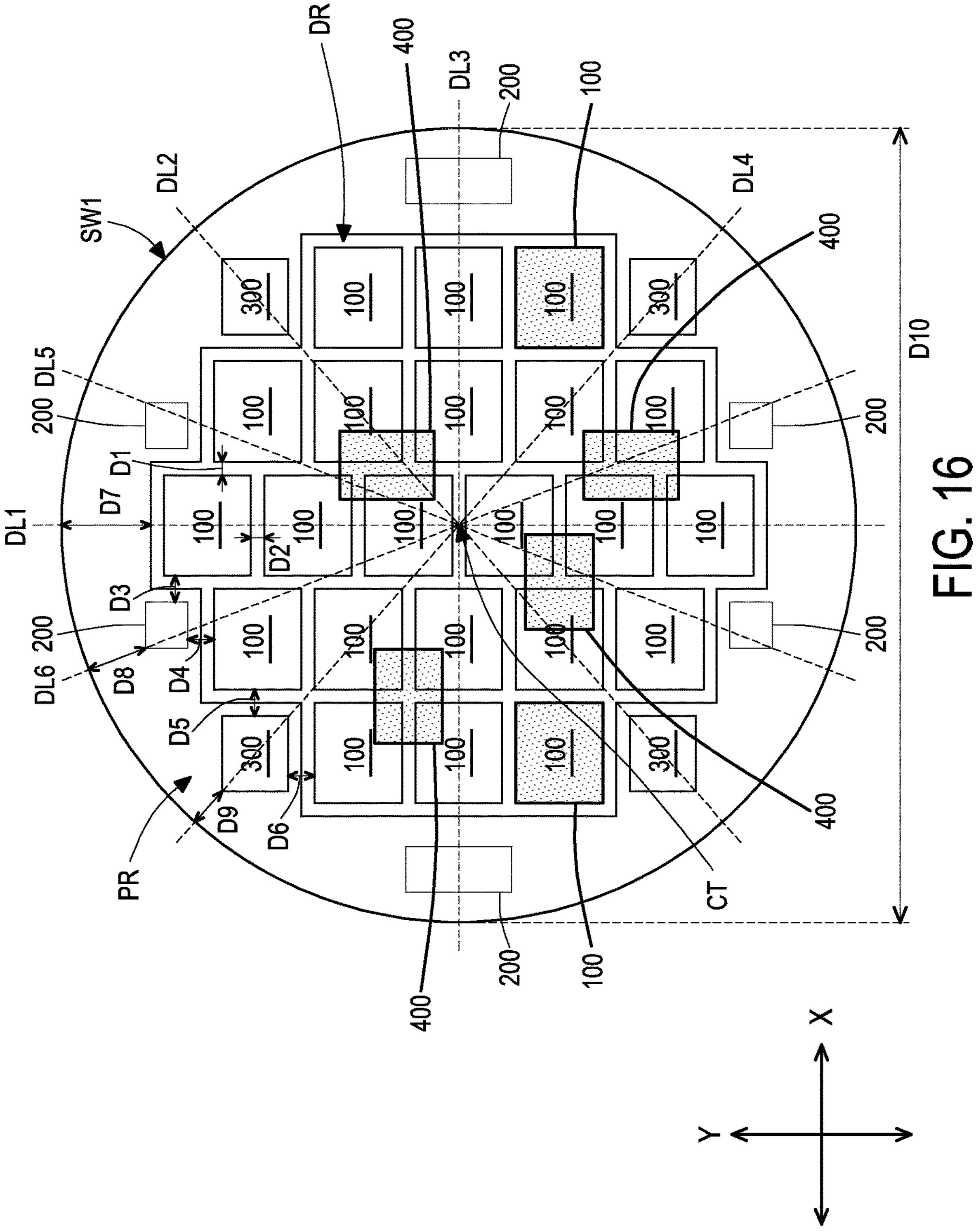
FIG. 16 through FIG. 20 are schematic plane views showing a semiconductor structure in accordance with some alternative embodiments of the disclosure.
Figure 17:
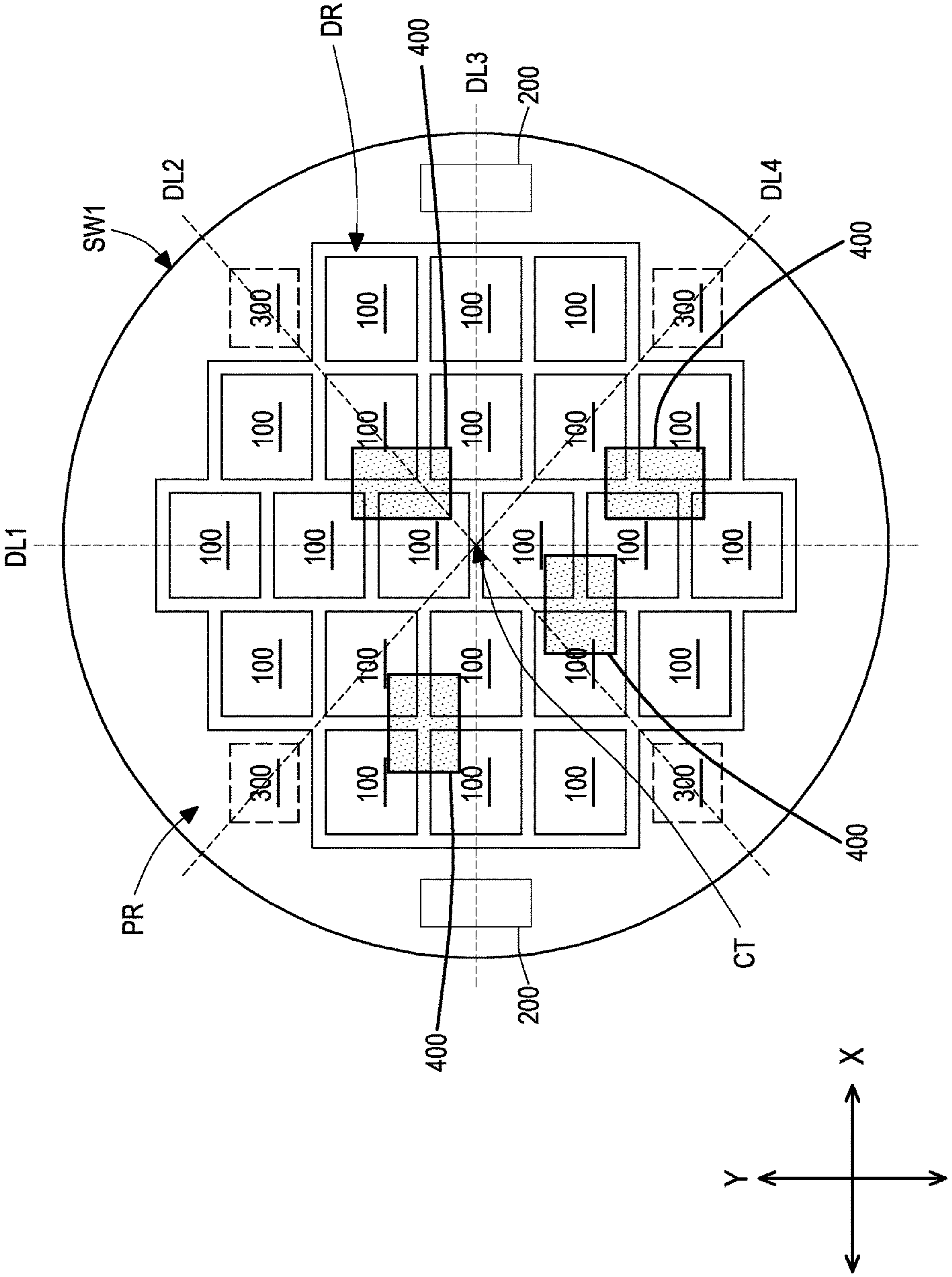

In some embodiments, the second tier T2 of semiconductor dies or devices includes only the semiconductor dies 400, as shown in FIG. 10 and FIG. 14. However, the disclosure is not limited thereto. Alternatively, as shown in FIG. 16, one or more semiconductor dies 100 may be included in the second tier T2 of semiconductor dies or devices at the device region DR, where each of the semiconductor dies 100 included in the second tier T2 of semiconductor dies or devices may only be overlapped with one of the semiconductor dies 100 included in the first tier T1 of semiconductor dies or devices and electrically connected thereto. In such case, the two stacked semiconductor dies 100 (may have same or different shapes/sizes/types) are referred to as a die with a stacked structure (as a whole, which may be considered as a SoIC die). Alternatively or in addition (not shown), one or more dummy dies 200 may be included in the second tier T2 of semiconductor dies or devices at the peripheral region PR, where each of the dummy dies 200 included in the second tier T2 of semiconductor dies or devices may be overlapped with the dummy dies 200 and/or the DTCs 300 included in the first tier T1 of semiconductor dies or devices or not overlapped with the dummy dies 200 and/or the DTCs 300 included in the first tier T1 of semiconductor dies or devices. Alternatively or in addition (not shown), one or more DTCs 300 may be included in the second tier T2 of semiconductor dies or devices at the peripheral region PR, where each of the DTCs 300 included in the second tier T2 of semiconductor dies or devices may be overlapped with the dummy dies 200 and/or the DTCs 300 included in the first tier T1 of semiconductor dies or devices or not overlapped with the dummy dies 200 and/or the DTCs 300 included in the first tier T1 of semiconductor dies or devices. In such case, the two stacked dummy dies 200 and/or DTCs 300 (may have same or different shapes/sizes/types) are referred to as an element with a stacked structure.

In some embodiments, both of the dummy dies 200 and the DTCs 300 are disposed in the peripheral region PR. However, the disclosure is not limited thereto; alternatively, there is only dummy die(s) 200 being disposed in the peripheral region PR. Or alternatively, there is only DTC(s) 300 being disposed in the peripheral region PR.

In some embodiments, there are multiple pairs of dummy dies 200 disposed in the peripheral region PR. However, the disclosure is not limited thereto; alternatively, there may be only one pair of dummy dies 200 disposed in the peripheral region PR, with or without the presence of DTCs 300 (which is thus indicated by dotted box), see FIG. 17. Or as an alternative, there may be only one pair of DTCs 300 disposed in the peripheral region PR, with or without the presence of dummy dies 200 (not shown).

Figure 18:
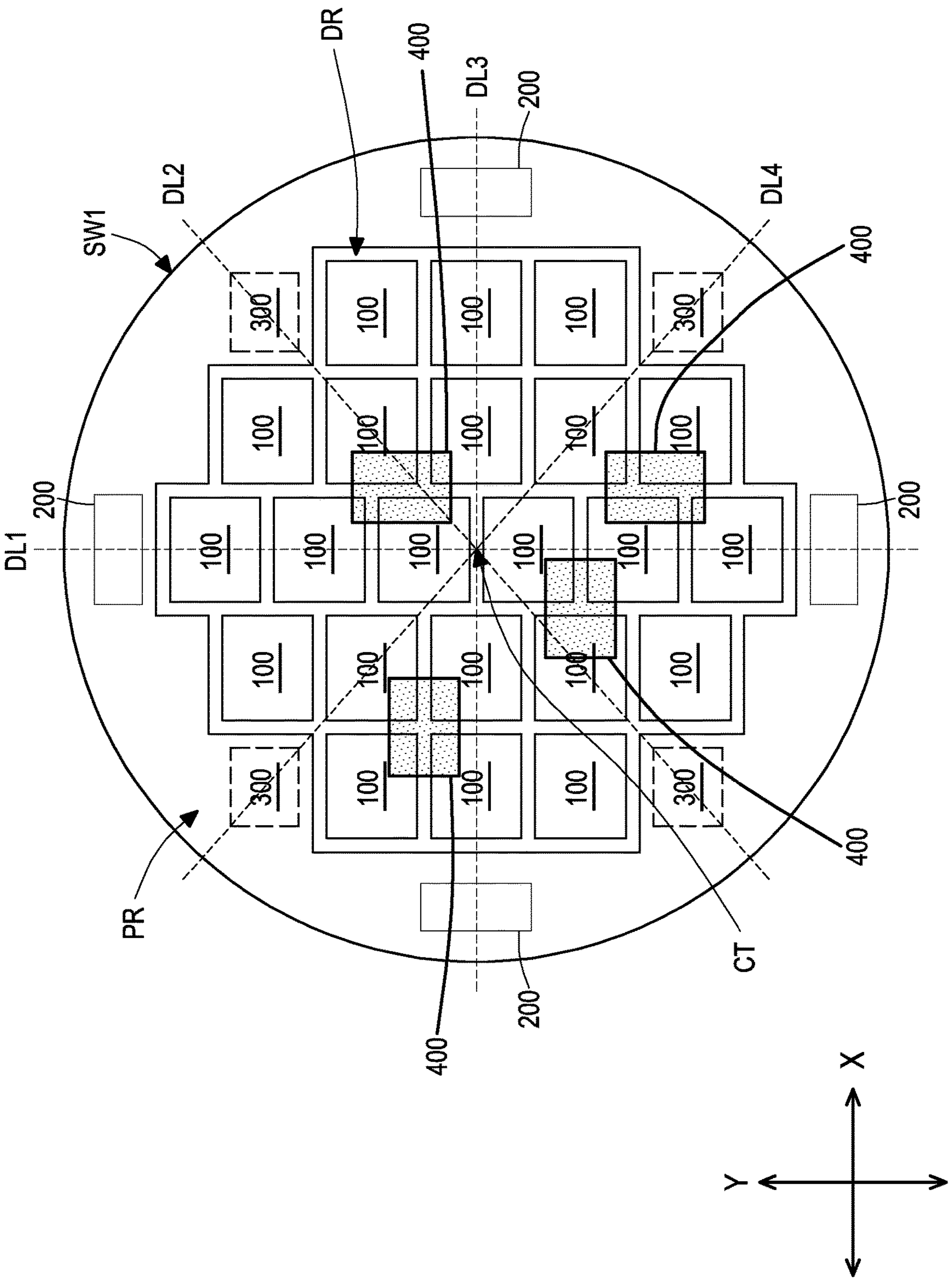

In alternative embodiments, there are only two pairs of dummy dies 200 disposed in the peripheral region PR, where the first pair of dummy dies 200 are at two opposite ends of a first diameter line (e.g., DL1) passing through the center CT of the semiconductor package, and the second pair of dummy dies 200 are at two opposite ends of a second diameter line (e.g., DL3) passing through the center CT of the semiconductor package, with or without the presence of DTCs 300 (which is thus indicated by dotted box), see FIG. 18. The first diameter line (e.g., DL1) may be substantially perpendicular to the second diameter line (e.g., DL3).

Figure 19:
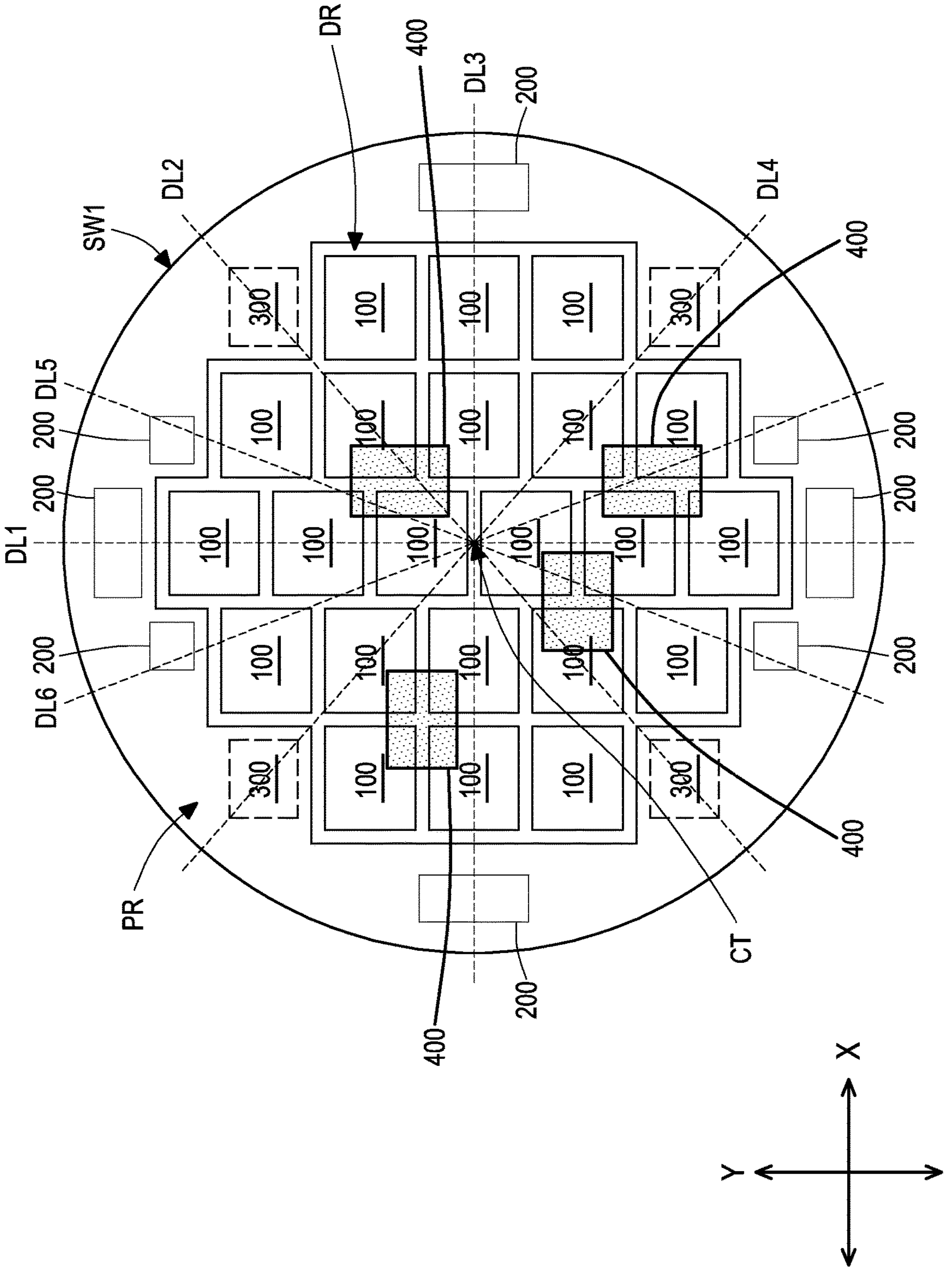

In further alternative embodiments, there are more than two pairs of dummy dies 200 disposed in the peripheral region PR, where the first pair of dummy dies 200 are at two opposite ends of a first diameter line (e.g., DL1) passing through the center CT of the semiconductor package, the second pair of dummy dies 200 are at two opposite ends of a second diameter line (e.g., DL3) passing through the center CT of the semiconductor package, and the rest pairs of dummy dies 200 are at two opposite ends of a third diameter line (e.g., DL5) and a fourth diameter line (e.g., DL6) passing through the center CT of the semiconductor package, with or without the presence of DTCs 300 (which is thus indicated by dotted box), see FIG. 19. The first diameter line (e.g., DL1) may be substantially perpendicular to the second diameter line (e.g., DL3), where the third diameter line (e.g., DL5) and the fourth diameter line (e.g., DL6) are respectively disposed interposed between the first diameter line (e.g., DL1) and the second diameter line (e.g., DL3), and the first diameter line (e.g., DL1) is between the third diameter line (e.g., DL5) and the fourth diameter line (e.g., DL6).

Figure 20:
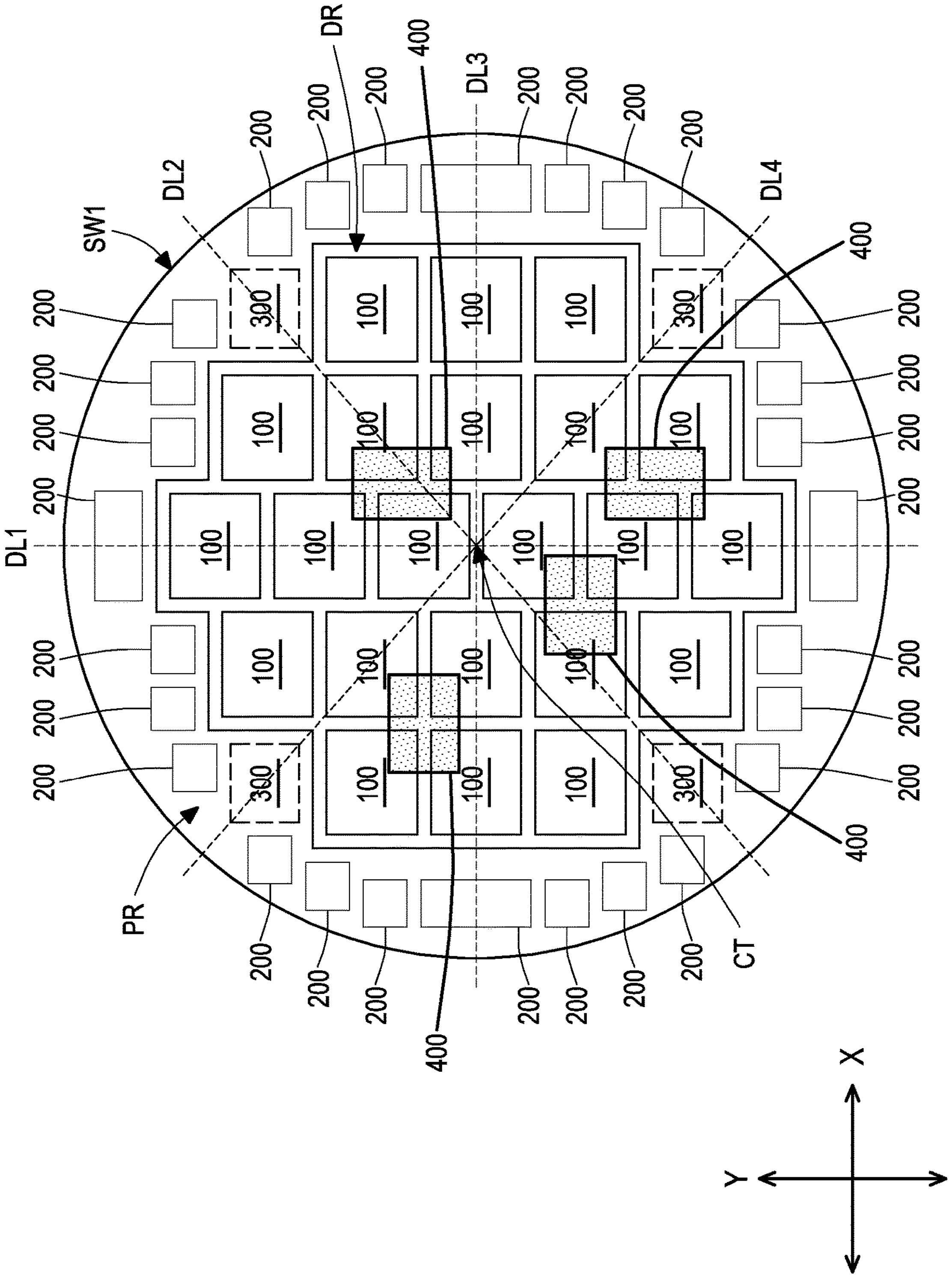

In yet further alternative embodiments, there are more than two pairs of dummy dies 200 disposed in the peripheral region PR, where the dummy dies 200 are disposed along the edge of the semiconductor structure and so to surround the device region DR, with or without the presence of DTCs 300 (which is thus indicated by dotted box), see FIG. 20. In such case, there will always be two dummy dies 200 (being considered as one pair) disposed at any (diameter) line passing through the center CT of the semiconductor package. It is appreciated that, in the disclosure, the arrangement of the dummy dies 200 and the arrangement of the DTCs 300 may be interchangeable, in part or all.

Figure 21:
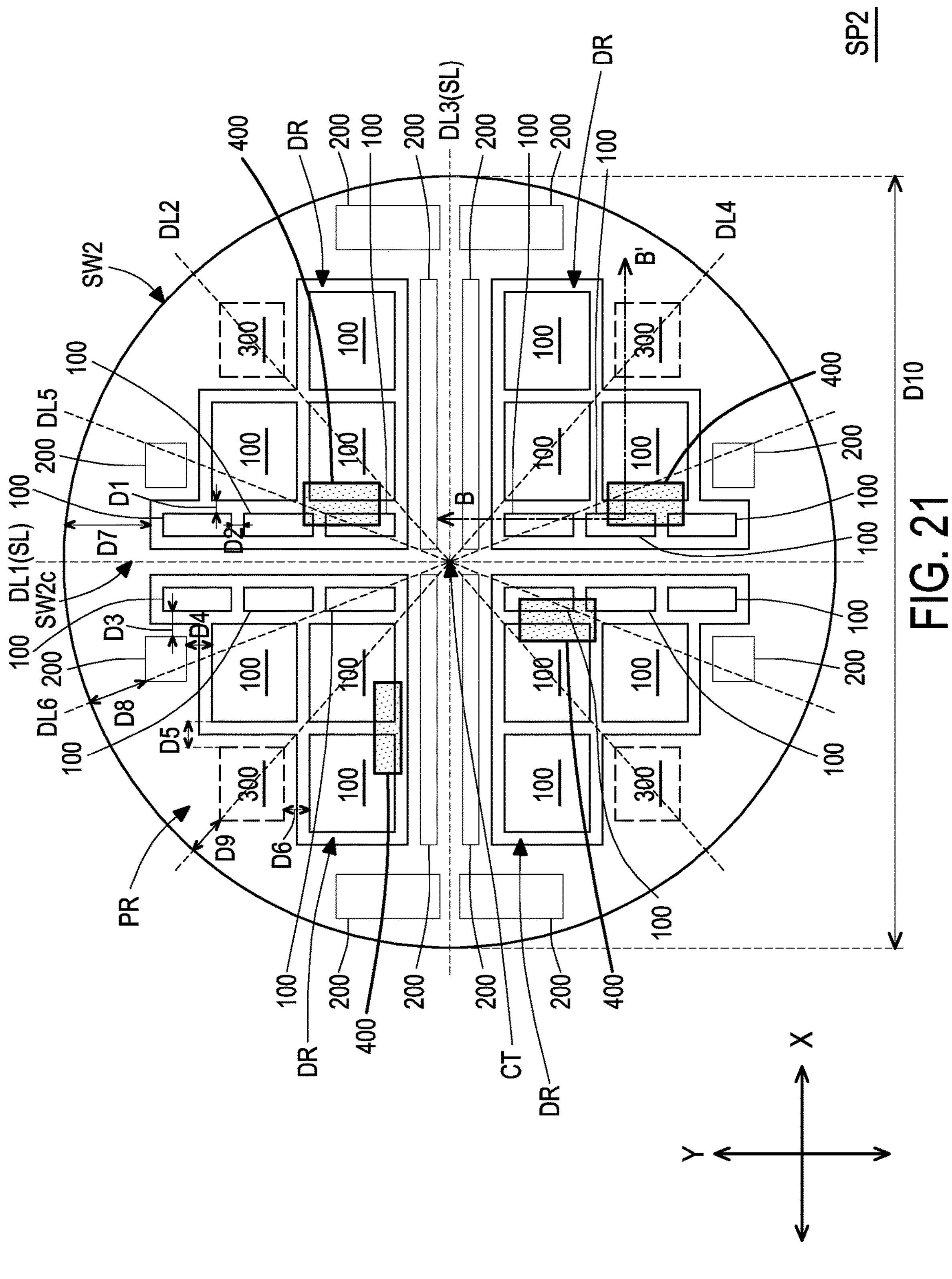
FIG. 21 a schematic plane view showing a semiconductor structure in accordance with some embodiments of the disclosure.
Figure 22:
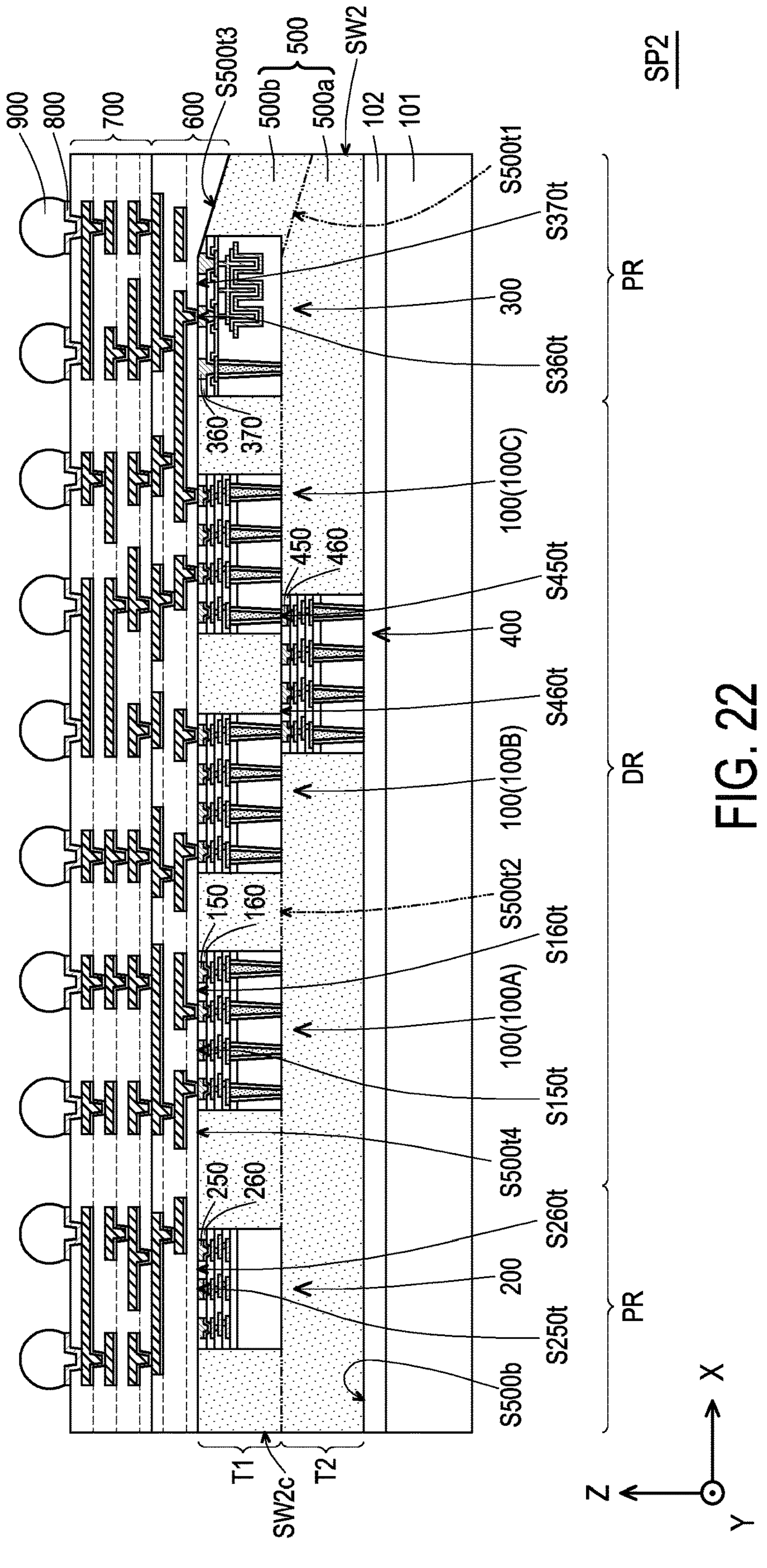
FIG. 22 is a schematic cross-sectional view of the semiconductor structure of FIG. 21.
Figure 23:
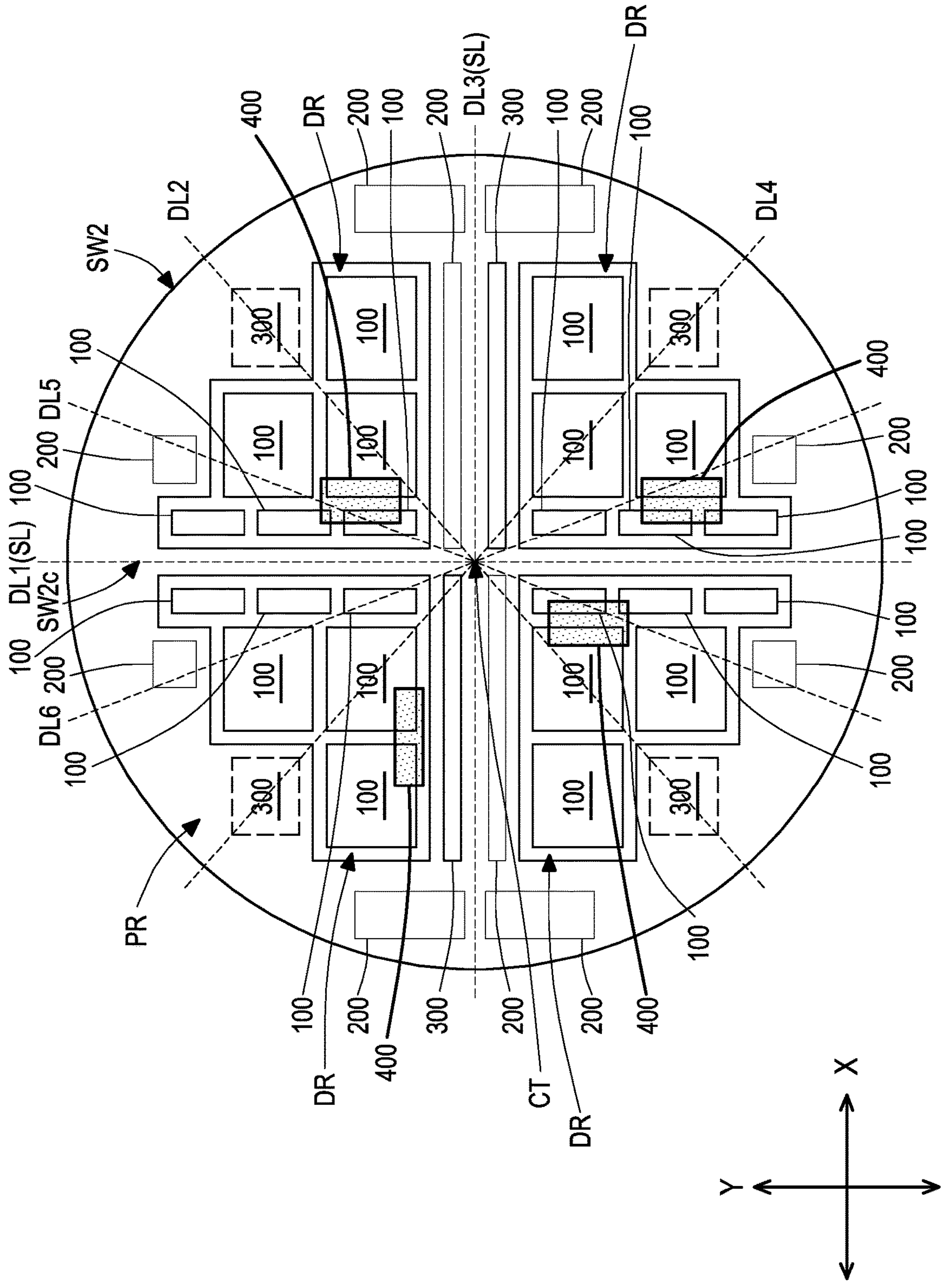
FIG. 23 and FIG. 24 are schematic plane views showing a semiconductor structure in accordance with some alternative embodiments of the disclosure.
Figure 24:
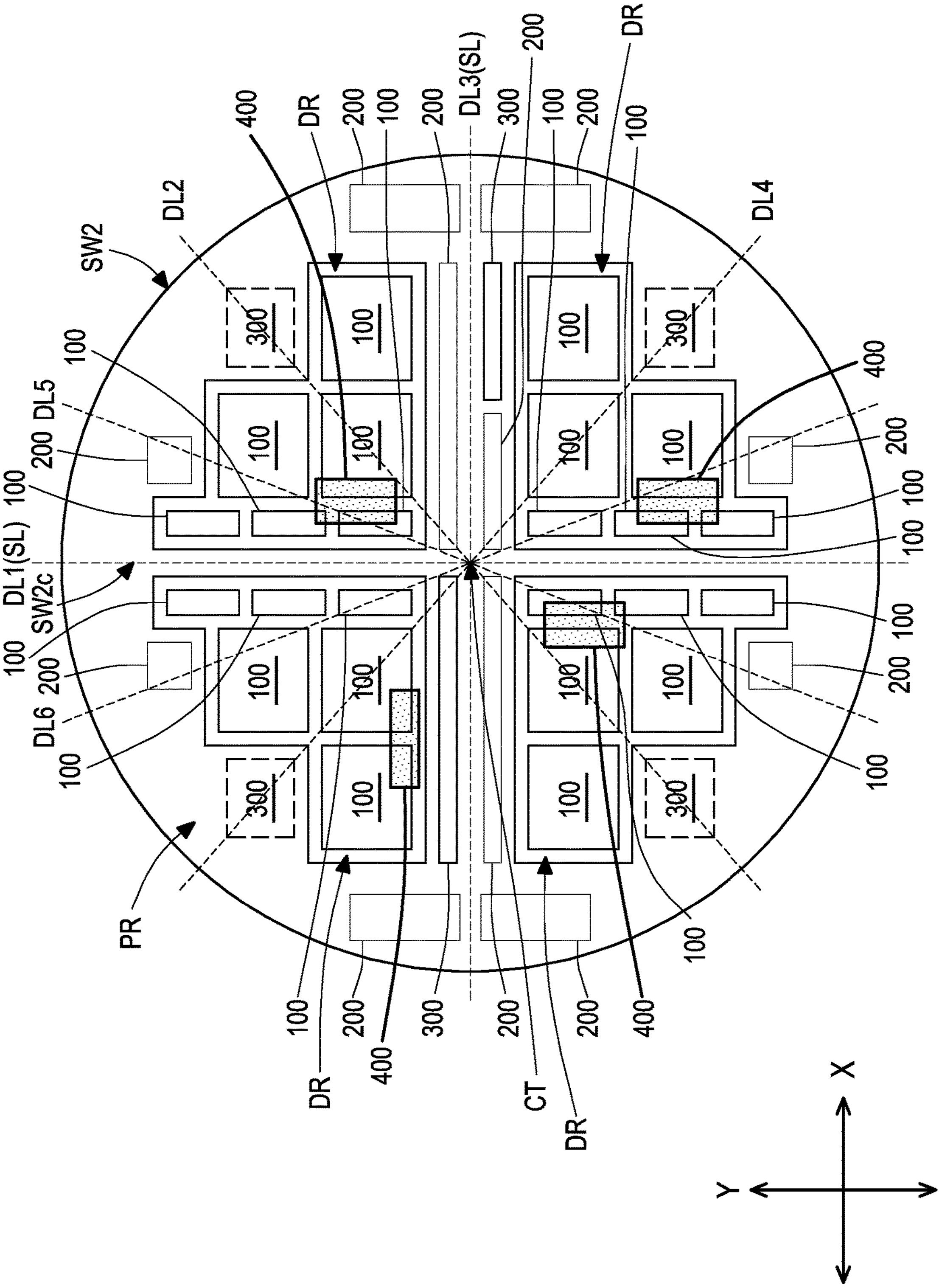

In some embodiments, the semiconductor structure does not undergoes a dicing (or singulation) process, see FIG. 13 and FIG. 16 through FIG. 20. However, the disclosure is not limited thereto, alternatively, a semiconductor structure may be diced into separated and individual components (also referred to as a cut SoW or a cut SoW vehicle) along scribe lines SL, sec FIG. 21 and FIG. 22. FIG. 21 a schematic plane view showing a semiconductor structure SP2 in accordance with some embodiments of the disclosure. FIG. 22 is a schematic cross-sectional view of the semiconductor structure SP2 of FIG. 21, where the cross-sectional view of FIG. 22 is taken along a line B-B' depicted in FIG. 21. FIG. 23 and FIG. 24 are schematic plane views showing a semiconductor structure in accordance with some alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

In some embodiments, as shown in FIG. 21, a semiconductor structure SP2 includes four device regions DR and a peripheral region PR surrounding the four device regions DR, where a space (as part of the peripheral region PR) between any two adjacent device region DR are also considered as part of the edge for a final resulting structure (e.g., the cut SoW or the cut SoW vehicle) after dicing. With such, it is appreciated that the dummy dies 200 and/or the DTCs 300 would be disposed in the space between any two adjacent device region DR and serve as mechanical supporting structures, so to prevent any damages (e.g., cracks or the like) causing by the dicing (or singulation) process to the semiconductor dies 100 and 400, thereby enhancing the reliability of the semiconductor structure SP2. It is appreciated that for the cut SoW or the cut SoW vehicle, the thicknesses of the wafer structure 600 at the cutting edge (SW2*c*) thereof and at a center (CT) thereof are less than a thickness of the wafer structure 600 at an edge (SW2) thereof, as shown in FIG. 22, in some embodiments.

In a non-limiting example, only dummy dies 200 are placed in the peripheral region PR between two vertically adjacent device regions DR, as shown in FIG. 21. In another non-limiting example, the dummy dies 200 and the DTCs 300 are simultaneously placed in the peripheral region PR between two vertically adjacent device regions DR, as shown in FIG. 23. In another non-limiting example, only the DTCs 300 are placed in the peripheral region PR between two vertically adjacent device regions DR. In a non-limiting example, only one dummy die 200 or only DTC 300 is disposed near to the cutting edge of the final resulting structure (e.g., the cut SoW or the cut SoW vehicle), as shown in FIG. 21 and FIG. 23. In another non-limiting example, there may be one or more the dummy dies 200, one or more DTCs 300, and/or combinations thereof being disposed near to the cutting edge of the final resulting structure (e.g., the cut SoW or the cut SoW vehicle). There may be one or more the dummy dies 200, one or more DTCs 300, and/or combinations thereof being placed in the peripheral region PR between two vertically adjacent device regions DR, as shown in FIG. 24. Similar or same configurations/placements of the dummy dies 200 and DTCs 300 discussed above might also applied to the peripheral region PR between two horizontally adjacent device regions DR, or applied to the peripheral region PR between two horizontally adjacent device regions DR in addition to the peripheral region PR between two vertically adjacent device regions DR.

In the above embodiments, the positioning locations of the dummy dies 200 may be substituted by or interchanged with the positioning locations of the DTCs 300, in part or all. The disclosure is not limited thereto.

In the above embodiments (e.g., SP1, SP1', SP1", SP2, and their modifications), the semiconductor dies or devices included in the first tier T1 includes only the semiconductor dies 100, the dummy dies 200, and the DTCs 300, while the semiconductor dies or devices included in the second tier T2 includes only the semiconductor dies 400, and the semiconductor dies or devices included in the first tier T1 and the semiconductor dies or devices included in the second tier T2 are in a manner of back-to-face arrangement, in the above embodiments, however the disclosure is not limited thereto. Alternatively, the semiconductor dies or devices included in the first tier T1 may include one or more of the semiconductor dies 100, the dummy dies 200, the DTCs 300, and the semiconductor dies 400, and/or the semiconductor dies or devices included in the second tier T2 may include one or more of the semiconductor dies 100, the dummy dies 200, the DTCs 300, and the semiconductor dies 400. In addition, the semiconductor dies or devices (100, 200, 300, and/or 400) included in the first tier T1 and the semiconductor dies or devices (100, 200, 300, and/or 400) included in the second tier T2 may be in a manner of back-to-face arrangement. Alternatively, the semiconductor dies or devices (100, 200, and/or 300) included in the first tier T1 and the semiconductor dies or devices (100, 200, 300, and/or 400) included in the second tier T2 may be in a manner of face-to-face arrangement. Or alternatively, the semiconductor dies or devices (100, 200, and/or 300) included in the first tier T1 and the semiconductor dies or devices (100, 200, 300, and/or 400) included in the second tier T2 may be in a manner of face-to-back arrangement.

Figure 25:
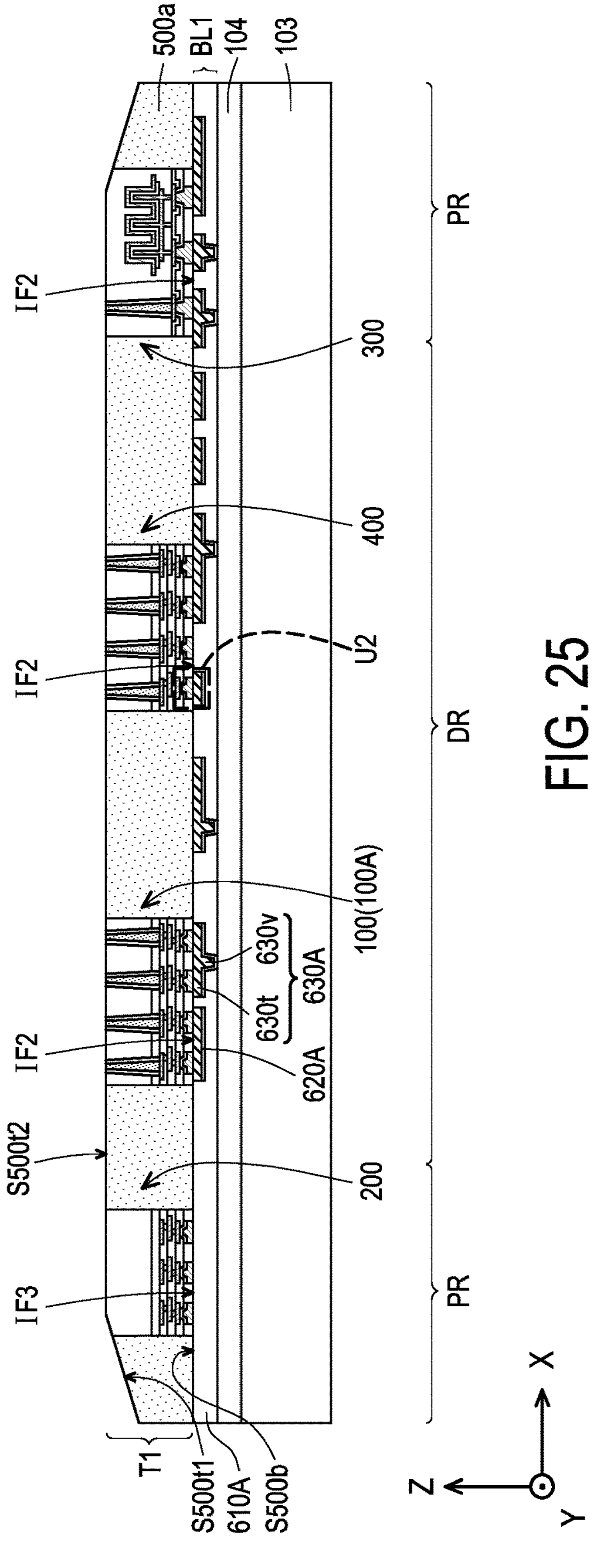
FIG. 25 to FIG. 28 are schematic cross-sectional views of various stages in a manufacturing method of a semiconductor structure in accordance with some embodiments of the disclosure.
Figure 29:
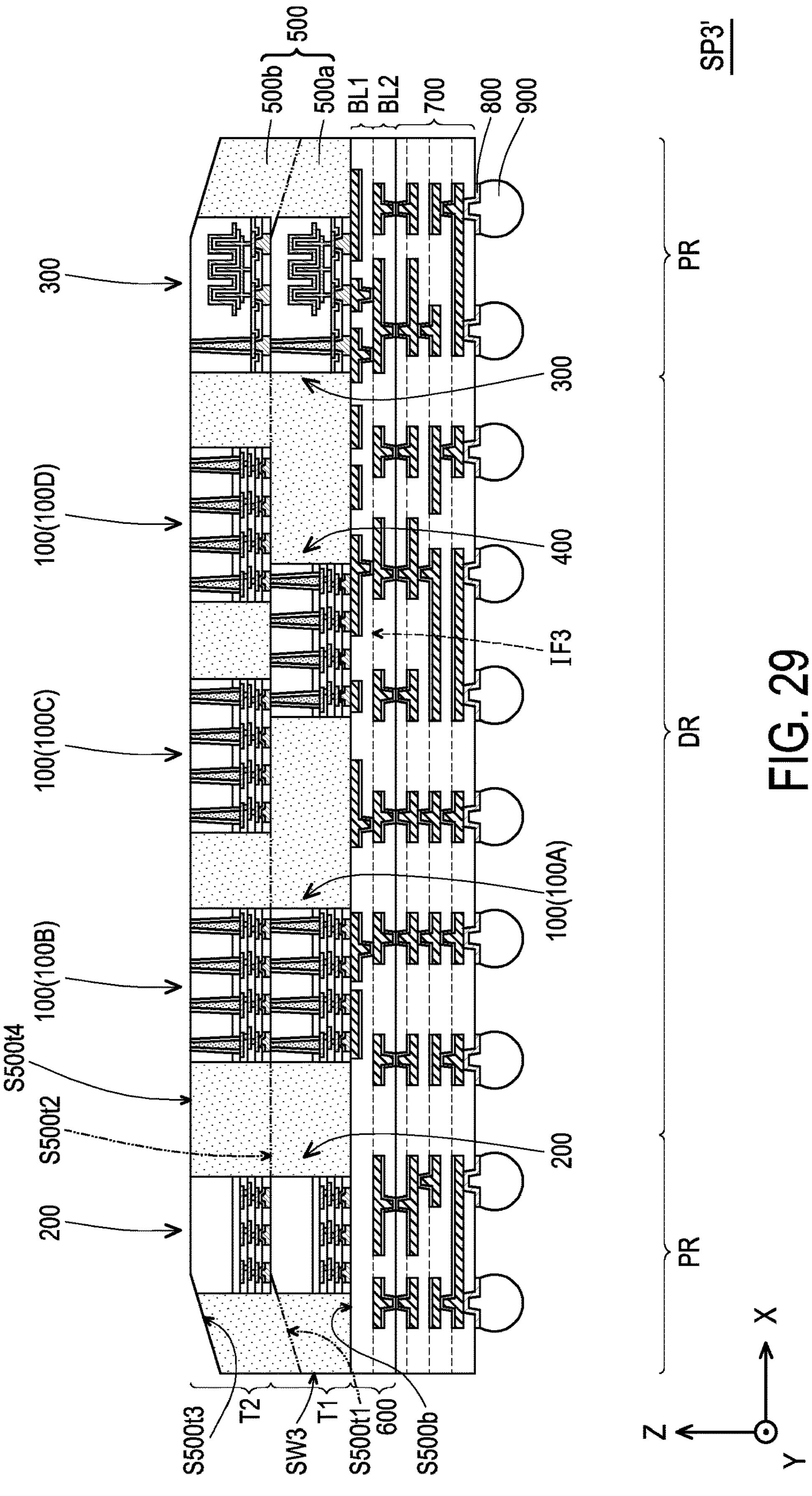
FIG. 29 is a schematic cross-sectional view showing a semiconductor structure in accordance with alternative embodiments of the disclosure.
Figure 31:
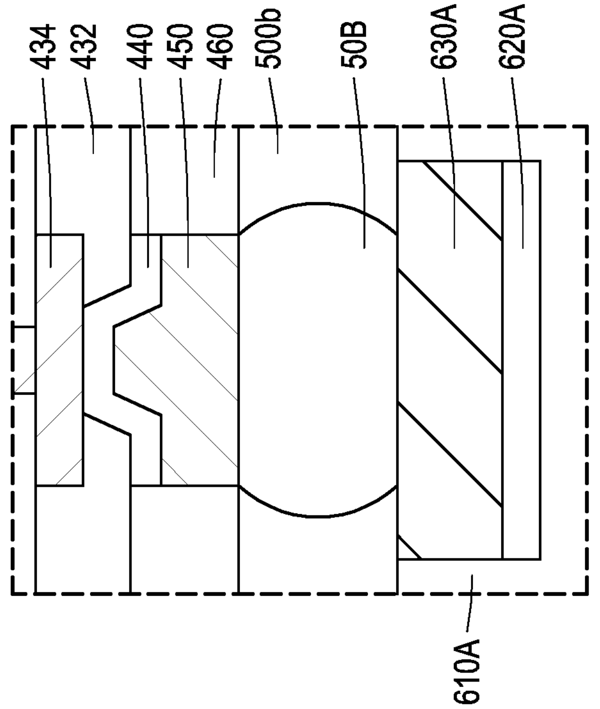
FIG. 30 and FIG. 31 are enlarged and schematic cross-sectional views showing various embodiments of a bonding interface between a semiconductor die and a metallization layer overlapping thereto in accordance with some embodiments of the disclosure.
Figure 30:
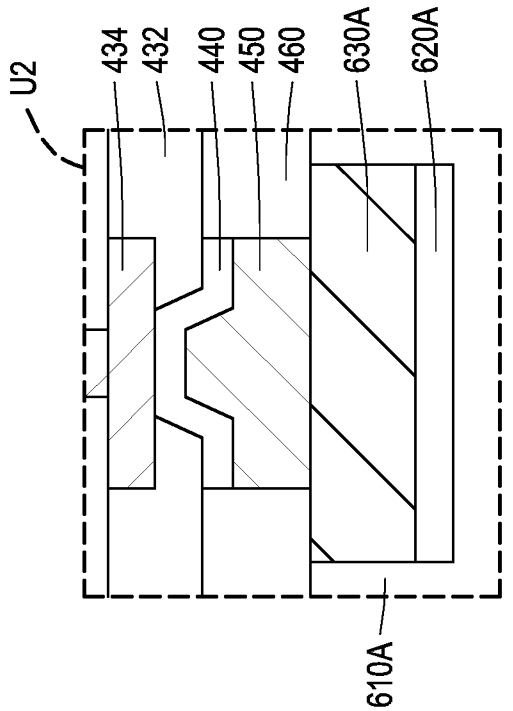

FIG. 25 to FIG. 28 are schematic cross-sectional views of various stages in a manufacturing method of a semiconductor structure SP3 in accordance with some embodiments of the disclosure. FIG. 29 is a schematic cross-sectional view showing a semiconductor structure SP3' in accordance with alternative embodiments of the disclosure. FIG. 30 and FIG. 31 are enlarged and schematic cross-sectional views showing various embodiments of a bonding interface between a semiconductor die and a metallization layer overlapping thereto in accordance with some embodiments of the disclosure, where the enlarged and schematic cross-sectional views of FIG. 30 and FIG. 31 are outlined in a dashed box U2 as shown in FIG. 25. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIG. 25, in some embodiments, a carrier 103 coated with a debond layer 104 is provided. In some embodiments, a first build-up layer BL2 of a wafer structure (e.g., 600 depicted in FIG. 28) is formed on the debond layer 104 and over the carrier 103. For example, the first build-up layer BL1 includes a dielectric layer 610A, a seed layer 620A, and a routing layer 630A, where the routing layer 630A stands on the seed layer 620A, and the dielectric layer 610A laterally covers the seed layer 620A and the routing layer 630A (both together referred to as a metallization layer). An illustrated bottom surface of the seed layer 620A is exposed by an illustrated bottom surface of the dielectric layer 610A for further electrical connections, and an illustrated top surface of the routing layer 630A is exposed by an illustrated top surface of the dielectric layer 610A for further electrical connections, as shown in FIG. 25. The details of the carrier 103 is similar to or substantially identical to the details of the carrier 101 as described in FIG. 1, the details of the debond layer 104 is similar to or substantially identical to the details of the debond layer 102 as described in FIG. 1, the formation and material of the first build-up layer BL1 has been previously described in FIG. 7, and thus are not repeated herein for brevity.

In some embodiments, after forming the first build-up layer BL1, one or more semiconductor dies 100, one or more dummy dies 200, one or more DTCs 300 and one or more semiconductor dies 400 are placed onto the first build-up layer BL1 and then are bonded to the first build-up layer BL1. For example, the semiconductor dies 100 and 400 are disposed within a device region DR of the semiconductor structure SP3, while the dummy dies 200 and the DTCs 300 are disposed within a peripheral region PR of the semiconductor structure SP3, as shown in FIG. 25. In some embodiments, the semiconductor dies 100, 400 and the DTCs 300 are bonded to the first build-up layer BL1 by a metal-to-metal bonding process and a dielectric-to-dielectric bonding process, while the dummy dies 200 are bonded to the first build-up layer BL1 by a dielectric-to-dielectric bonding process. That is, the semiconductor dies 100, 400 and the DTCs 300 are electrically connected to the first build-up layer BL1, and the dummy dies 200 are electrically isolated from the first build-up layer BL1.

For example, as shown in FIG. 25 and FIG. 30, the surfaces S450 of the connecting vias 450 in each of the semiconductor dies 400 and an illustrated top surface of the routing layer 630A prop against each other and are bonded together through direct metal-to-metal bonding (such as a copper-to-copper bonding). In addition, as shown in FIG. 25 and FIG. 30, the surface S460 of the protection layer 460 in each of the semiconductor dies 400 and an illustrated top surface of the dielectric layer 610A of the first build-up layer BL1 prop against each other and are bonded together through a direct dielectrics-to-dielectrics bonding (such as an oxide-to-oxide bonding, a nitride-to-nitride bonding, or an oxide-to-nitride bonding), for example. It should be noted that bonding methods described above are merely examples and are not intended to be limiting. In such embodiments, a bonding interface IF2 between the semiconductor dies 400 and the first build-up layer BL1 includes a dielectric-to-dielectric bonding interface (e.g., an oxide-to-oxide bonding interface, a nitride-to-nitride bonding interface, or an oxide-to-nitride bonding interface) and a metal-to-metal bonding interface (e.g., a copper-to-copper bonding interface). It should be noted that bonding methods described above are merely examples and are not intended to be limiting. An offset may present between sidewalls of the connecting vias 450 and a sidewall of the routing layer 630A underlying thereto, see FIG. 25 and FIG. 30. Since one of the connecting vias 450 and the routing layer 630A may have a larger bonding surface than the other one, the direct metal-to-metal bonding may still be achieved even if misalignment occurs, thereby the reliability of electrical connections between the semiconductor dies 400 and the routing layer 630A can be ensured. With such, for certain embodiments, either the protection layer 460 immediately adjacent to the connecting vias 450 is bonded to a portion of each of the routing layer 630A (e.g., a dielectric-to-metal bonding), or the dielectric layer 610A immediately adjacent to the routing layer 630A is bonded to a portion of each of the connecting vias 450 (e.g., a dielectric-to-metal bonding, see FIG. 25 and FIG. 30). Such bonding method (e.g., the bonding interfaces IF2) are also applied to the semiconductor dies 100 and the DTCs 300, as shown in FIG. 25 and FIG. 30, and thus the details thereof are omitted for simplicity.

However, the disclosure is not limited thereto; alternatively, the semiconductor dies 400 may be bonded to the first build-up layer BL1 by flip-chip bonding, see FIG. 31. In the alternative embodiments, a plurality of joints 50B are presented between the conductive vias 450 of the semiconductor die 400 and the routing layer 630A of the first build-up layer BL1 for mechanically connecting and electrically connecting the semiconductor die 400 and the first build-up layer BL1. The joints 50B includes micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. When solder is used, the solder may include either eutectic solder or non-eutectic solder. The solder may include lead or be lead-free, and may include Sn—Ag, Sn—Cu, Sn—Ag—Cu, or the like. When solder is used, the joints 50B may be referred to as solder joints or solder regions. In such alternative embodiments, an underfill (not show) may be optionally applied to wrap sidewalls of the joints 50B to ensure the adhesion strength between the semiconductor dies 400 and the first build-up layer BL1. Such bonding method may be also applied to the semiconductor dies 100 and the DTCs 300, and thus the details thereof are omitted for simplicity.

On the other hand, the dummy dies 200 may be bonded to the first build-up layer BL1 by bonding process including both of a metal-to-dielectric bonding and a dielectric-to-dielectric bonding, as shown in FIG. 25. Alternatively, the dummy dies 200 may be bonded to the first build-up layer BL1 by a fusion bonding process, such as a dielectric-to-dielectric bonding only. The formation, material, and details of each of the semiconductor dies 100, the dummy dies 200, the DTCs 300 and the semiconductor dies 400 are previously described in FIG. 1, FIG. 4 in conjunction with FIG. 13 and FIG. 16 through FIG. 20, and thus are not repeated herein for brevity.

Continued on FIG. 25, after bonding the semiconductor dies 100, 400, the dummy dies 200 and the DTCs 300 to the first build-up layer BL1, the semiconductor dies 100, 400, the dummy dies 200 and the DTCs 300 are laterally encapsulated in an insulating encapsulation 500*a*, in some embodiments. As shown in FIG. 25, the semiconductor dies 100, 400, the dummy dies 200 and the DTCs 300 are exposed by the insulating encapsulation 500*a*, for example. The formation and material of the insulating encapsulation 500*a* are previously described in FIG. 2 through FIG. 6, and thus are not repeated herein for brevity.

Figure 28:
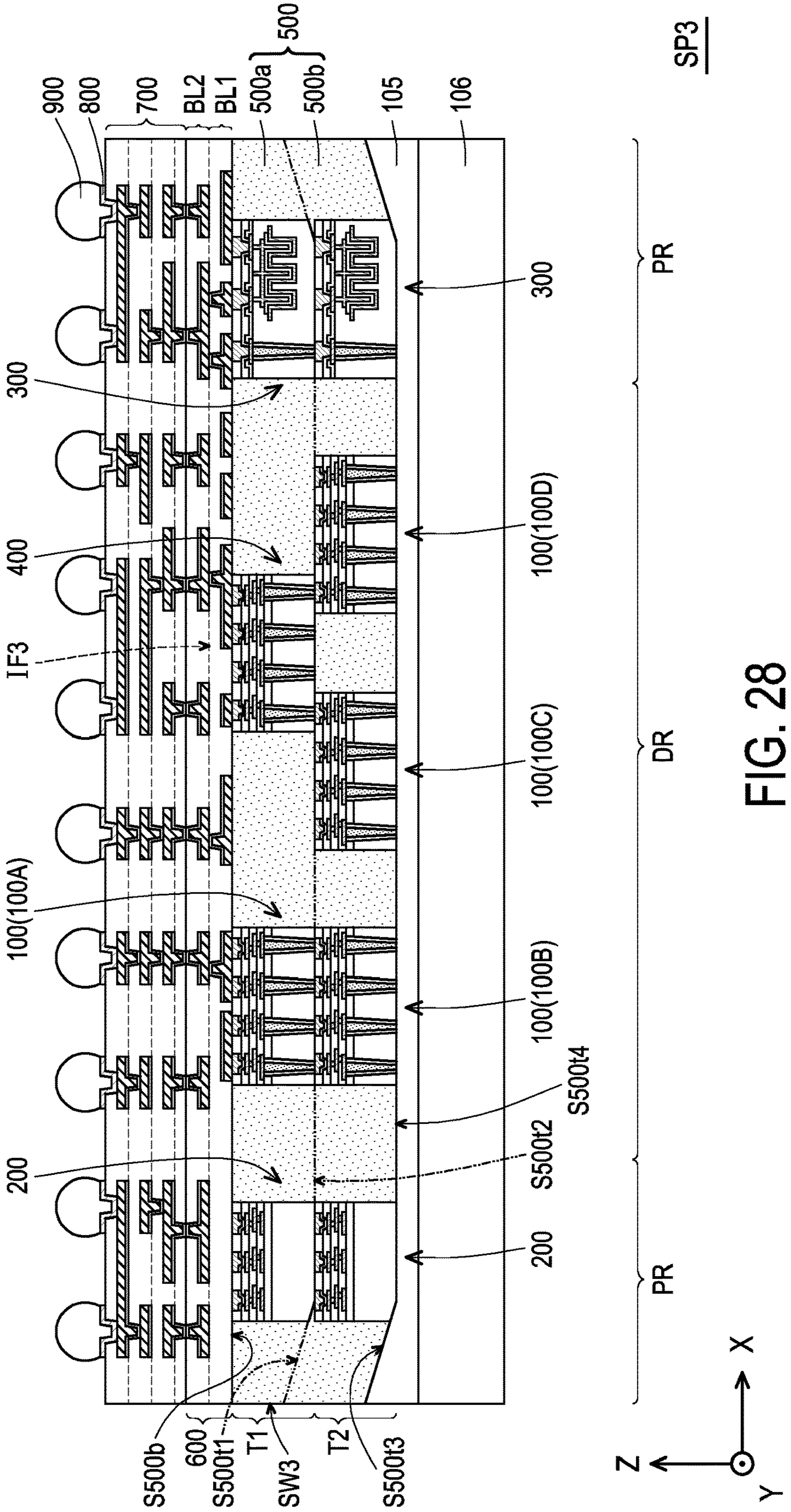

In some embodiments, the insulating encapsulation 500*a* has an illustrated top surface constituted by a substantial slant planar surface S500*t*1 at the peripheral region PR and a substantial planar surface S500*t*2 at the device region DR surrounded by (or bounded by) the substantial slant planar surface S500*t*1, where the substantial slant planar surface S500*t*1 is connected to the substantial planar surface S500*t*2 and a (substantially vertical) sidewall of the insulating encapsulation 500*a* (which being a part of a sidewall SW3 of the semiconductor structure SP3 depicted in FIG. 28). As shown in FIG. 25, the substantial planar surface S500*t*2 is connected to and enclosed by the substantial slant planar surface S500*t*1, for example. The substantial planar surface S500*t*2 may be considered as a substantially horizontal planar surface extending along the X-Y plane. In such cases, the substantial planar surface S500*t*2 accessibly reveals the semiconductor dies 100, 400. For example, bottom sides S100*b* of the semiconductor dies 100 and bottom sides S400*b* of the semiconductor dies 400 are substantially levelled with the substantial planar surface S500*t*2 of the insulating encapsulation 500*a*. In other words, the end surfaces of the conductive pillars 170 of the semiconductor dies 100 and the end surfaces of the conductive pillars 470 of the semiconductor dies 400 are substantially coplanar to the substantial planar surface S500*t*2 of the insulating encapsulation 500*a*. In certain cases, the substantial planar surface S500*t*2 further accessibly reveals the dummy dies 200 and/or the DTCs 300, partially. For example, bottom sides S200*b* of the dummy dies 200 and/or bottom sides S300*b* of the DTCs 300 are substantially levelled with the substantial planar surface S500*t*2 of the insulating encapsulation 500*a*, in part. In other words, the bottom sides S200*b* of the dummy dies 200 and/or the end surfaces of the conductive pillars 380 of the DTCs 300 are substantially coplanar to the substantial planar surface S500*t*2 of the insulating encapsulation 500*a*, in part.

On the other hand, the substantial slant planar surface S500*t*1 may be considered as a bevel edge, where the insulating encapsulation 500*a* at the peripheral region PR has a thickness (not labeled) gradually decreasing along a direction from the device region DR toward to the sidewall SW3 of the semiconductor structure SP3. Such bevel edge may be created during the planarization process at or near the edge/sidewall of the to-be-polished object (e.g., the semiconductor structure SP3) due to over-grinding/polishing or the less metal (or pattern) density as compared to a center region thereof. If considering a semiconductor die (with active device(s)) is located at or near the edge/sidewall of the semiconductor structure SP3, such semiconductor die would be damaged due to the bevel edge occurs, which leads to an abnormal functionalities or loss of functionalities. In order to avoid such damages, one or more dummy dies (e.g., 200) and/or one or more deep trench capacitors (DTC without any active devices such as transistor, diodes, memory, etc. are formed therein) (e.g., 300) may be adopted at the peripheral region PR to function as an structure support during planarizing (or thinning) process, thereby the resulting bevel edge would be stopped at/within the desired peripheral region PR, without further extending into the device region DR. Consequently, the semiconductor dies 100, 400 formed within the device region DR bounded by the desired peripheral region PR disposed with one or more dummy dies (e.g., 200) and/or one or more deep trench capacitors (DTC without any active devices such as transistor, diodes, memory, etc. are formed therein) (e.g., 300) will be protected from the damages caused by planarizing (or thinning) process, as the presences of the dummy dies 200 and/or the DTCs 300 improve the edge uniformity of the semiconductor structure SP3. That is, owing to at least one of the dummy dies 200 and the DTCs 300, the substantial slant planar surface S500*t*1 of the insulating encapsulation 500*a* would be stopped at the peripheral region PR (e.g., at the dummy dies 200 and/or the DTCs 300), thereby enhancing the reliability of the semiconductor structure SP3. In some embodiments, the substantial planar surface S500*t*2 of the insulating encapsulation 500*a* extend into the peripheral region PR, as shown in FIG. 25. As an alternative, the substantial planar surface S500*t*2 of the insulating encapsulation 500*a* may reach to and stop at the edge of the peripheral region PR.

Figure 26:
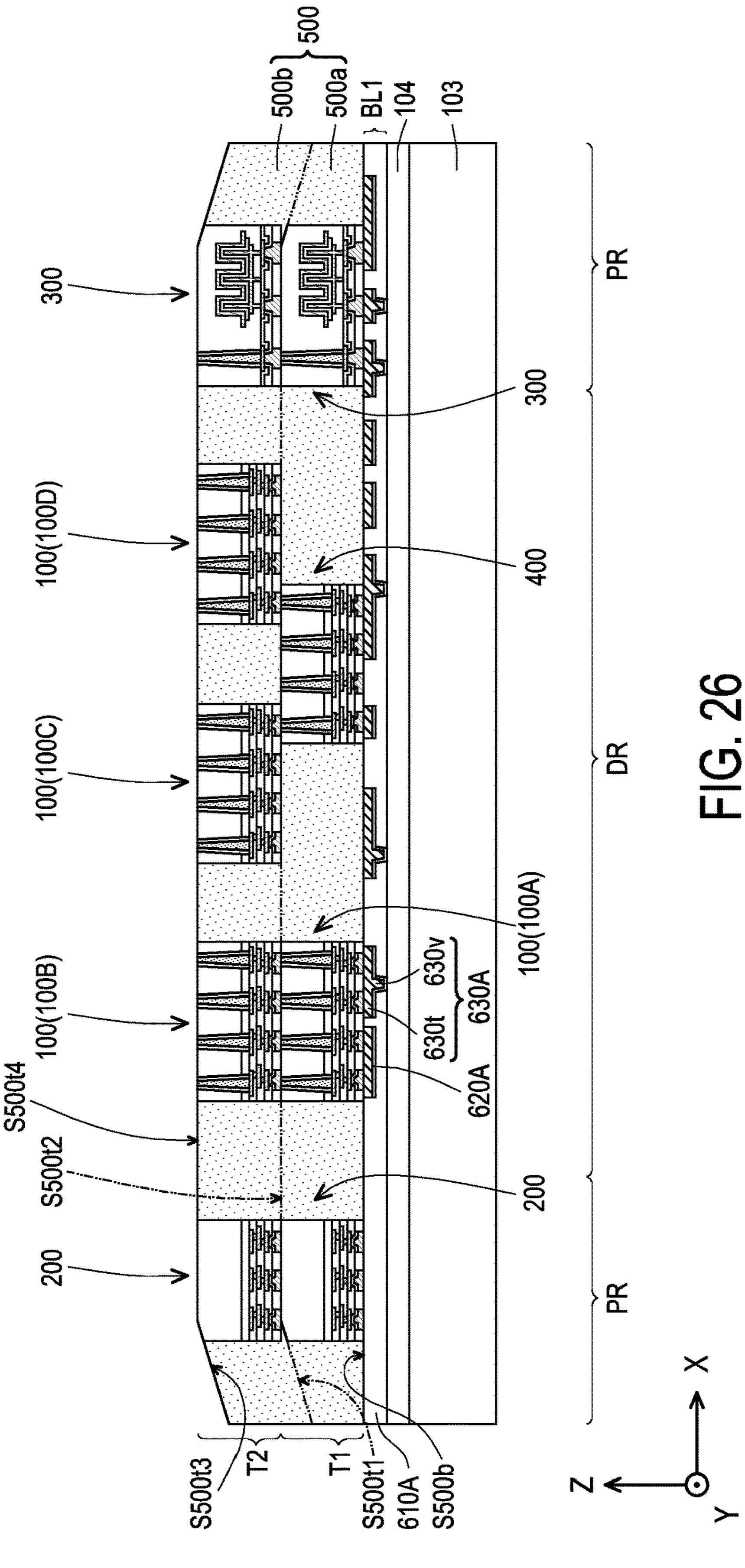

Referring to FIG. 26, in some embodiments, one or more semiconductor dies 100, one or more dummy dies 200, and one or more DTCs 300 are placed onto the insulating encapsulation 500*a* and encapsulated in an insulating encapsulation 500*b*. In some embodiments, prior to encapsulating the semiconductor dies 100, the dummy dies 200 and the DTCs 300 in the insulating encapsulation 500*b*, a bonding process is performed on the semiconductor dies 100, the dummy dies 200 and the DTCs 300. For example, the semiconductor dies 100, the dummy dies 200 and the DTCs 300 encapsulated in the insulating encapsulation 500*b* are respectively bonded a respective one of semiconductor devices (e.g., 100, 200, 300, or 400) encapsulated in the insulating encapsulation 500*a* underlying thereto. For example, the dummy die 200 encapsulated in the insulating encapsulation 500*b* is bonded to and is electrically isolated to the dummy die 200 encapsulated in the insulating encapsulation 500*a* through a bonding process including a dielectric-to-metal bonding and a dielectric-to-dielectric bonding. However, the disclosure is not limited thereto, alternatively, the dummy die 200 encapsulated in the insulating encapsulation 500*b* and the dummy die 200 encapsulated in the insulating encapsulation 500*a* may be bonded by fusion bonding, such as a dielectric-to-dielectric bonding only. For example, the semiconductor die 100B encapsulated in the insulating encapsulation 500*b* is bonded to and electrically connected to the semiconductor die 100A encapsulated in the insulating encapsulation 500*a* through a bonding process including a metal-to-metal bonding and a dielectric-to-dielectric bonding, with or without a dielectric-to-metal bonding. For example, the semiconductor die 100C encapsulated in the insulating encapsulation 500*b* is bonded to and electrically connected to the semiconductor die 400 encapsulated in the insulating encapsulation 500*a* through a bonding process including a metal-to-metal bonding and a dielectric-to-dielectric bonding, with or without a dielectric-to-metal bonding. For example, the semiconductor die 100D encapsulated in the insulating encapsulation 500*b* is bonded to and electrically connected to the semiconductor die 400 encapsulated in the insulating encapsulation 500*a* through a bonding process including a metal-to-metal bonding and a dielectric-to-dielectric bonding, with or without a dielectric-to-metal bonding. For example, the DTC 300 encapsulated in the insulating encapsulation 500*b* is bonded to and electrically connected to the DTC 300 encapsulated in the insulating encapsulation 500*a* through a bonding process including a metal-to-metal bonding and a dielectric-to-dielectric bonding, with or without a dielectric-to-metal bonding. However, the disclosure is not limited thereto, alternatively, the semiconductor die 100A and the semiconductor die 100B overlying thereto, the semiconductor die 100C and the semiconductor die 400 overlying thereto, the semiconductor die 100D and the semiconductor die 400 overlying thereto, and the DTCs 300 overlapped therewith may be bonded by FC bonding, respectively. The semiconductor die 400 is the bridge die (or chip) or semiconductor bridge die (or chip) for the semiconductor dies 100C and 100D.

After bonding, the semiconductor dies 100, the dummy dies 200 and the DTCs 300 are laterally encapsulated in the insulating encapsulation 500*b*, in some embodiments. As shown in FIG. 26, the semiconductor dies 100, the dummy dies 200 and the DTCs 300 are exposed by the insulating encapsulation 500*b*, for example. The formation and material of the insulating encapsulation 500*b* are previously described in FIG. 2 through FIG. 6, and thus are not repeated herein for brevity. In some embodiments, the insulating encapsulation 500*a* and the insulating encapsulation 500*b* together may be referred to as an insulating encapsulation 500.

Continued on FIG. 26, for example, the insulating encapsulation 500*b* has an illustrated top surface constituted by a substantial slant planar surface S500*t*3 at the peripheral region PR and a substantial planar surface S500*t*4 at the device region DR surrounded by (or bounded by) the substantial slant planar surface S500*t*3, where the substantial slant planar surface S500*t*3 is connected to the substantial planar surface S500*t*4 and a (substantially vertical) sidewall of the insulating encapsulation 500*b* (which being a part of a sidewall SW3 of the semiconductor structure SP3 depicted in FIG. 28). As shown in FIG. 26, the substantial planar surface S500*t*4 is connected to and enclosed by the substantial slant planar surface S500*t*3, for example. The substantial planar surface S500*t*4 may be considered as a substantially horizontal planar surface extending along the X-Y plane. In such cases, the substantial planar surface S500*t*4 accessibly reveals the semiconductor dies 100. For example, end surfaces of the conductive pillars 170 of each of the semiconductor dies 100 are substantially levelled with the substantial planar surface S500*t*4 of the insulating encapsulation 500*b*. In other words, the end surfaces of the conductive pillars 170 of the semiconductor dies 100 are substantially coplanar to the substantial planar surface S500*t*4 of the insulating encapsulation 500*b*. In certain cases, the substantial planar surface S500*t*4 further accessibly reveals the dummy dies 200 and/or the DTCs 300, partially. For example, bottom sides S200*b* of each of the dummy dies 200 and/or bottom sides S300*b* of each of the DTCs 300 are substantially levelled with the substantial planar surface S500*t*4 of the insulating encapsulation 500*b*, in part. In other words, the bottom sides S200*b* of each of the dummy dies 200 and/or the bottom sides S300*b* of each of the DTCs 300 are substantially coplanar to the substantial planar surface S500*t*4 of the insulating encapsulation 500*b*, in part.

On the other hand, the substantial slant planar surface S500*t*3 may be considered as a bevel edge, where the insulating encapsulation 500*b* at the peripheral region PR has a thickness (not labeled) gradually decreasing along a direction from the device region DR toward to the sidewall SW3 of the semiconductor structure SP3. Such bevel edge may be created during the planarization process at or near the edge/sidewall of the to-be-polished object (e.g., the semiconductor structure SP3) due to over-grinding/polishing or the less metal (or pattern) density as compared to a center region thereof. If considering a semiconductor die (with active device(s)) is located at or near the edge/sidewall of the semiconductor structure SP3, such semiconductor die would be damaged due to the bevel edge occurs, which leads to an abnormal functionalities or loss of functionalities. In order to avoid such damages, one or more dummy dies (e.g., 200) and/or one or more deep trench capacitors (DTC without any active devices such as transistor, diodes, memory, etc. are formed therein) (e.g., 300) may be adopted at the peripheral region PR to function as an structure support during planarizing (or thinning) process, thereby the resulting bevel edge would be stopped at/within the desired peripheral region PR, without further extending into the device region DR. Consequently, the semiconductor dies 100 formed within the device region DR bounded by the desired peripheral region PR disposed with one or more dummy dies (e.g., 200) and/or one or more deep trench capacitors (DTC without any active devices such as transistor, diodes, memory, etc. are formed therein) (e.g., 300) will be protected from the damages caused by planarizing (or thinning) process, as the presences of the dummy dies 200 and/or the DTCs 300 improve the edge uniformity of the semiconductor structure SP3. That is, owing to at least one of the dummy dies 200 and the DTCs 300, the substantial slant planar surface S500*t*3 of the insulating encapsulation 500*b* would be stopped at the peripheral region PR (e.g., at the dummy dies 200 and/or the DTCs 300), thereby enhancing the reliability of the semiconductor structure SP3. In some embodiments, the substantial planar surface S500*t*4 of the insulating encapsulation 500*b* extend into the peripheral region PR, as shown in FIG. 26. As an alternative, the substantial planar surface S500*t*4 of the insulating encapsulation 500*b* may reach to and stop at the edge of the peripheral region PR. In some embodiments, a thickness of the insulating encapsulation 500 at an edge thereof is less than a thickness of the insulating encapsulation 500 at a center thereof.

Figure 27:
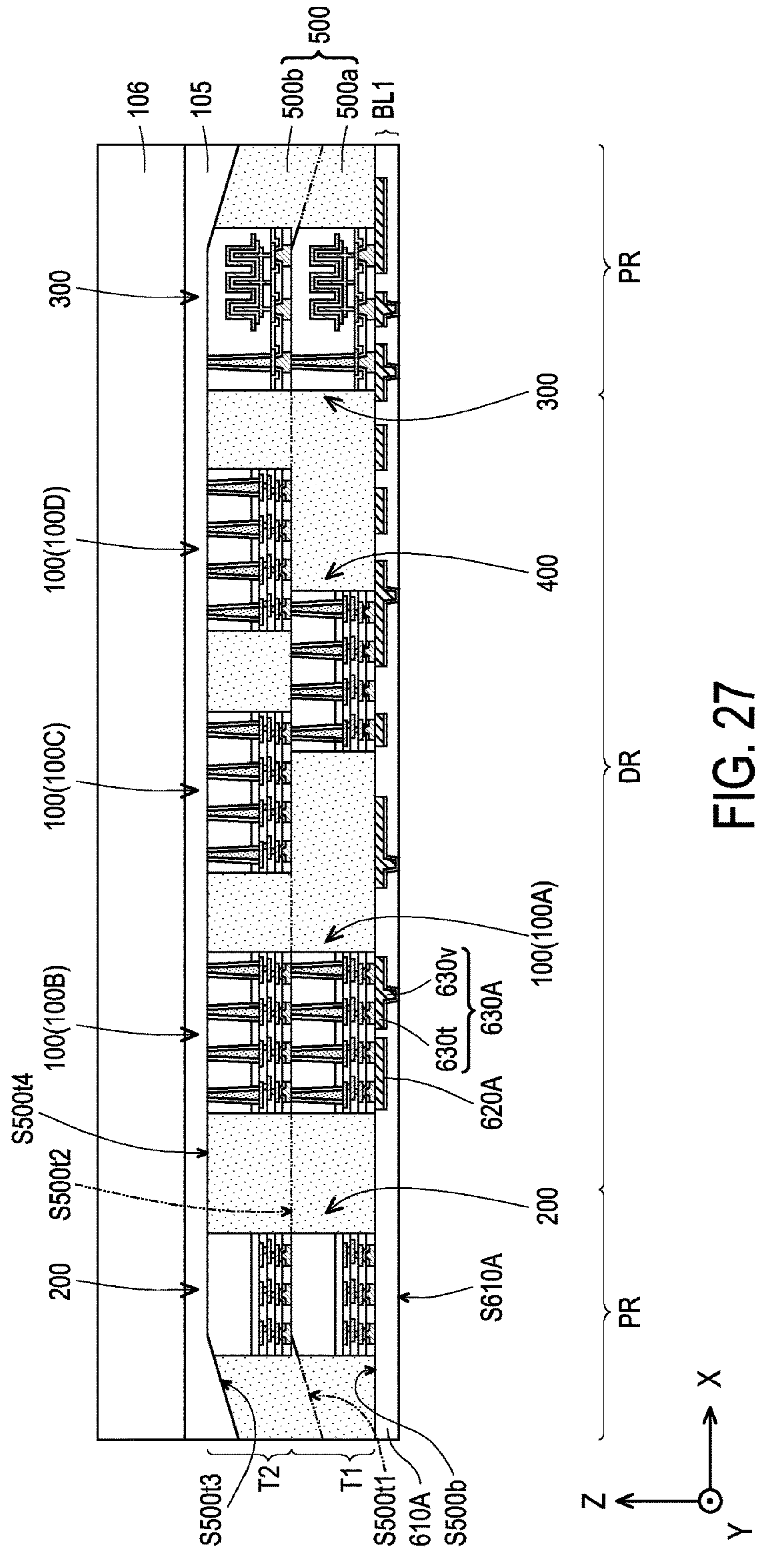

Referring to FIG. 26 and FIG. 27 together, in some embodiments, a carrier 106 coated with a debond layer 105 is bonded to the insulating encapsulation 500, and then the carrier 103 and the debond layer 104 are removed. For example, the first build-up layer BL1 is exposed, as shown in FIG. 27. The details of the carrier 106 is similar to or substantially identical to the details of the carrier 101 as described in FIG. 1, the details of the debond layer 105 is similar to or substantially identical to the details of the debond layer 102 as described in FIG. 1, the removal process of the carrier 103 and the debond layer 104 is similar to or substantially the removal process of the carrier 101 and the debond layer 102 described in FIG. 12, and thus are not repeated herein for brevity.

Referring to FIG. 28, in some embodiments, a second build-up layer BL2 of the wafer structure 600 is provided and bonded to the first build-up layer BL1 to form the wafer structure 600 on the insulating encapsulation 500. For example, the bonding between the second build-up layer BL2 and the first build-up layer BL1 is a wafer-on-wafer (WoW) bonding process, which including both of a metal-to-metal bonding and a dielectric-to dielectric bonding at an bonding interface IF3. For example, the second build-up layer BL2 includes a dielectric layer 610B, a seed layer 620B, and a routing layer 630B, where the routing layer 630B disposed on the seed layer 620B, and the dielectric layer 610B laterally covers the seed layer 620B and the routing layer 630B (both together referred to as a metallization layer). An illustrated top surface of the seed layer 620B is exposed by an illustrated top surface of the dielectric layer 610B for further electrical connections, and an illustrated bottom surface of the routing layer 630B is exposed by an illustrated bottom surface of the dielectric layer 610B for further electrical connections, as shown in FIG. 28. The formation and material of the second build-up layer BL2 has been previously described in FIG. 7, and thus are not repeated herein for brevity. Before bonding the second build-up layer BL2, the structure depicted in FIG. 27 is flipped (turned upside down). As shown in FIG. 28, for example, the second build-up layer BL2 is electrically connected to the first build-up layer BL1 to form the wafer structure 600, so to provide routing functions to the semiconductor dies 100, 400 and the DTCs 300 encapsulated in the insulating encapsulation 500, together.

Continued on FIG. 28, after forming the wafer structure 600, the previously described processes in FIG. 8 through FIG. 10 are performed to obtain the semiconductor structure SP3. In some embodiments, the redistribution circuit structure 700 is disposed on and electrically connected to the wafer structure 600, and the conductive terminals 900 are disposed over and electrically coupled to the redistribution circuit structure 700 through the UBM patterns 800. In some embodiments, the conductive terminals 900 are electrically coupled to the wafer structure 600 through the UBM patterns 800 and the redistribution circuit structure 700. In some embodiments, some of the conductive terminals 900 are electrically coupled to the semiconductor dies 100 in the insulating encapsulation 500*a* through some of the UBM patterns 800, the redistribution circuit structure 700 and the wafer structure 600. In some embodiments, some of the conductive terminals 900 are electrically coupled to the semiconductor dies 400 in the insulating encapsulation 500*a* through some of the UBM patterns 800, the redistribution circuit structure 700 and the wafer structure 600. In addition, some of the conductive terminals 900 may be electrically coupled to the DTCs 300 in the insulating encapsulation 500*a* through some of the UBM patterns 800, the redistribution circuit structure 700 and the wafer structure 600. In some embodiments, the conductive terminals 900 are electrically isolated to the dummy dies 200 in the insulating encapsulations 500*a* and 500*b*. In some embodiments, some of the conductive terminals 900 are electrically coupled to the semiconductor dies 100 in the insulating encapsulation 500*b* through some of the UBM patterns 800, the redistribution circuit structure 700, the wafer structure 600, and the semiconductor dies 400 (e.g., in 500*a*) electrically connected to the semiconductor die 100 (e.g., in 500*b*). In some embodiments, some of the conductive terminals 900 are electrically coupled to the semiconductor dies 100 in the insulating encapsulation 500*b* through some of the UBM patterns 800, the redistribution circuit structure 700, the wafer structure 600, and the semiconductor dies 100 (e.g., in 500*a*) electrically connected to the semiconductor die 100 (e.g., in 500*b*). In some embodiments, some of the conductive terminals 900 are electrically coupled to the DTCs 300 in the insulating encapsulation 500*b* through some of the UBM patterns 800, the redistribution circuit structure 700, the wafer structure 600, and the DTCs 300 (e.g., in 500*a*) electrically connected to the DTCs 300 (e.g., in 500*b*).

In an alternative embodiment, the carrier 106 may be thinned down to a sufficient thickness which is still capable of serving as a mechanical supporting structure and/or a heat dissipating element (or a heat sink). With such, an overall thickness of the semiconductor structure SP3 can be reduced.

Or alternatively, the carrier 106 can be omitted, see a semiconductor structure SP3' in FIG. 29. The details of removing the carrier 106 may be similar to or substantially identical to the removal process of the carrier 101 as described in FIG. 12, and thus are not repeated herein for brevity. Owing to the removal of the carrier 106, an overall thickness of the semiconductor structure SP3' is further reduced.

Figure 32:
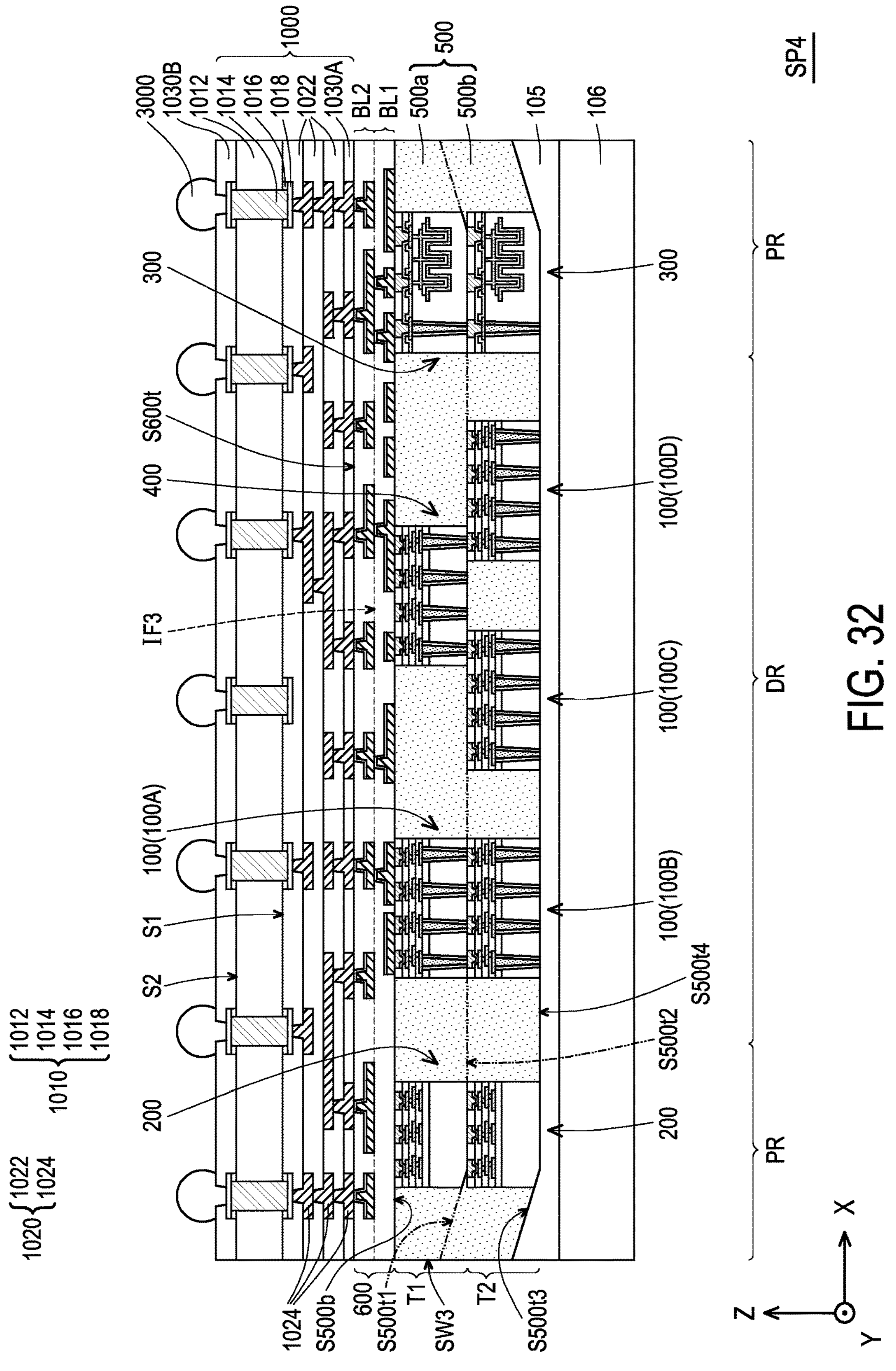
FIG. 32 is a schematic cross-sectional view showing a semiconductor structure in accordance with some embodiments of the disclosure.
Figure 33:
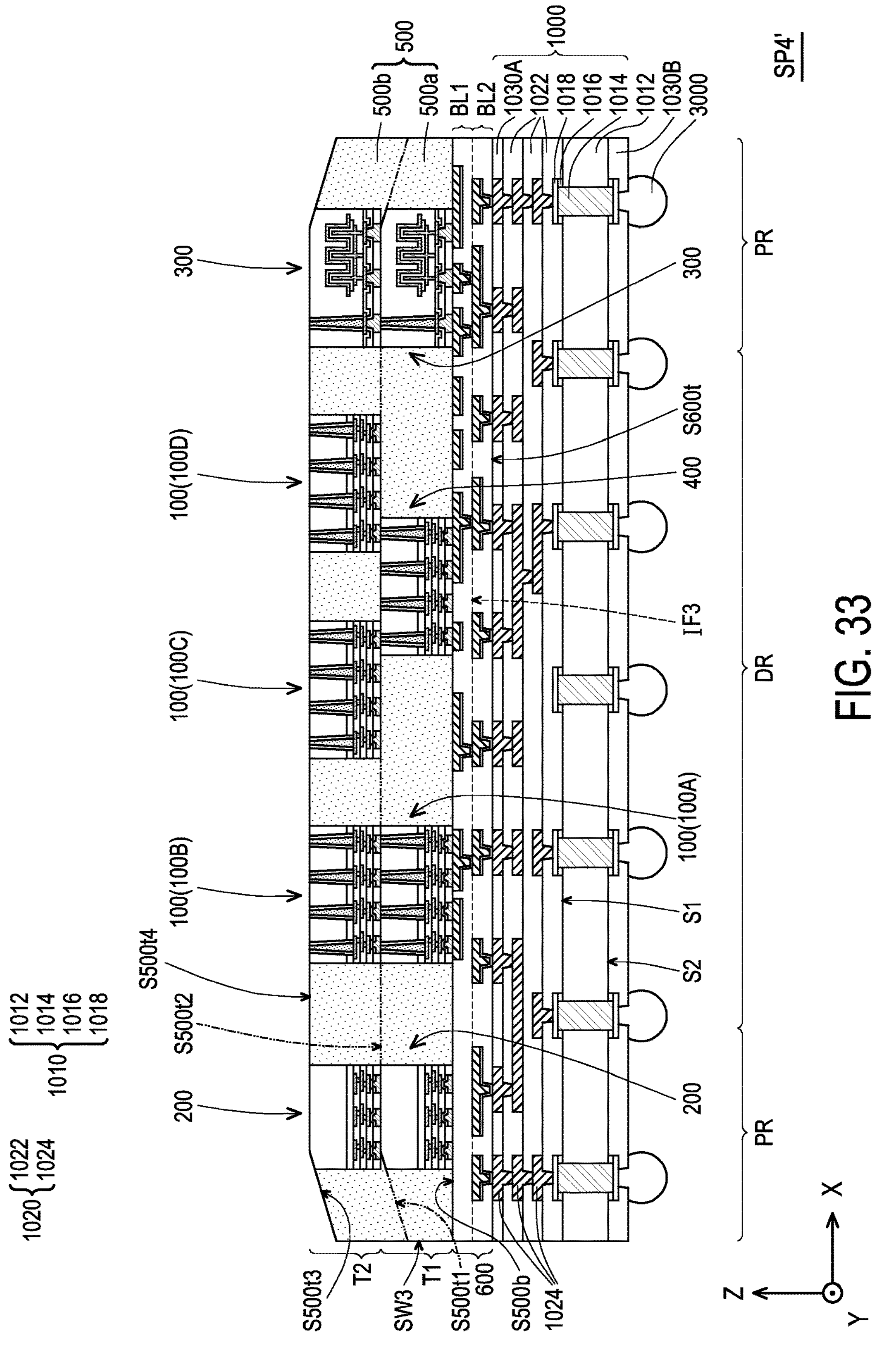
FIG. 33 is a schematic cross-sectional view showing a semiconductor structure in accordance with alternative embodiments of the disclosure.

FIG. 32 is a schematic cross-sectional view showing a semiconductor structure SP4 in accordance with some embodiments of the disclosure. FIG. 33 is a schematic cross-sectional view showing a semiconductor structure SP4' in accordance with alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. For example, a semiconductor structure SP4 of FIG. 32 and the semiconductor structure SP3 of FIG. 28 are similar; and the difference is that, in the semiconductor structure SP4 depicted in FIG. 32, an interposer 1000 is adopted to substitute the redistribution circuit structure 700, the UBM patterns 800 and the conductive terminals 900.

Referring to FIG. 32, in some embodiments, after forming the wafer structure 600 described in FIG. 28, a planarization process is performed on the wafer structure 600 to obtain a surface S600*t*, where the surface S600*t* is leveled and has a high degree of planarity to benefit the formation of later-formed component. In other words, the surface S600*t* of the wafer structure 600 may be referred to as a planar surface or a substantially horizontal planar surface. The planarization process may include a grinding process, a CMP process, an etching process, or combinations thereof. The etching process may include a dry etching, a wet etching, or a combination thereof. After the planarization process, a cleaning process may be optionally performed, for example to clean and remove the residue generated from the planarization process. However, the disclosure is not limited thereto, and the planarization process may be performed through any other suitable method.

In some embodiments, the interposer 1000 is provided and bonded to the surface S600*t* of the wafer structure 600, in some embodiments. For example, the interposer 1000 is electrically connected to the wafer structure 600 by the bonding process including both of a metal-to-metal bonding and a dielectric-to-dielectric bonding, with or without a dielectric-to-metal bonding. In some embodiments, the interposer 1000 includes a core portion 1010, a routing portion 1020 and solder resist layers 1030A, 1030B, where the solder resist layer 1030A is disposed over a side S1 of the core portion 1010, the solder resist layer 1030B is disposed over a side S2 of the core portion 100, and the routing portion 1020 is interposed between the solder resist layer 1030A and the core portion 1010. The side S1 may be opposite to the side S2 along the stacking direction Z.

In some embodiments, the core portion 1010 includes a core dielectric layer 1012, a plurality of through holes 1014, a plurality of core conductive layers 1016 and a plurality of conductive lids 1018. In some embodiments, the core dielectric layer 1012 includes prepreg (which contains epoxy, resin, silica filler and/or glass fiber), ABF, resin coated copper foil (RCC), polyimide, photo image dielectric (PID), ceramic core, glass core, molding compound, a combination thereof, or the like. However, the disclosure is not limited thereto, and other dielectric materials may also be used. The core dielectric layer 1012 may be formed by a lamination process, a coating process, or the like. In some embodiments, the core conductive layers 1016 are formed on the opposite sides (e.g., S1 and S2) of the core dielectric layer 1012. In some embodiments, the core conductive layers 1016 include copper, gold, tungsten, aluminum, silver, gold, a combination thereof, or the like. The conductive lids 1018 are located respectively over the core conductive layers 1016. In some embodiments, the conductive lids 1018 include copper or other suitable conductive material, for example. The core dielectric layer 1012 is referred to as a base substrate or a core substrate, in some embodiments.

In some embodiments, the through holes 1014 are disposed in and penetrate through the core dielectric layer 1012, which provide electrical connection between the core conductive layers 1016 at the two different sides (e.g., S1 and S2). In other words, the through holes 1014 provide electrical paths between the electrical circuits located on two opposing sides (e.g., S1 and S2) of the core dielectric layer 1012. In some embodiments, the through holes 1014 are lined with an insulating material, where the liners (not shown) separate the through holes 1014 from the core dielectric layer 1012. The liners may be referred to as barrier layers. In some embodiments, the method of forming the through holes 1014 includes the following operations. First, opening holes (not shown) are formed at the predetermined positions (of the through holes 1014) by, for example, a mechanical or laser drilling, an etching, or another suitable removal technique. A desmear treatment may be performed to remove residues remaining in the opening holes formed in the core dielectric layer 1012. Subsequently, the opening holes may be filled with one or more conductive materials to a predetermined thickness, thereby providing the through holes 1014. For example, the opening holes may be filled with copper by an electroplating or an electroless plating, a deposition process or the like. The through holes 1014 are referred to as conductive vias or through vias, in some embodiments.

The disclosure is not limited thereto; alternatively, the through holes may include plated through vias (not shown), where the opening holes may be lined with a conductive material and filled up with an insulating material. In some alternative embodiments, the method of forming the through holes includes the following operations. First, opening holes (not shown) are formed at the predetermined positions by, for example, a mechanical or laser drilling, an etching, or another suitable removal technique. A desmear treatment may be performed to remove residues remaining in the opening holes. Subsequently, the opening holes may be plated with one or more conductive materials to a predetermined thickness, thereby providing a plurality of plated through holes. For example, the opening holes may be plated with copper by an electroplating or an electroless plating. Then, the opening holes may be filled with any suitable insulating material.

In some embodiments, the core conductive layers 1016, the conductive lids 1018, and the through holes 1014 may be formed by the following steps. First, a first conductive material (not shown) is respectively formed on two opposite surfaces of the core dielectric layer 1012. Then, the through holes 1014 are formed to penetrate the core dielectric layer 1012 as mentioned above and to provide electrical connection between the first conductive material respectively formed on both sides (e.g., S1 and S2) of the core dielectric layer 1012. Thereafter, a second conductive material is respectively formed over the first conductive materials on the opposite sides (e.g., S1 and S2) of the core dielectric layer 1012, where the second conductive material may be different from the first conductive material. In some embodiments, the first and second conductive materials may be formed by any suitable method (e.g., CVD, sputtering, printing, plating, or the like). Then, the first conductive materials and the second conductive materials may be patterned together to form the core conductive layers 1016 and the conductive lids 1018, respectively. In some embodiments, the first and second conductive materials may be partially removed using a photolithography and etching process or another suitable removal technique. That is, the through holes 1014 further penetrate through the core conductive layers 1016, as shown in FIG. 32, for example.

However, the disclosure is not limited thereto; alternatively, the core conductive layers 1016, the conductive lids 1018, and the through holes 1014 may be formed by the following steps, forming the through holes 1014 to penetrate the core dielectric layer 1012 as mentioned above, sequentially forming the first and second conductive materials over the opposite sides (e.g., S1 and S2) of the core dielectric layer 1012, and patterning the first and second conductive materials to form the core conductive layers 1016 and the conductive lids 1018; thereby the through holes 1014 provide electrical connection between the first and second conductive materials respectively formed on both surfaces of the core dielectric layer 1012. With such alternative embodiments, the through holes 1014 do not penetrate through the core conductive layers 1016 (not shown).

As illustrated in FIG. 32, in some embodiments, the routing portion 1020 is disposed on the side S1 of the core portion 1010. For example, the routing portion 1020 is formed over the conductive lid 1018 disposed at the side S1 of the core portion 1010. In some embodiments, the formation of the routing portion 1020 may include sequentially forming a plurality of dielectric layers 1022 and a plurality of conductive layers 1024. For example, the dielectric layers 1022 and the conductive layers 1024 are alternately stacked over the side S1 of the core portion 1010, where the conductive layers 1024 provides routing function. In some embodiments, the routing portion 1020 is referred to as a redistribution circuit structure or a redistribution structure.

In some embodiments, a material of the dielectric layers 1022 may be ABF, prepreg, RCC, polyimide, PID, molding compound, a combination thereof, or the like. In some alternative embodiments, the core dielectric layer 1012 and the dielectric layers 1022 may be made of the same material. For example, the material of the core dielectric layer 1012 and the dielectric layers 1022 may be molding compound such as epoxy molding compound (EMC). The dielectric layers 1022 may be formed by a lamination process, a coating process, or the like.

In some embodiments, a material of the conductive layers 1024 includes aluminum, titanium, copper, nickel, tungsten, and/or alloys thereof. The conductive layers 1024 may be formed by forming a conductive material layer through a lamination process, a deposition process, or the like, and followed by a patterning process. The patterning process may include dry etching, wet etching, or a combination thereof. In certain embodiments, the formation and material of each layer of the conductive layers 1024 are the same or similar to the process and material of forming the metallization layers as described in FIG. 7, and thus are not repeated herein.

Although three layers of conductive layers 1024 and three layers of dielectric layers 1022 are illustrated for each of the routing portions 1020 in FIG. 32, the disclosure is not limited thereto. In some alternative embodiments, the number of dielectric layers 1022 and the number of the conductive layers 1024 may be adjusted upon the design requirements. In some embodiments, the total number of layers of each of the routing portion 1020 may sum up to a total of one layer to eight layers for each of the conductive layers and the dielectric layers included therein.

In some embodiments, the solder resist layer 1030A is formed on an outmost surface of the routing portion 1020 facing away from the core portion 1010, and the solder resist layer 1030B is formed on the side S2 of the core portion 1010. For example, the outermost conductive layer 1024 of the routing portion 1020 is accessibly revealed by an outermost surface of the solder resistor layer 1030A, and the conductive lid 1018 at the side S2 is accessibly revealed by an outermost surface of the solder resistor layer 1030B. The outermost conductive layer 1024 of the routing portion 1020 is substantially coplanar to and substantially leveled with the outermost surface of the solder resistor layer 1030A, for example.

However, the disclosure is not limited thereto. In alternative embodiments, in addition to the routing portion 1020, an additional routing portion may be presented between the core portion 1010 and the solder resist layer 1030B. In further alternative embodiments, the routing portion 1020 may be omitted, and an additional routing portion may be presented between the core portion 1010 and the solder resist layer 1030B. In yet alternative embodiment, there is no routing portion included in the interposer 1000. Or, the core portion 1010 may be omitted, where the conductive terminals 3000 are directly connected to the routing portion. In addition, as an alternative, the interposer 1000 may be pre-fabricated on the second build-up layer BL2 prior to bonding the second build-up layer BL2 onto the first build-up layer BL. The interposer 1000 may be referred to as a wafer-level circuit structure or a wafer circuit structure.

Continued on FIG. 32, in some embodiments, after the wafer structure 600 and the interposer 1000 are disposed on the insulating encapsulation 500 and electrically connected to the semiconductors 100, 400 and the DTCs 300, a plurality of conductive terminals 3000 are provided and bonded to the interposer 1000, where the interposer 1000 is between the conductive terminals 3000 and the wafer structure 600. For example, the conductive terminals 3000 are disposed on the outermost surface of the solder resistor layer 1030B and further extended into openings (not labelled) formed in the solder resistor layer 1030B to be electrically connected to the core portion 1010.

In some embodiments, the conductive terminals 3000 are electrically coupled to the wafer structure 600 through the interposer 1000. In some embodiments, some of the conductive terminals 3000 are electrically coupled to the semiconductor dies 100A (in 500*a*) through the interposer 1000 and the wafer structure 600. In addition, some of the conductive terminals 3000 may be electrically coupled to the DTCs 300 (in 500*a*) through the interposer 1000 and the wafer structure 600. In some embodiments, some of the conductive terminals 3000 are electrically coupled to the semiconductor dies 400 through the interposer 1000 and the wafer structure 600. In some embodiments, the conductive terminals 3000 are electrically isolated to the dummy dies 200 (in 500*a*). In some embodiments, some of the conductive terminals 3000 are electrically coupled to the semiconductor dies 100B (in 500*b*) through the interposer 1000, the wafer structure 600 and the semiconductor die 100A (in 500*a*). In some embodiments, some of the conductive terminals 3000 are electrically coupled to the semiconductor dies 100C (in 500*b*) through the interposer 1000, the wafer structure 600 and the semiconductor die 400 (in 500*a*). In some embodiments, some of the conductive terminals 3000 are electrically coupled to the semiconductor dies 100D (in 500*b*) through the interposer 1000, the wafer structure 600 and the semiconductor die 400 (in 500*a*). In addition, some of the conductive terminals 3000 may be electrically coupled to the DTCs 300 (in 500*b*) through the interposer 1000, the wafer structure 600, and the DTCs 300 (in 500*a*). In some embodiments, the conductive terminals 3000 are electrically isolated to the dummy dies 200 (in 500*b*).

In some embodiments, the conductive terminals 3000 are physically connected to the core portion 1010. In some embodiments, the conductive terminals 3000 are disposed on the conductive lids 1018 by ball placement process or reflow process. For example, the conductive terminals 3000 includes micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. The number of the conductive terminals 3000 is not limited to the drawings of the embodiments, and may be selected and designated based on the demand and design requirements. The number of the conductive terminals 3000 may be controlled by adjusting the number of the openings formed in the solder resist layer 1030B. When solder is used, the solder may include either eutectic solder or non-eutectic solder. The solder may include lead or be lead-free, and may include Sn—Ag, Sn—Cu, Sn—Ag—Cu, or the like. The conductive terminals 3000 may be solder free. The conductive terminals 3000 may be referred to as conductors, input/output (I/O) terminals, conductive connectors, or conductive I/O terminals of the semiconductor structure SP4 for electrical connection with external components or elements (e.g., an additional semiconductor package/device, a circuit substrate, an interposer, an capacitor, a power source, or the like, etc.).

In an alternative embodiment, the carrier 106 may be thinned down to a sufficient thickness which is still capable of serving as a mechanical supporting structure and/or a heat dissipating element (or a heat sink). With such, an overall thickness of the semiconductor structure SP4 can be reduced.

Or alternatively, the carrier 106 can be omitted, see a semiconductor structure SP4' in FIG. 33. The details of removing the carrier 106 may be similar to or substantially identical to the removal process of the carrier 101 as described in FIG. 12, and thus are not repeated herein for brevity. Owing to the removal of the carrier 106, an overall thickness of the semiconductor structure SP4' is further reduced.

In the above embodiments (e.g., SP3, SP3', SP4, SP4', and their modifications), the semiconductor dies or devices included in the first tier T1 includes the semiconductor dies 100, the dummy dies 200, the DTCs 300 and the semiconductor dies 400, while the semiconductor dies or devices included in the second tier T2 includes only the semiconductor dies 100, the dummy dies 200 and the DTCs 300, and the semiconductor dies or devices included in the first tier T1 and the semiconductor dies or devices included in the second tier T2 are in a manner of back-to-face arrangement, in the above embodiments, however the disclosure is not limited thereto. Alternatively, the semiconductor dies or devices included in the first tier T1 may include one or more of the semiconductor dies 100, the dummy dies 200, the DTCs 300, and the semiconductor dies 400, and/or the semiconductor dies or devices included in the second tier T2 may include one or more of the semiconductor dies 100, the dummy dies 200, the DTCs 300, and the semiconductor dies 400. In addition, the semiconductor dies or devices (100, 200, 300, and/or 400) included in the first tier T1 and the semiconductor dies or devices (100, 200, 300, and/or 400) included in the second tier T2 may be in a manner of back-to-face arrangement. Alternatively, the semiconductor dies or devices (100, 200, and/or 300) included in the first tier T1 and the semiconductor dies or devices (100, 200, 300, and/or 400) included in the second tier T2 may be in a manner of face-to-face arrangement. Or alternatively, the semiconductor dies or devices (100, 200, and/or 300) included in the first tier T1 and the semiconductor dies or devices (100, 200, 300, and/or 400) included in the second tier T2 may be in a manner of face-to-back arrangement.

Figure 34:
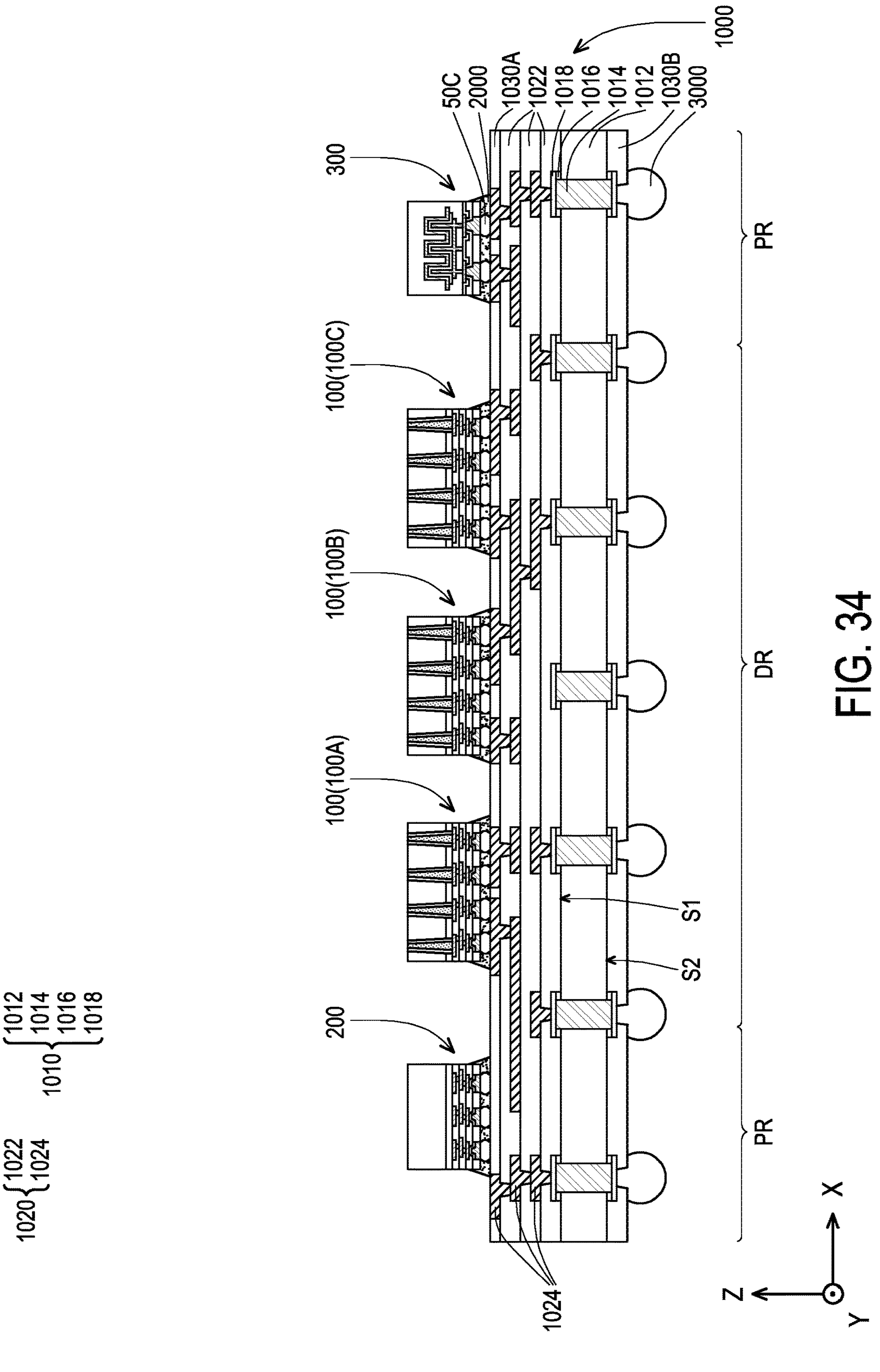
FIG. 34 to FIG. 35 are schematic cross-sectional views of various stages in a manufacturing method of a semiconductor structure in accordance with some embodiments of the disclosure.
Figure 35:
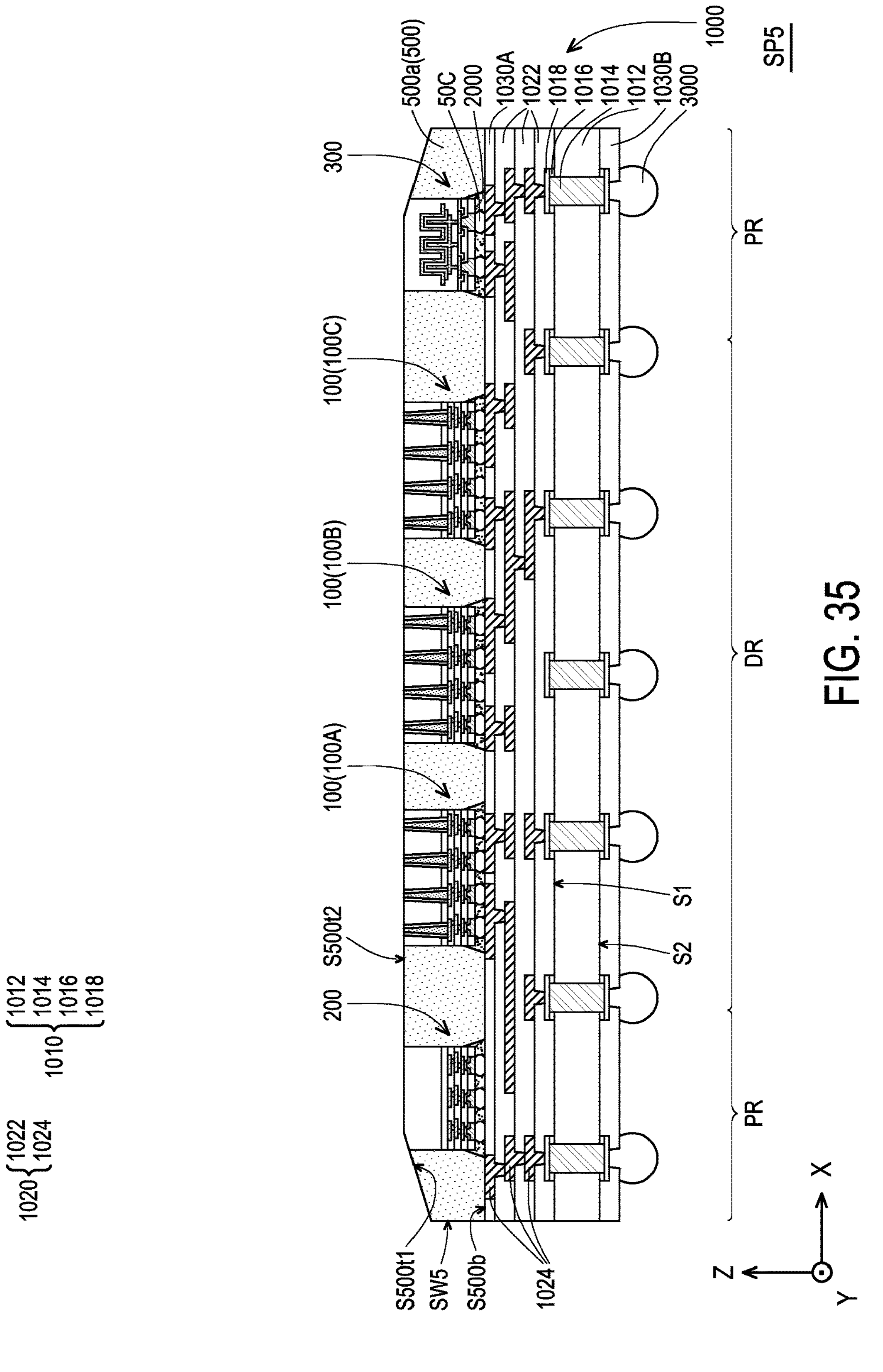
Figure 36:
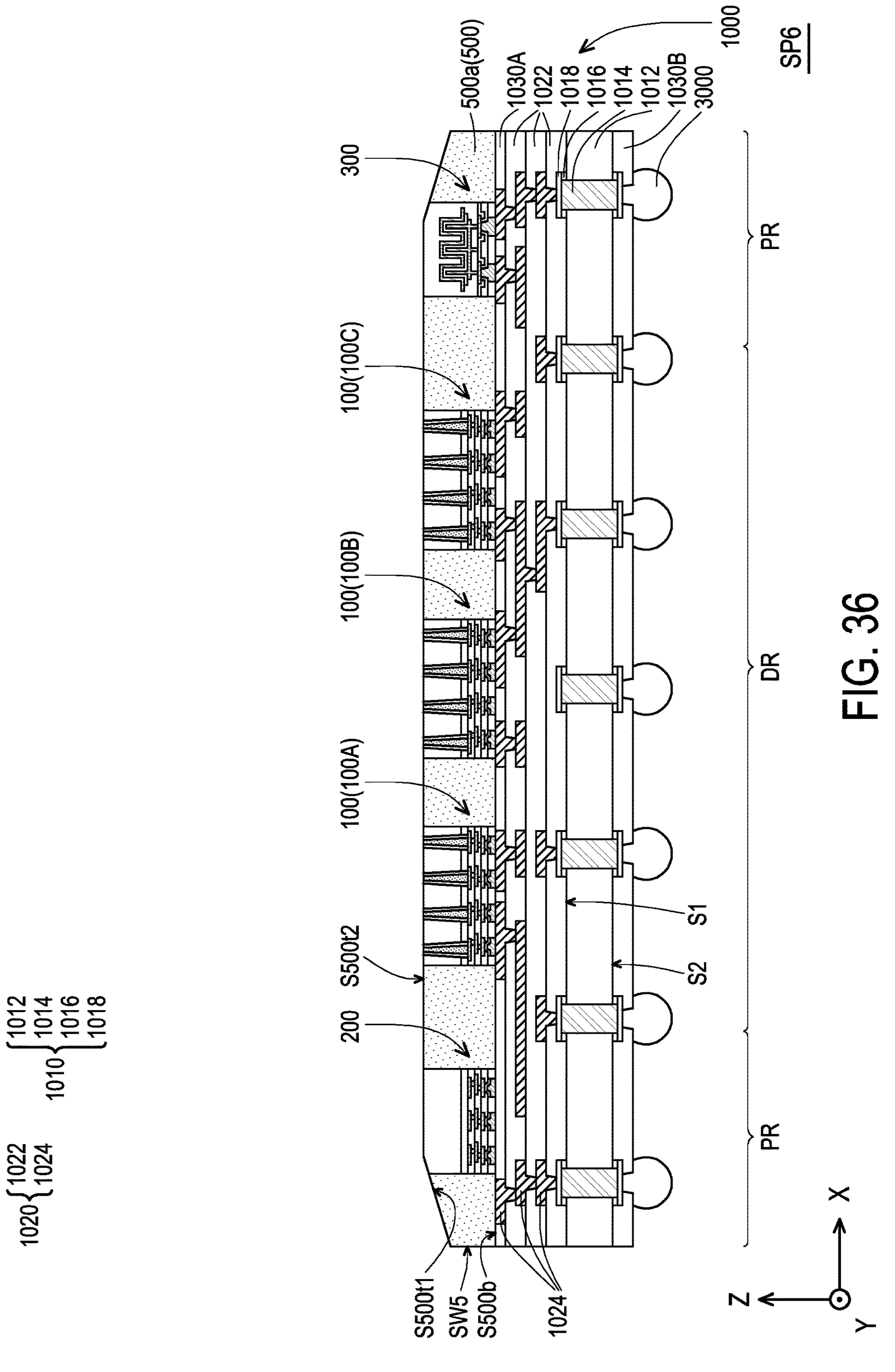
FIG. 36 is a schematic cross-sectional view showing a semiconductor structure in accordance with alternative embodiments of the disclosure.

FIG. 34 to FIG. 35 are schematic cross-sectional views of various stages in a manufacturing method of a semiconductor structure SP5 in accordance with some embodiments of the disclosure. FIG. 36 is a schematic cross-sectional view showing a semiconductor structure SP6 in accordance with alternative embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Referring to FIG. 34, in some embodiments, an interposer 1000 is provided, and one or more semiconductor dies 100, one or more dummy dies 200 and one or more DTCs 300 are bonded to and electrically connected to the interposer 1000 through a plurality of joints 50C. For example, the semiconductor dies 100, the dummy dies 200 and the DTCs 300 are bonded to the interposer 1000 by FC bonding. The details of the interposer 1000 has been previously described in FIG. 32, the details of each of the semiconductor dies 100, the dummy dies 200 and the DTCs 300 have been previously described in FIG. 4 in conjunction with FIG. 13 and FIG. 16 through FIG. 20, the details of the FC bonding have been previously described in FIG. 15 and/or FIG. 31, the formation and material of joints 50C are similar to or substantially identical to the formation and material of the joints 50A as described in FIG. 15 or the joints 50B as described in FIG. 31, and thus are not repeated herein for brevity.

Thereafter, an underfill 2000 is optionally formed on the interposer 1000, in some embodiments. As shown in FIG. 34, for example, the underfill 2000 at least fills the gaps between the semiconductor dies 100 and the interposer 1000, between the dummy dies 200 and the interposer 1000 and between the DTCs 300 and the interposer 1000, and wraps sidewalls of the joints 50C. In some alternative embodiments, sidewalls of the semiconductor dies 100, sidewalls of the dummy dies 200, and/or sidewalls of the DTCs 300 may further covered by the underfill 2000, the disclosure is not limited thereto. The underfill 2000 may be any acceptable material, such as a polymer, epoxy, molding underfill, or the like, for example. In one embodiment, the underfill 2000 may be formed by underfill dispensing or any other suitable method. Owing to the underfill 2000, the bonding strengths between the semiconductor dies 100 and the interposer 1000, between the dummy dies 200 and the interposer 1000 and between the DTCs 300 and the interposer 1000 are enhanced, thereby improving the reliability of the semiconductor structure SP5.

Referring to FIG. 35, in some embodiments, the semiconductor dies 100, the dummy dies 200 and the DTCs 300 are laterally encapsulated in an insulating encapsulation 500 (including the insulating encapsulation 500*a*), in some embodiments. As shown in FIG. 35, the semiconductor dies 100, the dummy dies 200 and the DTCs 300 are exposed by the insulating encapsulation 500*a*, for example. The formation and material of the insulating encapsulation 500*a* are previously described in FIG. 2 through FIG. 6, and thus are not repeated herein for brevity.

In some embodiments, the insulating encapsulation 500*a* has an illustrated top surface constituted by a substantial slant planar surface S500*t*1 at the peripheral region PR and a substantial planar surface S500*t*2 at the device region DR surrounded by (or bounded by) the substantial slant planar surface S500*t*1, where the substantial slant planar surface S500*t*1 is connected to the substantial planar surface S500*t*2 and a (substantially vertical) sidewall of the insulating encapsulation 500*a* (which being a part of a sidewall SW5 of the semiconductor structure SP5). As shown in FIG. 35, the substantial planar surface S500*t*2 is connected to and enclosed by the substantial slant planar surface S500*t*1, for example. The substantial planar surface S500*t*2 may be considered as a substantially horizontal planar surface extending along the X-Y plane. In such cases, the substantial planar surface S500*t*2 accessibly reveals the semiconductor dies 100. For example, bottom sides S100*b* of the semiconductor dies 100 are substantially levelled with the substantial planar surface S500*t*2 of the insulating encapsulation 500*a*. In other words, the end surfaces of the conductive pillars 170 of the semiconductor dies 100 are substantially coplanar to the substantial planar surface S500*t*2 of the insulating encapsulation 500*a*.

In certain cases, the substantial planar surface S500*t*2 further accessibly reveals the dummy dies 200 and/or the DTCs 300, partially. For example, bottom sides S200*b* of the dummy dies 200 and/or bottom sides S300*b* of the DTCs 300 are substantially levelled with the substantial planar surface S500*t*2 of the insulating encapsulation 500*a*, in part. In other words, the bottom sides S200*b* of the dummy dies 200 and/or the end surfaces of the conductive pillars 380 of the DTCs 300 are substantially coplanar to the substantial planar surface S500*t*2 of the insulating encapsulation 500*a*, in part.

On the other hand, the substantial slant planar surface S500*t*1 may be considered as a bevel edge, where the insulating encapsulation 500*a* at the peripheral region PR has a thickness (not labeled) gradually decreasing along a direction from the device region DR toward to the sidewall SW5 of the semiconductor structure SP5. Such bevel edge may be created during the planarization process at or near the edge/sidewall of the to-be-polished object (e.g., the semiconductor structure SP5) due to over-grinding/polishing or the less metal (or pattern) density as compared to a center region thereof. If considering a semiconductor die (with active device(s)) is located at or near the edge/sidewall of the semiconductor structure SP5, such semiconductor die would be damaged due to the bevel edge occurs, which leads to an abnormal functionalities or loss of functionalities. In order to avoid such damages, one or more dummy dies (e.g., 200) and/or one or more deep trench capacitors (DTC without any active devices such as transistor, diodes, memory, etc. are formed therein) (e.g., 300) may be adopted at the peripheral region PR to function as an structure support during planarizing (or thinning) process, thereby the resulting bevel edge would be stopped at/within the desired peripheral region PR, without further extending into the device region DR. Consequently, the semiconductor dies 100 formed within the device region DR bounded by the desired peripheral region PR disposed with one or more dummy dies (e.g., 200) and/or one or more deep trench capacitors (DTC without any active devices such as transistor, diodes, memory, etc. are formed therein) (e.g., 300) will be protected from the damages caused by planarizing (or thinning) process, as the presences of the dummy dies 200 and/or the DTCs 300 improve the edge uniformity of the semiconductor structure SP5. That is, owing to at least one of the dummy dies 200 and the DTCs 300, the substantial slant planar surface S500*t*1 of the insulating encapsulation 500*a* would be stopped at the peripheral region PR (e.g., at the dummy dies 200 and/or the DTCs 300), thereby enhancing the reliability of the semiconductor structure SP5. In some embodiments, the substantial planar surface S500*t*2 of the insulating encapsulation 500*a* extend into the peripheral region PR, as shown in FIG. 35. As an alternative, the substantial planar surface S500*t*2 of the insulating encapsulation 500*a* may reach to and stop at the edge of the peripheral region PR.

However, the disclosure is not limited thereto. As an alternative, one or more than one of the semiconductor dies 100, the dummy dies 200 and the DTCs 300 may be bonded to the interposer 1000 through a bonding process including a metal-to-metal bonding and a dielectric-to-dielectric bonding, with or without a dielectric-to-metal bonding, similar to the bonding process described in FIG. 14 and/or FIG. 30. For example, the semiconductor dies 100, the dummy dies 200 and the DTCs 300 are bonded to and electrically connected to the interposer 1000 through direct contact, as shown in a semiconductor structure SP6 of FIG. 36. In such case, the underfill 2000 may be omitted.

In some embodiments, the conceptions of the semiconductor structures (e.g., SP1, SP1', SP1", SP2, SP3, SP3', SP4, SP4', SP5, SP6 or their modification) may also applied to another one of the semiconductor structures (e.g., SP1, SP1', SP1", SP2, SP3, SP3', SP4, SP4', SP5, SP6 or their modification), if applicable. For example, the cut SoW or a cut SoW vehicle and the die arrangement discussed in the semiconductor structure SP2 may also applied to the other semiconductor structures in the disclosure. In addition, the number of the tiers of the semiconductor structures (e.g., SP1, SP1', SP1", SP2, SP3, SP3', SP4, SP4', SP5, SP6 or their modification) may be one, two or more, the disclosure is not limited thereto. For example, if the number of the tier is one, then the dies or devices included in the tier, individually, can be or include a SoIC die (having pre-fabricated stacked structure) or a device (having pre-fabricated stacked structure). Or, if the number of the tier is two or more, then the dies or devices included in the each tier, individually, can be or include a die (with or without the pre-fabricated stacked structure) or a device (with or without pre-fabricated stacked structure). In addition, it is appreciated that the dummy dies 200 and the DTCs 300 may be referred to as (mechanical) supporting structures of the semiconductor structures (e.g., SP1, SP1', SP1", SP2, SP3, SP3', SP4, SP4', SP5, SP6 or their modification).

In accordance with some embodiments, a semiconductor structure includes a wafer circuit structure, at least one first semiconductor die, at least one first supporting structure, and an encapsulant. The at least one first semiconductor die is disposed over and electrically connected to the wafer circuit structure in a device region of the semiconductor structure. The at least one first supporting structure is disposed over the wafer circuit structure in a peripheral region of the semiconductor structure. The encapsulant is disposed over the wafer circuit structure and encapsulates the at least one first semiconductor die and the at least one first supporting structure, where a thickness of the encapsulant at an edge of the semiconductor structure is less than a thickness of the encapsulant within the device region of the semiconductor structure.

In accordance with some embodiments, a semiconductor structure includes wafer circuit structure, at least one first semiconductor die, a plurality of supporting structures, and an insulating encapsulation. The at least one first semiconductor die is disposed over and electrically connected to the wafer circuit structure in a device region of the semiconductor structure. The plurality of supporting structures are disposed over the wafer circuit structure in a peripheral region of the semiconductor structure, where the plurality of supporting structures are arranged in a manner of point symmetry in respect to a center of the semiconductor structure. The insulating encapsulation is disposed over the wafer circuit structure and encapsulates the at least one first semiconductor die and the plurality of supporting structures.

In accordance with some embodiments, a method of manufacturing a semiconductor structure includes the following steps: providing at least one first semiconductor die in a device region of the semiconductor structure; providing at least one first supporting structure in a peripheral region of the semiconductor structure, the peripheral region surrounding the device region; laterally encapsulating the at least one first semiconductor die and the at least one first supporting structure in an encapsulant, wherein a thickness of the encapsulant at an edge of the semiconductor structure is less than a thickness of the encapsulant within the device region of the semiconductor structure; and forming a wafer circuit structure over the at least one first semiconductor die and the at least one first supporting structure encapsulated in the encapsulant, the wafer circuit structure electrically connecting the at least one first semiconductor die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:

a circuit structure;

at least one first semiconductor die, disposed over and electrically connected to the circuit structure in a device region of the semiconductor structure;

at least one first supporting structure, disposed over the circuit structure in a peripheral region of the semiconductor structure;

an encapsulant, disposed over the circuit structure and encapsulating the at least one first semiconductor die and the at least one first supporting structure, wherein a thickness of the encapsulant at an edge of the semiconductor structure is less than a thickness of the encapsulant within the device region of the semiconductor structure;

a redistribution circuit structure, disposed over and electrically connected to the circuit structure, wherein the circuit structure is between the encapsulant and the redistribution circuit structure; and a plurality of conductive terminals, disposed on and connected to the redistribution circuit structure, wherein the redistribution circuit structure is between the plurality of conductive terminals and the circuit structure.

2. The semiconductor structure of claim 1, wherein a thickness of the circuit structure at the edge of the semiconductor structure is greater than a thickness of the circuit structure within the device region of the semiconductor structure.

3. The semiconductor structure of claim 1, wherein the encapsulant comprises a first portion and a second portion stacking on the first portion, the first portion is interposed between the circuit structure and the second portion, and the first portion encapsulates the at least one first semiconductor die, wherein the semiconductor structure further comprises at least one of:

at least one second semiconductor die, disposed over the circuit structure in the device region of the semiconductor structure and electrically connected to the at least one first semiconductor die, wherein the at least one second semiconductor die is encapsulated in the second portion; or at least one second supporting structure, disposed over the circuit structure in the peripheral region of the semiconductor structure, being encapsulated in the encapsulant, and electrically connected to the circuit structure, wherein the at least one first supporting structure is electrically isolated from the circuit structure.

4. The semiconductor structure of claim 3, wherein the at least one first semiconductor die includes a plurality of first semiconductor dies, and the at least one second semiconductor die is electrically connected to two first semiconductor dies of plurality of first semiconductor dies, wherein the at least one second semiconductor die comprises a bridge die electrically communicating the two first semiconductor dies of plurality of first semiconductor dies.

5. The semiconductor structure of claim 3, wherein the at least one second semiconductor die includes a plurality of second semiconductor dies, and the at least one first semiconductor die is electrically connected to two second semiconductor dies of plurality of second semiconductor dies, wherein the at least one first semiconductor die comprises a bridge die electrically communicating the two second semiconductor dies of plurality of second semiconductor dies.

6. The semiconductor structure of claim 3, wherein the at least one first supporting structure comprises:

a first plurality of first supporting structures encapsulated in the first portion;

a second plurality of first supporting structures encapsulated in the second portion; or a first plurality of first supporting structures encapsulated in the first portion and a second plurality of first supporting structures encapsulated in the second portion, wherein the first plurality of first supporting structures and the second plurality of first supporting structures are electrically isolated from the each other.

7. The semiconductor structure of claim 3, wherein the at least one second supporting structure comprises:

a first plurality of second supporting structures encapsulated in the first portion;

a second plurality of second supporting structures encapsulated in the second portion; or a first plurality of second supporting structures encapsulated in the first portion and a second plurality of second supporting structures encapsulated in the second portion.

8. The semiconductor structure of claim 1, wherein a sidewall of the encapsulant is flush with a sidewall of the circuit structure.

9. The semiconductor structure of claim 1, further comprising:

a heat dissipating element, disposed over the encapsulant, wherein the encapsulant is between the heat dissipating element and the circuit structure.

10. The semiconductor structure of claim 1, wherein the at least one first supporting structure comprises:

a dummy die, wherein the dummy die is electrically isolated from the circuit structure; or a deep trench capacitor, wherein the deep trench capacitor is electrically connected to the circuit structure.

11. A semiconductor structure, comprising:

a circuit structure;

at least one first semiconductor die, disposed over and electrically connected to the circuit structure in a device region of the semiconductor structure;

a plurality of supporting structures, disposed over the circuit structure in a peripheral region of the semiconductor structure, wherein the plurality of supporting structures are arranged in a manner of point symmetry in respect to a center of the semiconductor structure, wherein the plurality of supporting structures comprise a plurality of deep trench capacitors, wherein the plurality of deep trench capacitors are electrically connected to the circuit structure; and an insulating encapsulation, disposed over the circuit structure and encapsulating the at least one first semiconductor die and the plurality of supporting structures.

12. The semiconductor structure of claim 11, wherein the plurality of supporting structures are grouped into pairs of supporting structures, wherein one supporting structure of each pair of the pairs of supporting structures and other one supporting structure of a respective pair of the pairs of supporting structures are arranged in positions within the peripheral region of the semiconductor structure that are passed through by a single line passing the center of the semiconductor structure.

13. The semiconductor structure of claim 11, wherein the plurality of supporting structures further comprise a plurality of dummy dies, wherein the plurality of dummy dies are electrically isolated from the circuit structure.

14. The semiconductor structure of claim 11, wherein in a cross section along a stacking direction of the circuit structure and the at least one first semiconductor die, the insulating encapsulation has a surface constituted by a substantial planar surface at the device region and a substantial slant planar surface at the peripheral region surrounding and joined to the substantial planar surface, the substantial slant planar surface being joined to the substantial planar surface and a sidewall of the insulating encapsulation and exposing at least one of the plurality of supporting structures, and the substantial planar surface exposing the at least one first semiconductor die.

15. The semiconductor structure of claim 11, further comprising:

a redistribution circuit structure, disposed over and electrically connected to the circuit structure, wherein the circuit structure is between the insulating encapsulation and the redistribution circuit structure; and a plurality of conductive terminals, disposed on and connected to the redistribution circuit structure, wherein the redistribution circuit structure is between the plurality of conductive terminals and the circuit structure.

16. A method of manufacturing a semiconductor structure, comprising:

providing at least one first semiconductor die in a device region of the semiconductor structure;

providing at least one first supporting structure in a peripheral region of the semiconductor structure, the peripheral region surrounding the device region;

laterally encapsulating the at least one first semiconductor die and the at least one first supporting structure in an encapsulant, wherein a thickness of the encapsulant at an edge of the semiconductor structure is less than a thickness of the encapsulant within the device region of the semiconductor structure;

forming a circuit structure over the at least one first semiconductor die and the at least one first supporting structure encapsulated in the encapsulant, the circuit structure electrically connecting the at least one first semiconductor die, and a sidewall of the encapsulant being flush with a sidewall of the circuit structure;

disposing a redistribution circuit structure over the circuit structure, the redistribution circuit structure being electrically connected to the circuit structure, wherein the circuit structure is between the encapsulant and the redistribution circuit structure; and disposing a plurality of conductive terminals on the redistribution circuit structure, the plurality of conductive terminals being connected to the redistribution circuit structure, wherein the redistribution circuit structure is between the plurality of conductive terminals and the circuit structure.

17. The method of claim 16, further comprising:

providing at least one second semiconductor die, wherein:

providing the at least one first semiconductor die comprises providing a plurality of first semiconductor dies, and laterally encapsulating the at least one first semiconductor die and the at least one first supporting structure in the encapsulant comprises laterally encapsulating the plurality of first semiconductor dies, the at least one first supporting structure and the at least one second semiconductor die in the encapsulant by:

forming a first insulating material over the at least one second semiconductor die, wherein the at least one second semiconductor die is not revealed by the first insulating material;

performing a first planarization process on the first insulating material to remove a portion of the first insulating material so to form a first portion of the encapsulant revealing the at least one second semiconductor die;

forming a second insulating material over the first portion of the encapsulant to cover the plurality of first semiconductor dies and the at least one first supporting structure, wherein the plurality of first semiconductor dies and the at least one first supporting structure are not revealed by the second insulating material; and performing a second planarization process on the second insulating material to remove a portion of the second insulating material so to form a second portion of the encapsulant revealing the plurality of first semiconductor dies and the at least one first supporting structure, wherein a portion of the at least one first supporting structure is also removed in the second planarization process, wherein the second portion of the encapsulant is between the first portion of the encapsulant and the circuit structure, and two first semiconductor dies of the plurality of first semiconductor dies are electrically connected to and electrically communicated to each other through the at least one second semiconductor die.

18. The method of claim 17, further comprising providing at least one second supporting structure, wherein:

forming the second insulating material over the first portion of the encapsulant to cover the plurality of first semiconductor dies and the at least one first supporting structure comprises forming the second insulating material over the first portion of the encapsulant to cover the plurality of first semiconductor dies, the at least one first supporting structure and the at least one second supporting structure, so that the plurality of first semiconductor dies, the at least one first supporting structure and the at least one second supporting structure are not revealed by the second insulating material; and performing the second planarization process on the second insulating material to remove the portion of the second insulating material so to form the second portion of the encapsulant revealing the plurality of first semiconductor dies and the at least one first supporting structure comprises performing the second planarization process on the second insulating material to remove the portion of the second insulating material so to form the second portion of the encapsulant revealing the plurality of first semiconductor dies, the at least one first supporting structure and the at least one second supporting structure, wherein one of the at least one first supporting structure and the at least one second supporting structure is electrically isolated from the circuit structure, while other one of the at least one first supporting structure and the at least one second supporting structure is electrically connected to the circuit structure.

19. The method of claim 16, further comprising:

providing at least one second semiconductor die; and providing a first group of second supporting structures and a second group of second supporting structures, wherein:

providing the at least one first semiconductor die comprises providing a first group of first semiconductor dies and a second group of first semiconductor dies;

providing the at least one first supporting structure comprises providing a first group of first supporting structures and a second group of first supporting structures; and laterally encapsulating the at least one first semiconductor die and the at least one first supporting structure in the encapsulant comprises laterally encapsulating the first group of first semiconductor dies, the second group of first semiconductor dies, the first group of first supporting structures, the second group of first supporting structures, the first group of second supporting structures, the second group of second supporting structures and the at least one second semiconductor die by:

forming a first insulating material over the first group of first semiconductor dies, the first group of first supporting structures, the first group of second supporting structures and the at least one second semiconductor die, wherein the first group of first semiconductor dies, the first group of first supporting structures, the first group of second supporting structures and the at least one second semiconductor die are not revealed by the first insulating material;

performing a first planarization process on the first insulating material to remove a portion of the first insulating material so to form a first portion of the encapsulant revealing the first group of first semiconductor dies, the first group of first supporting structures, the first group of second supporting structures and the at least one second semiconductor die, wherein at least one of a portion of at least one of the first group of first supporting structures or a portion of at least one of the first group of second supporting structures is also removed in the first planarization process;

forming a second insulating material over the first portion of the encapsulant to cover the second group of first semiconductor dies, the second group of first supporting structures and the second group of second supporting structures, wherein the second group of first semiconductor dies, the second group of first supporting structures and the second group of second supporting structures are not revealed by the second insulating material; and performing a second planarization process on the second insulating material to remove a portion of the second insulating material so to form a second portion of the encapsulant revealing the second group of first semiconductor dies, the second group of first supporting structures and the second group of second supporting structures, wherein at least one of a portion of at least one of the second group of first supporting structures or a portion of at least one of the second group of second supporting structures is also removed in the second planarization process, wherein the first portion of the encapsulant is between the second portion of the encapsulant and the circuit structure, and two first semiconductor dies of the plurality of first semiconductor dies are electrically connected to and electrically communicated to each other through the at least one second semiconductor die, wherein the first group of first supporting structures and the second group of first supporting structures are respectively overlapped with each other, and the first group of second supporting structures and the second group of second supporting structures are respectively overlapped with each other, and wherein the first group of second supporting structures and the second group of second supporting structures are electrically connected to the circuit structure.

20. The method of claim 16, wherein laterally encapsulating the at least one first semiconductor die and the at least one first supporting structure in the encapsulant comprises:

forming an insulating material over the at least one first semiconductor die and the at least one first supporting structure, so that the at least one first semiconductor die and the at least one first supporting structure are not revealed by the insulating material; and performing a planarization process on the insulating material to remove a portion of the insulating material so to form the encapsulant revealing the at least one first semiconductor die and the at least one first supporting structure, wherein a portion of the at least one first supporting structure is also removed in the planarization process.

* * * * *